US011776710B2

(12) United States Patent
Ooishi et al.

(10) Patent No.: US 11,776,710 B2
(45) Date of Patent: Oct. 3, 2023

(54) ELECTROCONDUCTIVE FILM, SENSOR, TOUCH PANEL, AND IMAGE DISPLAY DEVICE

(71) Applicant: DAI NIPPON PRINTING CO., LTD., Tokyo (JP)

(72) Inventors: Eiji Ooishi, Tokyo (JP); Shoichiro Ogumi, Tokyo (JP); Yukimitsu Iwata, Tokyo (JP); Takashi Takekoshi, Tokyo (JP); Seiichi Isojima, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 43 days.

(21) Appl. No.: 16/979,029

(22) PCT Filed: Mar. 8, 2019

(86) PCT No.: PCT/JP2019/009347
§ 371 (c)(1),
(2) Date: Dec. 22, 2020

(87) PCT Pub. No.: WO2019/172423
PCT Pub. Date: Sep. 12, 2019

(65) Prior Publication Data
US 2021/0118589 A1 Apr. 22, 2021

(30) Foreign Application Priority Data
Mar. 9, 2018 (JP) ................................ 2018-043073

(51) Int. Cl.
*G02F 1/1333* (2006.01)
*G06F 3/044* (2006.01)
(Continued)

(52) U.S. Cl.
CPC ............... *H01B 5/14* (2013.01); *B32B 7/023* (2019.01); *B32B 7/025* (2019.01); *B32B 27/281* (2013.01);
(Continued)

(58) Field of Classification Search
CPC ..................... G06F 3/041; G06F 3/044; G06F 2203/04102; G06F 3/0446; G06F 3/0445;
(Continued)

(56) References Cited

U.S. PATENT DOCUMENTS

2004/0016914 A1* 1/2004 Matsuda .................. H01B 1/18 252/500
2008/0187708 A1 8/2008 Decker et al.
(Continued)

FOREIGN PATENT DOCUMENTS

CN 101512682 8/2009
CN 101605614 12/2009
(Continued)

OTHER PUBLICATIONS

International Search Report, issued in the corresponding PCT Application No. PCT/JP2019/009347, dated May 28, 2019, 4 pages.
(Continued)

*Primary Examiner* — Md Saiful A Siddiqui
(74) *Attorney, Agent, or Firm* — Hamre, Schumann, Mueller & Larson, P.C

(57) ABSTRACT

An electroconductive film which is capable of inhibiting milkiness; and a touch panel and image display device that include the electroconductive film are provided. According to one aspect of the present invention, an electroconductive film 10 including at least an electroconductive part 12, wherein the electroconductive part 12 includes a light-transmitting resin 14 and a plurality of electroconductive fibers 15 placed in the light-transmitting resin 14, and the
(Continued)

diffused light reflectance (SCE) in a region of the electroconductive film 10 where the electroconductive part 12 is present is 0.5% or less, is provided.

17 Claims, 15 Drawing Sheets

(51) Int. Cl.

| | |
|---|---|
| ***H01B 5/14*** | (2006.01) |
| ***B32B 7/023*** | (2019.01) |
| ***B32B 7/025*** | (2019.01) |
| ***B32B 27/34*** | (2006.01) |
| ***B32B 27/28*** | (2006.01) |
| ***B32B 27/36*** | (2006.01) |
| *H10K 59/40* | (2023.01) |

(52) U.S. Cl.
CPC .............. *B32B 27/34* (2013.01); *B32B 27/36* (2013.01); *G02F 1/13338* (2013.01); *G06F 3/0446* (2019.05); *B32B 2262/103* (2013.01); *B32B 2307/202* (2013.01); *B32B 2307/412* (2013.01); *B32B 2307/732* (2013.01); *B32B 2457/202* (2013.01); *G06F 2203/04102* (2013.01); *H10K 59/40* (2023.02)

(58) Field of Classification Search
CPC ....... G06F 2203/04103; G02F 1/13338; H01B 5/14; H01B 1/00; H01B 1/04; H01B 5/16; B32B 7/023; B32B 7/025; B32B 27/281; B32B 27/34; B32B 27/36; B32B 2262/103; B32B 2307/202; B32B 2307/412; B32B 2307/732; B32B 2457/202; B32B 5/02; H01L 51/0021; H01L 51/003; H01L 27/323
See application file for complete search history.

(56) References Cited

U.S. PATENT DOCUMENTS

| | | | | |
|---|---|---|---|---|
| 2008/0259262 | A1* | 10/2008 | Jones | H01L 29/413 977/762 |
| 2009/0295285 | A1 | 12/2009 | Tokunaga et al. | |
| 2011/0128477 | A1 | 6/2011 | Izaki et al. | |
| 2013/0120846 | A1 | 5/2013 | Dai et al. | |
| 2013/0299214 | A1* | 11/2013 | Frey | H05K 3/061 174/253 |
| 2014/0016043 | A1* | 1/2014 | Chen | H04N 9/3197 349/12 |
| 2014/0022739 | A1 | 1/2014 | Hwang et al. | |
| 2014/0106154 | A1 | 4/2014 | Kim et al. | |
| 2015/0017457 | A1 | 1/2015 | Mizuno et al. | |
| 2015/0036276 | A1 | 2/2015 | Kaneko et al. | |
| 2015/0200037 | A1* | 7/2015 | Inoue | H01B 1/22 252/514 |
| 2016/0011351 | A1 | 1/2016 | Tomohisa et al. | |
| 2016/0368049 | A1 | 12/2016 | Saito et al. | |
| 2017/0010736 | A1* | 1/2017 | Iwata | H01B 1/22 |
| 2017/0069691 | A1 | 3/2017 | Iwata et al. | |
| 2017/0156227 | A1* | 6/2017 | Heo | H05K 5/0017 |
| 2017/0276840 | A1* | 9/2017 | Horio | H01L 51/5253 |
| 2017/0282414 | A1* | 10/2017 | Liou | H01B 5/14 |
| 2017/0363779 | A1 | 12/2017 | Lee et al. | |
| 2018/0079189 | A1 | 3/2018 | Ogawa et al. | |
| 2019/0308248 | A1 | 10/2019 | Yamauchi et al. | |
| 2020/0044005 | A1* | 2/2020 | Kokame | H05B 33/02 |

FOREIGN PATENT DOCUMENTS

| | | |
|---|---|---|
| CN | 101689568 | 3/2010 |
| CN | 103597427 | 2/2014 |
| CN | 103730187 | 4/2014 |
| CN | 104145312 | 11/2014 |
| CN | 105313391 | 2/2016 |
| JP | 2004-223693 | 8/2004 |
| JP | 2004-263246 | 9/2004 |
| JP | 2004-263318 | 9/2004 |
| JP | 2005-139544 | 6/2005 |
| JP | 2007-284716 | 11/2007 |
| JP | 2008-147356 | 6/2008 |
| JP | 2010-525526 | 7/2010 |
| JP | 2011-112928 | 6/2011 |
| JP | 2012-003900 | 1/2012 |
| JP | 2012-230491 | 11/2012 |
| JP | 2013-242692 | 12/2013 |
| JP | 2014-197183 | 10/2014 |
| JP | 2014-224199 | 12/2014 |
| JP | 2015-504546 | 2/2015 |
| JP | 2015-040316 | 3/2015 |
| JP | 2015-515064 | 5/2015 |
| JP | 2015-146127 | 8/2015 |
| JP | 2015-160977 | 9/2015 |
| JP | 2015-180772 | 10/2015 |
| JP | 2016-011431 | 1/2016 |
| JP | 6074851 | 2/2017 |
| JP | 6094270 | 3/2017 |
| JP | 6139009 | 5/2017 |
| JP | 2017-227900 | 12/2017 |
| JP | 6247938 | 12/2017 |
| TW | 201641287 | 12/2016 |
| TW | 201711055 | 3/2017 |
| WO | 2008/131304 | 10/2008 |
| WO | 2013/067418 | 5/2013 |
| WO | 2013/152225 | 10/2013 |
| WO | 2015/012199 | 1/2015 |
| WO | 2015/190428 | 12/2015 |
| WO | 2018/159285 | 9/2018 |
| WO | 2019/066079 | 4/2019 |

OTHER PUBLICATIONS

International Preliminary Report on Patentability, issued in the corresponding PCT Application No. PCT/JP2019/009347, dated Sep. 15, 2020, 13 pages (including translation).
Second Chinese Office Action, issued in the corresponding Chinese patent application No. 201980029292.2, dated Nov. 2, 2022, 12 pages (including machine translation).
Search Report, issued in the corresponding Chinese patent application No. 201980029292.2, dated Oct. 29, 2022, 3 pages (including machine translation).

* cited by examiner

ELECTROCONDUCTIVE FILM, SENSOR, TOUCH PANEL, AND IMAGE DISPLAY DEVICE

CROSS-REFERENCE TO RELATED APPLICATION

The present application enjoys the benefit of priority to the prior Japanese Patent Application Publication No. 2018-43073 (filed on Mar. 9, 2018), the entire disclosure of which is incorporated herein by reference.

TECHNICAL FIELD

The present invention relates to an electroconductive film, a sensor, a touch panel, and an image display device.

BACKGROUND ART

Recent image display devices such as smartphone and tablet terminal may include a touch panel system that enables direct input of information by touching an image display screen with a finger or the like.

A touch panel typically includes an electroconductive film that includes an electroconductive part provided on a light-transmitting base material, and indium tin oxide (ITO) is mainly used as an electroconductive material for such electroconductive parts of light-transmitting electroconductive films. However, ITO lacks flexibility, and an electroconductive part produced using ITO is thus prone to crack in cases where a flexible base material is used as the light-transmitting base material.

Accordingly, metallic nanowire such as silver nanowire having a nano-sized fiber diameter is currently studied as a substitute for ITO used as an electroconductive material to constitute the electroconductive part.

However, in an electroconductive film in which metallic nanowires are used, scattering of light due to the metallic nanowires occurs, which results in a phenomenon in which the electroconductive part emerges in a whitish color (milkiness) (for example, see Patent Document 1).

PRIOR ART DOCUMENTS

Patent Document

Patent Document 1: Japanese Patent No. 6074851

SUMMARY OF THE INVENTION

With regard to the above-mentioned problem of milkiness, Patent Document 1 describes that the milkiness is inhibited by disposing an adjustment layer containing a yellow compound between the base material and the electroconductive part. However, with the technique disclosed in Patent Document 1, the milkiness cannot be inhibited effectively, and the total light transmittance and the surface resistance value may decrease, as well. Therefore, the solution to the problem of milkiness, which uses a different means from the technique described in Patent Document 1, has been currently demanded. Further, since the metallic nanowires easily reflect the light from the LED in particular, the use of the LED as the light source tends to cause the problem of milkiness. Thus, the solution to the milkiness has been further demanded.

With regard to the above-mentioned problem of milkiness, thinning the fiber diameter of the metallic nanowires to about 30 nm has also been studied. However, even when the fiber diameter of the metallic nanowires is thinned to about 30 nm, the problem of milkiness still remains, although the haze value decreases. The haze value and the milkiness are different phenomena, and the decreased haze value does not mean that the milkiness is solved.

The present invention is made in order to solve the above-mentioned problems. In other words, an object of the present invention is to provide: an electroconductive film which is capable of inhibiting milkiness; and a sensor, touch panel, and image display device that include the electroconductive film.

The present invention includes the following inventions.

[1] An electroconductive film including at least an electroconductive part, wherein the electroconductive part includes a light-transmitting resin and a plurality of electroconductive fibers placed in the light-transmitting resin, and the diffused light reflectance in a region of the electroconductive film where the electroconductive part is present is 0.5% or less.

[2] The electroconductive film according to [1], wherein the electroconductive part further includes a different fiber which is placed in the light-transmitting resin and is distinct from the electroconductive fibers.

[3] The electroconductive film according to [2], wherein the different fiber is a fiber with a dark-colored surface, which exhibits a darker color than the electroconductive fibers at at least a part of the surface.

[4] The electroconductive film according to [3], wherein the fiber with a dark-colored surface is a fiber material which exhibits a darker color than the electroconductive fibers.

[5] The electroconductive film according to [3], wherein the fiber with a dark-colored surface includes a fiber material and a dark-colored film which is formed on the surface of the fiber material and exhibits a darker color than the electroconductive fibers.

[6] The electroconductive film according to any one of [1] to [5], further including a light-transmitting base material provided on one face of the electroconductive part.

[7] The electroconductive film according to [6], wherein the light-transmitting base material contains a polyester resin and has a thickness of 5 μm or more and 45 μm or less.

[8] The electroconductive film according to [7], wherein the light-transmitting base material contains at least one of a polyimide resin and a polyamide resin and has a thickness of 5 μm or more and 75 μm or less.

[9] The electroconductive film according to any one of [1] to [8], wherein the electroconductive film has a thickness of 5 μm or more and 78 μm or less.

[10] The electroconductive film according to any one of [1] to [9], wherein no crack or break occurs in cases where a test in which the electroconductive film is folded by 180 degrees so as to leave a gap of 3 mm between the opposite edges of the electroconductive film and then unfolded, is repeated one hundred thousand times.

[11] The electroconductive film according to any one of [1] to [10], which is for an LED image display device.

[12] A sensor, including the electroconductive film according to any one of [1] to [11].

[13] A touch panel, including the electroconductive film according to any one of [1] to [11].

[14] An image display device, including a display panel and the electroconductive film according to any one of

[1] to [11] or the touch panel according to [13], which is placed on an observer's side of the display panel.

[15] The image display device according to [14], wherein the display panel is an organic light emitting diode panel.

[16] The image display device according to [14], further including an LED light source.

Advantageous Effects of the Invention

According to the present invention, an electroconductive film which is capable of inhibiting milkiness; and a sensor, touch panel, and image display device that include the electroconductive film can be provided.

DETAILED DESCRIPTION OF THE INVENTION

Figure 1:
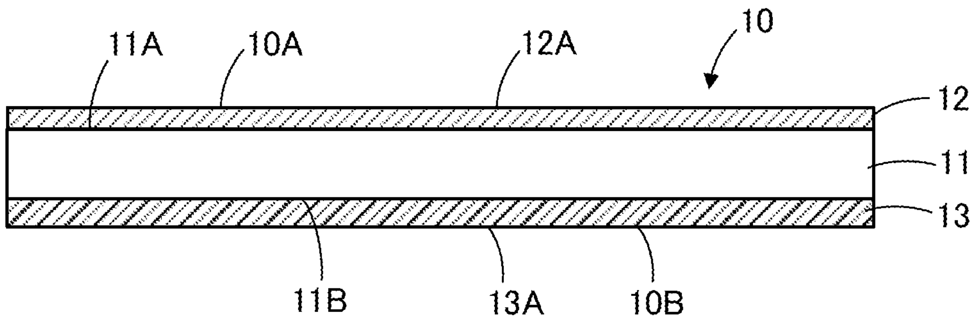
FIG. 1 depicts a schematic diagram of an electroconductive film according to one embodiment.
Figure 2:
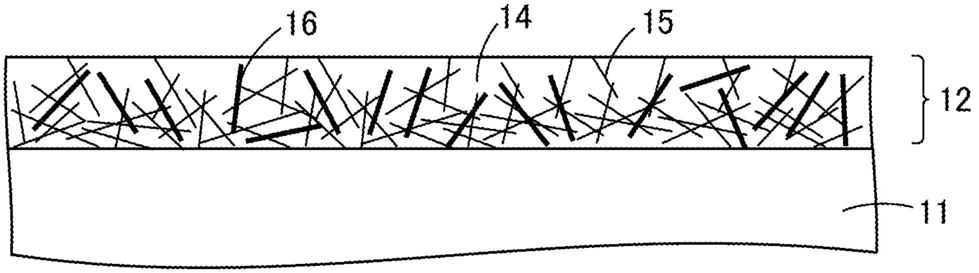
FIG. 2 depicts an enlarged view of a part of the electroconductive film shown in FIG. 1.
Figure 3:
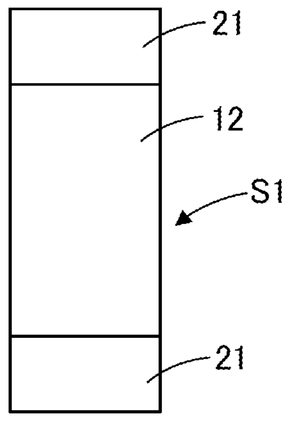
FIG. 3 depicts a plane view of a sample measured for the electrical resistance value.
Figure 4A:
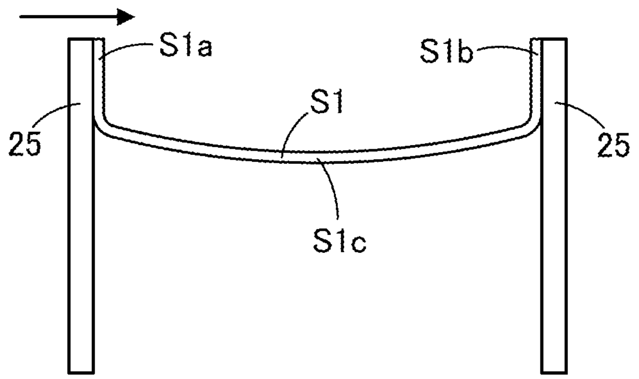
FIGS. 4(A) to 4(C) schematically illustrate each step of a foldability test.
Figure 5:
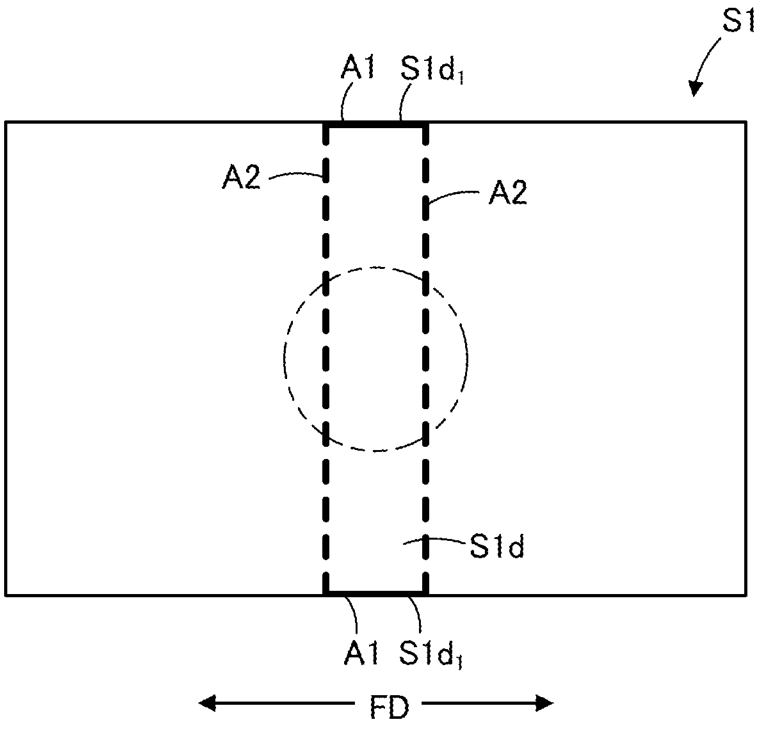
FIG. 5 is a plane view of the electroconductive film after the foldability test.
Figure 6:
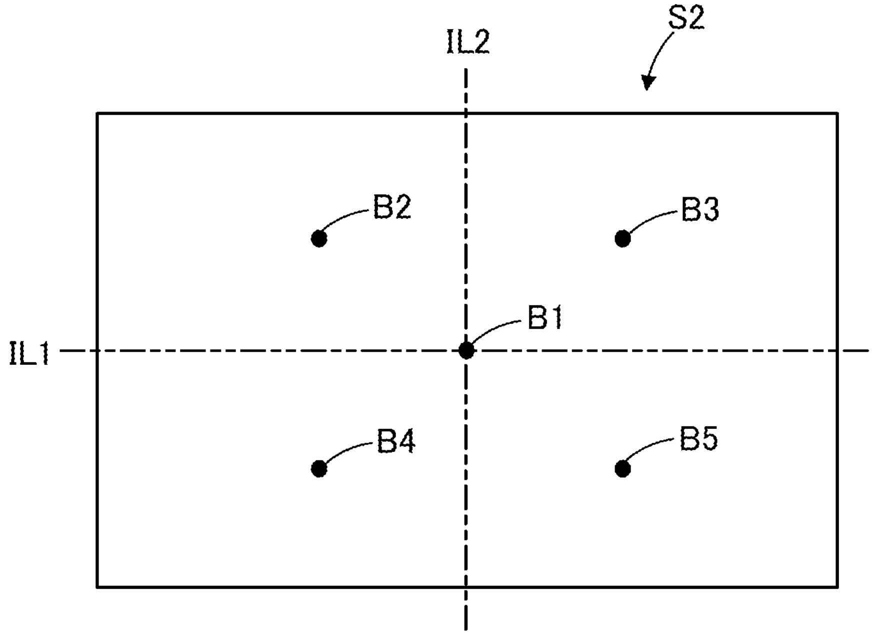
FIG. 6 is a plane view of an electroconductive film for identifying a position where an in-plane phase difference is measured.
Figure 8:
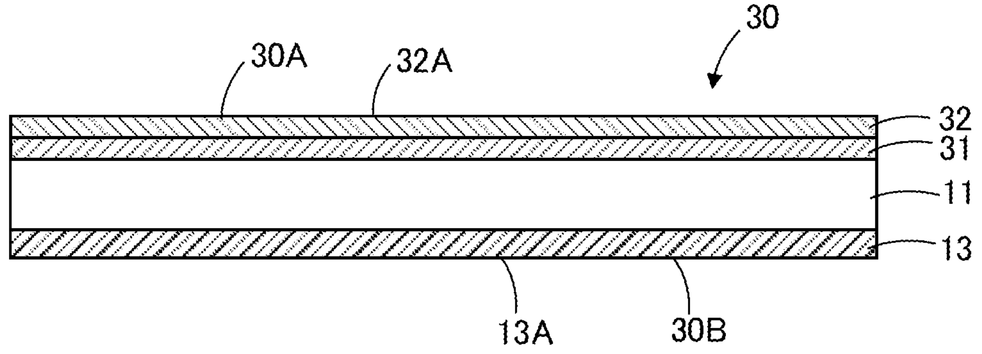
FIG. 8 depicts a schematic diagram of another electroconductive film according to one embodiment.
Figure 9:
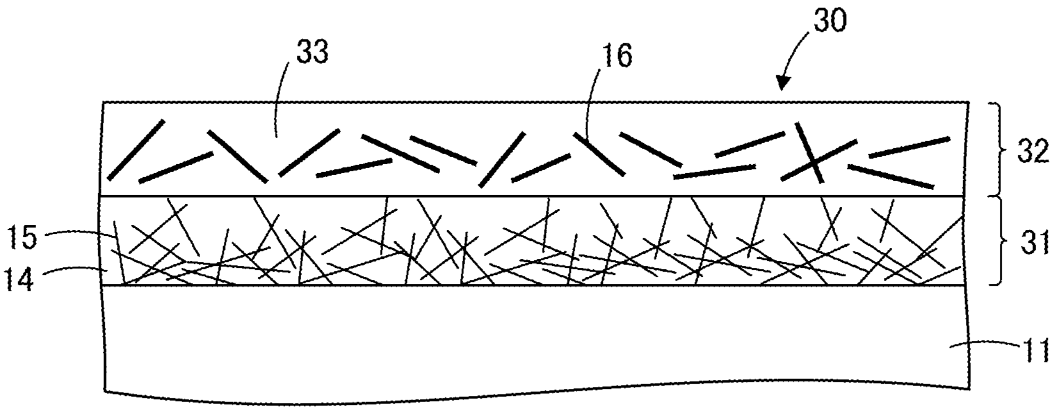
FIG. 9 depicts an enlarged view of a part of the electroconductive film shown in FIG. 8.
Figure 10:
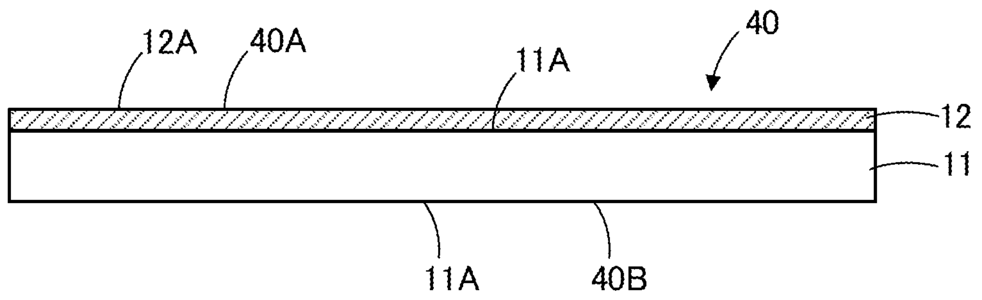
FIG. 10 depicts a schematic diagram of another electroconductive film according to one embodiment.
Figure 11:
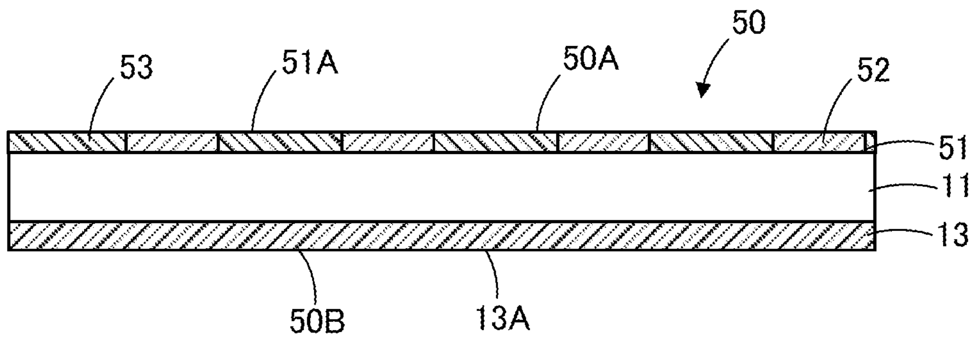
FIG. 11 depicts a schematic diagram of another electroconductive film according to one embodiment.
Figure 12:
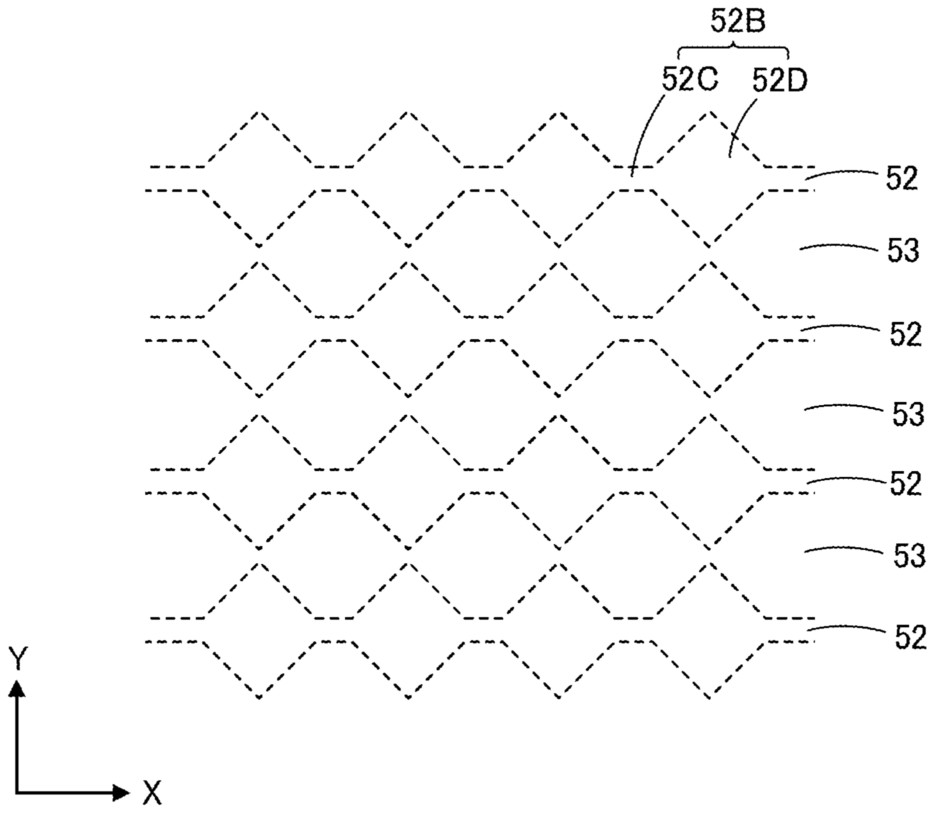
FIG. 12 depicts a schematic plane view of the electroconductive film shown in FIG. 11.

The electroconductive film, sensor, touch panel, and image display device according to an embodiment of the present invention will be described below with reference to the drawings. The term "light-transmitting" as used herein refers to a property of transmitting light. Additionally, the term "light-transmitting" does not necessarily refer to transparency and may refer to translucency. FIG. 1 depicts a schematic diagram of an electroconductive film according to the present embodiment; FIG. 2 depicts an enlarged view of a part of the electroconductive film shown in FIG. 1; FIG. 3 depicts a plane view of a sample measured for the electrical resistance value; FIG. 4 schematically illustrates the steps of a foldability test; and FIG. 5 is a plane view of the electroconductive film after the foldability test. FIG. 6 is a plane view of an electroconductive film for identifying a position where an in-plane phase difference is measured. FIG. 7 depicts schematic views of a fiber with a dark-colored surface; FIG. 8, FIG. 10, and FIG. 11 each depict a schematic diagram of another electroconductive film according to one embodiment; and FIG. 9 depicts an enlarged view of a part of the electroconductive film shown in FIG. 8. FIG. 12 depicts a schematic plane view of the electroconductive film shown in FIG. 11; and FIGS. 13 to 15 each schematically illustrate the process for producing the electroconductive film according to the present embodiment. FIGS. 16 and 17 each schematically illustrate another process for producing the electroconductive film according to the present embodiment.

<<<Electroconductive Film>>>

The electroconductive film 10 shown in FIG. 1 includes a light-transmitting base material 11, an electroconductive part 12 provided on a first face 11A of the light-transmitting base material 11, and a light-transmitting functional layer 13 provided on a second face 11B opposite to the first face 11A of the light-transmitting base material 11. The electroconductive film 10 should include the electroconductive part 12, and may not include the light-transmitting base material 11 and the light-transmitting functional layer 13. The light-transmitting functional layer 13 is provided on the second ace 11B of the light-transmitting base material 11, but may be provided between the light-transmitting base material 11 and the electroconductive part 12, or both on the second face 11B and between the light-transmitting base material 11 and the electroconductive part 12. Additionally, the electroconductive film 10 shown in FIG. 1 has the electroconductive part 12 only on one face but may have electroconductive parts on both faces of the electroconductive film.

The electroconductive part 12 shown in FIG. 1 is not yet patterned and is layered. As used herein, the "electroconductive part" means a portion from the surface of which electricity is conductible, and is a concept encompassing both a layered form and a form other than layered. The surface 10A of the electroconductive film 10 is constituted by the surface 12A of the electroconductive part 12. As used herein, the surface of the electroconductive film means the surface on one side of the electroconductive film, and thus the surface opposite to the surface of the electroconductive film is distinguished from the surface of the electroconductive film, and is referred to as back surface. The back surface 10B of the electroconductive film 10 is the surface 13A of the light-transmitting functional layer 13.

In the electroconductive film 10, the diffused light reflectance (Specular Component Exclude: SCE) in the region where the electroconductive part 12 is present is 0.5% or less. As used herein, the "diffused light reflectance" is the reflectance of light excluding specularly reflected light. Unless otherwise specified, the "diffused light reflectance" means the diffused light reflectance of the electroconductive film before the foldability test which will be described later.

The specularly reflected light is excluded because the specularly reflected light is greatly affected by the difference in refractive index at the interface with air, and thus the specular reflectance and the milkiness are not correlated. The diffused light reflectance is preferably 0.4% or less, 0.35% or less, or 0.3% or less.

In the measurement of the diffused light reflectance, the electroconductive film is first cut into a size of 100 mm×100 mm without curl or wrinkle and without any dirt such as fingerprints or dust, and the electroconductive film, an adhesive film, and a black plate are attached in the order mentioned to obtain a laminate. The size of the cut electroconductive film may be smaller than 100 mm×100 mm, as long as it is larger than the measurement port. For example, the size of the electroconductive film may be 20 mm×20 mm. In cases where the electroconductive film is small in size, the electroconductive film is gradually shifted or turned to such an extent that the measurement port is within the electroconductive film, and three points of measurement are thereby obtained. The electroconductive film is arranged in such a manner that the electroconductive film is placed above the black plate, and that the electroconductive part faces upward. Then, using a spectrocolorimeter (for example, product name "CM-600d", Konica Minolta, Inc., measurement port of φ 11 mm) from the side of the electroconductive part, the diffused light reflectance is measured in an environment at a temperature of 23±5° C. and a relative humidity of 30% or more and 70% or less, under the following measurement conditions. When the diffused light reflectance is measured using the CM-600d, the measurement button is pressed with the CM-600d placed on the central part of the electroconductive film. The diffused light reflectance is the arithmetic mean of three measurements, excluding the maximum value and the minimum value from five measurements per laminate. Since the electroconductive part 12 is layered, in the electroconductive film 10 cut into the above size, the entire region is the region where the electroconductive part is present when the electroconductive film 10 is viewed in a plan view. However, when there is also a region where the electroconductive part is not present as in the case of a patterned electroconductive part, the diffused light reflectance is measured in a region where the electroconductive part is present and which is larger than the measurement port. In recent years, designs with a minimum bezel have been in circulation. Even when the region where the electroconductive part is present is smaller than the measurement port, the diffused light reflectance can be measured by measuring the region where the electroconductive part is present in the same manner as in the above measurement. The reference value is also preferably in the above range, and in this case as well, an electroconductive film capable of inhibiting milkiness can be obtained.

(Measurement Conditions)

Main light source: D65

Light source 2: None

Field of view: 2 degrees

Color system: Yxy

Color difference formula: ΔE*ab

The means for achieving the diffused light reflectance of 0.5% or less in the region of the electroconductive film 10 where the electroconductive part 12 is present is not particularly limited, and for example, the electroconductive part 12 may include, in addition to a light-transmitting resin 14 and an electroconductive fiber 15, a fiber with a dark-colored surface 16 which exhibits a darker color than the electroconductive fiber 15 at at least a part of the surface, which will be described later. Other than the integration of the fibers with a dark-colored surface 16, the dispersibility of the electroconductive fibers 15 in the electroconductive part 12 may be improved or the size of the electroconductive materials to be included may be adjusted. For example, the fiber length and fiber diameter of the electroconductive fibers 15 may be adjusted. When electroconductive fibers 15 having the same fiber diameter as that of the conventional electroconductive fibers is used, fibers with a dark-colored surface 16 are preferably used. When electroconductive fibers 15 having a fiber diameter smaller than that of the conventional electroconductive fibers is used, the dark-colored fibers 16 may not be used.

The electroconductive film 10 has preferably a haze value (total haze value) of 5% or less. The electroconductive film 10 having a haze value of 5% or less can obtain sufficient optical performance. The haze value can be measured using a haze meter (for example, product name "HM-150"; manufactured by Murakami Color Research Laboratory Co., Ltd.) in accordance with JIS K7136: 2000 in an environment at a temperature of 23±5° C. and a relative humidity of 30% or more and 70% or less. The haze value is a value measured on the whole electroconductive film and is also determined as the arithmetic mean of three or more measurement values obtained from one electroconductive film, wherein a sample having a size of 50 mm×100 mm is cut from the electroconductive film and the sample without curl or wrinkle and without any dirt such as fingerprints or dust is then placed in the haze meter in such a manner that the electroconductive part faces in the direction opposite to the light source (this shall not apply to an electroconductive film including electroconductive parts formed on the both sides). The term "three measurements" as used herein does not mean three or more measurements at the same location and shall mean measurements at three or more different locations. For the quality of the real product, the surface 10A of the electroconductive film 10 is desirably flat when observed visually, and the laminated layers, such as the electroconductive part 12, likewise have desirably a flat surface, and the deviation of film thickness is also desirably within ±10% of the range of average thickness value. Thus, the measurement of haze values at three or more different locations on the cut electroconductive film is considered to provide a rough average of the haze values measured on the whole electroconductive film. The number of measurements is preferably five times, that is, five different locations are preferably measured, and it is preferable that the average value is obtained from the measurement values of three locations, excluding the maximum value and the minimum value from the five locations. Additionally, if a sample having the above-mentioned size cannot be cut from the electroconductive film, a sample having a size of 21 mm or more in diameter is required because, for example, the HM-150 haze meter has an entrance port aperture having a diameter of 20 mm for use in the measurement. Thus, a sample having a size of 22 mm×22 mm or more may be cut from the electroconductive film as appropriate. In cases where the electroconductive film is small in size, the electroconductive film is gradually shifted or turned to such an extent that the light source spot is within the electroconductive film, and three points of measurement are thereby obtained. The electroconductive film 10 more preferably has a haze value of 3% or less, 2% or less, 1.5% or less, 1.2% or less, or 1.1% or less. The deviation of the obtained haze value is within ±10% even though the measurement object has such a long size as a size of 1 m×3000 m or has almost the same size as that of a 5-inch smartphone; and in cases where the deviation is within the above-mentioned preferable range, a low haze value and a low resistance value are more easily obtained. Additionally, although the electroconductive part of the electroconductive film 10 is not patterned, the haze is 5% or less, more preferably 3% or less, 2% or less, 1.5% or less, 1.2% or less, or 1.1% or less, even in an electroconductive film including a patterned electroconductive part. Additionally, also in a whole multi-layered laminate such as a touch panel sensor including an electroconductive film, the haze value is preferred to be the same as above-mentioned.

The electroconductive film 10 preferably has a total light transmittance of 80% or more. The electroconductive film 10 having a total light transmittance of 80% or more can obtain sufficient optical performance. The total light transmittance can be measured using a haze meter (for example, product name "HM-150"; manufactured by Murakami Color Research Laboratory Co., Ltd.) in accordance with JIS K7361-1: 1997 in an environment at a temperature of 23±5° C. and a relative humidity of 30% or more and 70% or less. The electroconductive film 10 more preferably has a total light transmittance of 85% or more, 88% or more, or 89% or more. Additionally, although the electroconductive part of the electroconductive film 10 is not patterned, the total light transmittance is more preferably 80% or more, 85% or more, 88% or more, 89% or more, even in an electroconductive film including a patterned electroconductive part. The total light transmittance is the average value of the measurement values at three locations, excluding the maximum value and the minimum value from five measurement locations.

Even in cases where a test in which the electroconductive film 10 is folded by 180 degrees so as to leave a gap φ of 3 mm between the opposite edges of the electroconductive film 10 and then unfolded (foldability test), is repeated one hundred thousand times, the ratio between the electrical resistance values, as described later, of the surface 12A of the electroconductive part 12 of the electroconductive film 10 measured before and after the foldability test is preferably 3 or less. In cases where the ratio between the electrical resistance values of the surface of an electroconductive part of an electroconductive film is more than 3 after repeating the foldability test on the electroconductive film one hundred thousand times, the value of the ratio indicates the possibility that the electroconductive film is broken or otherwise damaged, which in turn means that the electroconductive film has poor flexibility. In this respect, any breakage or other damage to the electroconductive film by the foldability test reduces the electrical conductivity, which causes the electrical resistance value measured after the foldability test on the surface of the electroconductive part of the electroconductive film to be higher than that measured before the foldability test on the surface of the electroconductive part of the electroconductive film. Because of this respect, the determination of whether or not an electroconductive film is broken or otherwise damaged can be achieved by determining the ratio between the electrical resistance values of the surface of the electroconductive part of the electroconductive film measured before and after the foldability test. The foldability test may be carried out by folding the electroconductive film 10 with the electroconductive part 12 facing either inward or outward. In either case, the ratio between the electrical resistance values of the surface 12A of the electroconductive part 12 of the electroconductive film 10 measured before and after the foldability test is preferred to be 3 or less.

Even in cases where the foldability test is carried out by repeating the folding and unfolding process two hundred thousand times, three hundred thousand times, five hundred thousand times, or one million times, it is more preferable that the ratio between the electrical resistance values of the electroconductive part 12 of the electroconductive film 10 before and after the foldability test is 3 or less. In this regard, the larger the number of times of repeating the above-mentioned folding and unfolding process is, the more difficult it is that the ratio between the electrical resistance values of the electroconductive part before and after the foldability test is made 3 or less, and thus, there is a technically marked difference between: that, in the foldability test carried out by repeating the folding and unfolding process two hundred thousand times, three hundred thousand times, five hundred thousand times, or one million times, the ratio between the electrical resistance values of the electroconductive part 12, before and after the foldability test, is 3 or less; and that, in the foldability test carried out by repeating the folding and unfolding process one hundred thousand times, the ratio between the electrical resistance values of the electroconductive part 12, before and after the foldability test, is 3 or less. Additionally, the number of times of repeating the folding and unfolding process in the foldability test is at least one hundred thousand in the evaluation for the following reason. For example, the frequency of folding and unfolding (frequency of opening and closing) is very large on the assumption that the electroconductive film is incorporated in a foldable smartphone. Because of this, an evaluation made by repeating the folding and unfolding process, for example, ten thousand times or fifty thousand times in the above-mentioned foldability test will fail to be an evaluation on a practical level. Specifically, in cases where a person who constantly uses a smartphone is taken for example, the person presumably opens and closes the person's smartphone five to ten times during the person's commuting time in the bus, train or the like in the morning, and accordingly, such a smartphone is presumably opened and closed at least 30 times in only one day. Thus, assuming that a smartphone is opened and closed 30 times a day, which gives 30 times×365 days=10950 times, a foldability test carried out by repeating the folding and unfolding process ten thousand times is a test carried out on the assumption of one-year use. In other words, the result of the foldability test carried out by repeating the folding and unfolding process ten thousand times can be favorable, but in some cases, the electroconductive film will undesirably generate a crease or a crack after the one year passes. Thus, an evaluation based on a foldability test carried out by repeating the folding and unfolding process ten thousand times can only verify whether a product is on an unusable level, and a product that can be used but insufficiently will be regarded as favorable, failing to be duly evaluated. Thus, an evaluation of whether a product is on a practical level needs to be an evaluation based on the foldability test carried out by repeating the folding and unfolding process at least one hundred thousand times.

Even in cases where the foldability test is carried out by repeating the folding and unfolding process one hundred thousand times, two hundred thousand times, three hundred thousand times, five hundred thousand times, or one million times, it is more preferable that the ratio between the electrical resistance values of the electroconductive part 12 of the electroconductive film 10, before and after the foldability test, is 1.5 or less.

The above-mentioned foldability test is carried out so as to leave a gap φ of 3 mm between the opposite edges of the electroconductive film 10, and in terms of attempting to make image display devices thinner, it is more preferable that the ratio between the electrical resistance values of the electroconductive part 12, before and after the foldability test, is 3 or less even in cases where the foldability test is carried out by repeating, one hundred thousand times, a process in which the electroconductive film 10 is folded by 180 degrees so as to leave a gap φ in a narrower range, specifically 2 mm or 1 mm, between the opposite edges of the electroconductive film 10 and unfolded. Even in cases where the number of times of repeating the folding and unfolding process is the same, the smaller the gap φ is, the more difficult it is that the ratio between the electrical resistance values of the electroconductive part before and after the foldability test is made 3 or less, and thus, there is a technically marked difference between: that, in the foldability test carried out so as to leave the above-mentioned gap φ of 2 mm or 1 mm, the ratio between the electrical resistance values of the electroconductive part 12, before and after the foldability test, is 3 or less; and that, in the foldability test carried out so as to leave the above-mentioned gap φ of 3 mm, the ratio between the electrical resistance values of the electroconductive part 12, before and after the foldability test, is 3 or less.

The foldability test is performed as follows: first, a sample S1 which has a predetermined size (for example, a rectangular shape of 125 mm (length)×50 mm (width)) and which includes an electroconductive part 12 is cut from the electroconductive film 10 at an arbitrary site before the foldability test (see FIG. 3). If a sample cannot be cut into a size of 125 mm×50 mm, the sample may have a size enough to carry out each evaluation performed after the foldability test, which will be described later, and a sample may be cut into a size of, for example, 80 mm×25 mm. After a sample S1 is cut from the electroconductive film before the foldability test, the sample S1 before the foldability test is measured for the electrical resistance value on the surface 12A of the electroconductive part 12. Specifically, as shown in FIG. 3, a silver paste (product name "DW-520H-14"; manufactured by Toyobo Co., Ltd.) is applied on both longitudinal ends of the sample S1 (for example, each end having a size of 10 mm length×50 mm width) to prevent any change in distance between points for measuring the electrical resistance value, and heated at 130° C. for 30 minutes to provide a cured silver paste 21 to each end of the sample S1, and the electrical resistance value of each sample is then measured using a tester (product name "Digital MO Hitester 3454-11"; manufactured by Hioki E.E. Corporation). The distance between the points where the silver paste 21 has been applied (the length of the portion carrying no silver paste 21) is the distance between points for measuring the electrical resistance value in the sample S1 (for example, 100 mm), which should be constant among the samples S1. When the electrical resistance value is measured, probe terminals of the tester are individually contacted with either of the cured silver pastes 21 provided on both ends. The measurement of electrical resistance value of the electroconductive part 12 is carried out in an environment at a temperature of 23±5° C. and a relative humidity of 30% or more and 70% or less. After the electrical resistance value of the electroconductive part 12 is measured in the samples before the foldability test, the samples S1 are subjected to the foldability test.

The foldability test is carried out as follows. As shown in FIG. 4(A), the foldability test starts with fixing the edge S1*a* and opposite edge S1*b* of the selected sample S1 to fixing members 25 of a folding endurance testing machine (for example, product name "U-shape Folding Test Machine DLDMLH-FS"; manufactured by Yuasa System Co., Ltd.; in accordance with IEC62715-6-1) which are arranged in parallel to each other. A portion of about 10 mm on each side of the sample S1 in the longitudinal direction of the sample S1 is retained by the fixing members 25, and thus fixed. However, in cases where the sample S1 is smaller than the above size, the portion of the sample S1 required for this fixing can be, up to about 20 mm, attached to the fixing members 25 by a tape for the measurement (that is, the minimum sample is 60 mm×25 mm). In addition, the fixing members 25 can slide in the horizontal direction, as shown in FIG. 4(A). The above-mentioned device is preferable because, unlike the conventional method such as by winding a sample around a rod, the durability of the sample against bending load can be evaluated without generating tension or friction on the sample.

Figure 4B:
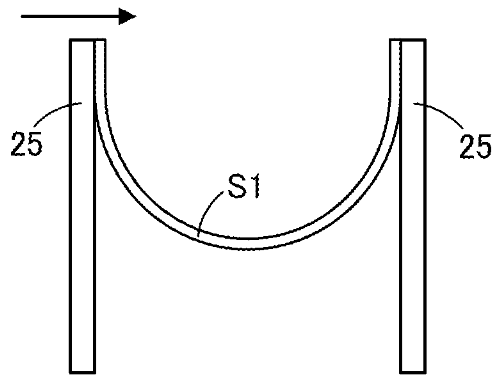
Figure 4C:
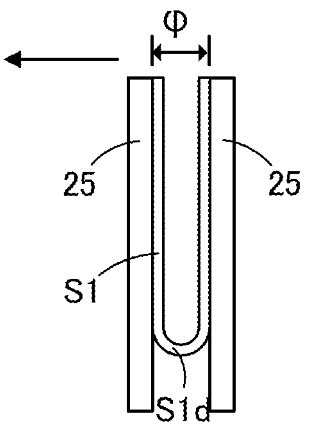

Next, the fixing members 25 are moved close to each other to fold and deform the sample S1 along the center line S1*c*, as shown in FIG. 4(B); the fixing members 25 are further moved until a gap φ of 3 mm is left between the two opposite edges S1*a* and S1*b* of the sample S1 fixed to the fixing members 25, as shown in FIG. 4(C), subsequently, the fixing members 25 are moved in opposite directions to resolve the deformation of the sample S1.

As shown in FIG. 4(A) to (C), the fixing members 25 can be moved to fold back the sample S1 along the center line s1*c*. Additionally, a gap φ of 3 mm can be maintained between the two opposite edges S1*a* and S1*b* of the sample S1 by carrying out the foldability test under the following conditions in a manner that prevents the bent part Sid of the sample S1 from being forced out beyond the lower edges of the fixing members 25 and controls the fixing members 25 to keep a gap of 3 mm when they approach closest each other. In this case, the outer width of the bent part Sid is considered as 3 mm. The thickness of the sample S1 is small enough as compared with the gap between the fixing members 25 (3 mm). Thus, it seems unlikely that a difference in the thickness of the sample S1 affects the result of the foldability test on the sample S.

(Folding Conditions)

Reciprocation rate: 80 rpm (every minute)

Test stroke: 60 mm

Bending angle: 180°

After the foldability test is performed, the sample S1 after the foldability test is measured for the electrical resistance value on the surface of the electroconductive part, similarly to the sample S1 before the foldability test. Then, the ratio of the electrical resistance value measured after the foldability test on the selected sample S to that measured before the foldability test on the same sample S (the electrical resistance value of the selected sample after the foldability test/the electrical resistance value of the same sample before the foldability test) is calculated. The arithmetic mean of three measurements is determined as the electrical resistance value ratio.

Even if the electrical resistance value ratio of the electroconductive part of the electroconductive film before and after the foldability test is 3 or less, the electroconductive film after the foldability test generates a crease at the bent part and also generates microcracks, undesirably causing poor appearance, specifically white turbidity and delamination (poor adhesion) starting from the microcracks. One cause of the white turbidity is considered to be the change of the crystalline state of an organic compound, which is the material of any layer of the electroconductive film. When poor adhesion locally occurs, moisture may accumulate in the delaminated portion or air may enter this delaminated portion due to a change in temperature/humidity, which may increase white turbidity. The microcracks hardly occur in the case of a light-transmitting base material alone or a laminate alone in which a certain functional layer is provided on the light-transmitting base material. That is, although the origin of the generation is unknown, it is presumed that a layer containing electroconductive fibers is a factor. When the white turbidity and microcracks are present, the milkiness is affected as well. In recent years, instead of just flat displays, there has increasingly been a variety of three-dimensional designs such as foldable displays and curved displays. Therefore, inhibition of creases and microcracks at the bent part is extremely important in use of the electroconductive film for image display devices. From these viewpoints, the electroconductive film 10 preferably has flexibility. As used herein, "flexibility" refers to not only having an electrical resistance value ratio of 3 or less in the electroconductive part before and after the foldability test, but also generating no observed crease or microcrack in the test. Accordingly, the "flexibility" as used herein is different from the flexibility the only requirement for which is that the electrical resistance value ratio of the electroconductive part before and after the foldability test is 3 or less.

The above-mentioned crease is to be observed visually, and in observing such a crease, the bent part is uniformly observed with transmitted light and reflected light under white illumination (at 800 lux to 2000 lux) in a bright room, and both the portion corresponding to the internal side and the portion corresponding to the external side at the bent part after folding are observed. The observation of the crease is carried out in an environment at a temperature of 23±5° C. and a relative humidity of 30% or more and 70% or less.

The above-mentioned microcracks are observed using a digital microscope (digital microscope). Examples of digital microscopes include VHX-5000 manufactured by Keyence Corporation. Such microcracks are observed in a dark field, with reflected light, and with ring illumination selected as the illumination of a digital microscope. Specifically, a sample after the foldability test is first spread slowly, and the sample is fixed with a tape to the stage of a microscope. If the crease is persistent in this case, the region to be observed is made as flat as possible. However, the region to be observed (the bent part) at and around the center of the sample is not touched with a hand and handled to a degree to which no force is applied. Then, both the portion corresponding to the internal side and the portion corresponding to the external side after folding are observed. The observation of the microcracks are carried out in an environment at a temperature of 23±5° C. and a relative humidity of 30% or more and 70% or less.

In order that the position to be observed can be easily known in observing the above-mentioned crease and microcracks, it is advisable to place a sample before the foldability test between the fixing members of an endurance testing machine, fold the sample once, and use a permanent marker or the like to put, on both ends S1$d_1$, marks A1 indicating the bent part, as shown in FIG. 5, wherein both the ends S1$d_1$ are opposed in the direction along the bent part S1$d$ and orthogonal to the folding direction FD. In cases where no crease or the like is observed on the sample after the foldability test, the sample is removed from the endurance testing machine after the foldability test, and then, a permanent marker may be used to draw lines A2 (dotted lines in FIG. 5) connecting both the marks A1 for both the ends S1$d_1$ along the bent part Sid so that the position to be observed can be prevented from being unclear. Then, in observing the crease, the whole bent part Sid, which is a region formed by the marks A1 for both the ends S1$d_1$ of the bent part S1$d$ and the lines A2 connecting the marks A1, is observed visually. In observing the microcracks, the microscope is set in such a manner that the center of the field-of-view range (the range surrounded by the two-dot chain line in FIG. 5) of the microscope is aligned with the center of the bent part Sid. It is assured that the marks with a permanent marker do not appear in the sample area required for the actual measurement.

Additionally, carrying out the foldability test on the electroconductive film will undesirably cause the adhesion between the light-transmitting base material and the light-transmitting functional layer to decrease. Because of this, it is preferable that no peeling or the like is observed at and around the interface between the light-transmitting base material 11 and the light-transmitting functional layer 13 when a digital microscope is used to observe the region at and around the interface between the light-transmitting base material 11 and the light-transmitting functional layer 13 at the bent part of the electroconductive film after the foldability test. Examples of digital microscopes include VHX-5000 manufactured by Keyence Corporation.

In cases where a test in which the electroconductive film 10 is folded by 180 degrees so as to leave a gap φ of 3 mm between the opposite edges of the electroconductive film 10 and then unfolded (foldability test) is repeated one hundred thousand times, the difference in the diffused light reflectance of the electroconductive film before and after the foldability test (diffused light reflectance after the foldability test−diffused light reflectance before the foldability test) is preferably 0.25% or less. Diffused light reflectance may increase due to the foldability test, thereby making milkiness noticeable, but if the difference in diffused light reflectance before and after the foldability test is 0.25% or less, the noticeable milkiness can be locally inhibited. In this regard, the appearance is completely different, for example, between the case where the diffused light reflectance changes on the entire surface of the electroconductive film and the case where the diffused light reflectance changes locally on the surface of the electroconductive film. That is, when the diffused light reflectance changes only in a local portion, that is, a portion where the folding and unfolding process is repeatedly performed (bent part), the milkiness tends to be relatively more noticeable since the change in diffused light reflectance in portions other than the bent part is small. Therefore, although the difference of 0.25% or less in diffused light reflectance before and after the foldability test is a small difference, the effect obtained by this difference is extremely large.

Even in cases where the foldability test is carried out by repeating the folding and unfolding process two hundred thousand times, three hundred thousand times, five hundred thousand times, or one million times, the difference in diffused light reflectance of the electroconductive film before and after the foldability test is preferably 0.25% or less. In this regard, the larger the number of times of repeating the above-mentioned folding and unfolding process is, the more difficult it is that the difference in diffused light reflectance of the electroconductive film before and after the foldability test is made 0.25% or less, and thus, there is a technically marked difference between: that, in the foldability test carried out by repeating the folding and unfolding process two hundred thousand times, three hundred thousand times, five hundred thousand times, or one million times, the difference in diffused light reflectance before and after the foldability test is 0.25% or less; and that, in the foldability test carried out by repeating the folding and unfolding process one hundred thousand times, the difference in diffused light reflectance before and after the foldability test is 0.25% or less.

Even in cases where the foldability test is carried out by repeating the folding and unfolding process one hundred thousand times, two hundred thousand times, three hundred thousand times, five hundred thousand times, or one million times, it is more preferable that the difference in diffused light reflectance of the electroconductive film 10 before and after the foldability test is 0.25% or less, 0.20% or less, 0.15% or less, or 0.10% or less.

In cases where an additional film is provided on the electroconductive film through an adhesive or adhesion layer, the additional film and the adhesive or adhesion layer are peeled away before the diffused light reflectance, the haze value, and the total light transmittance are measured and before the foldability test is carried out. The additional film can be peeled away, for example, as follows. First of all, a laminate consisting of an electroconductive film attached to an additional film through an adhesive or adhesion layer is heated with a hair dryer and is slowly separated by inserting a cutter blade into a possible interface between the electroconductive film and the additional film. By repeating such a process of heating and separation, the adhesive or adhesion layer and the additional film can be peeled away. Even if such a peeling process is carried out, the measurement of the diffused light reflectance and the like and the foldability test are not significantly affected.

In this regard, the electroconductive film 10 needs to be cut into pieces having the above-mentioned sizes, as mentioned above, when the electroconductive film 10 is used for measurement of the diffused light reflectance, the haze value, and the total light transmittance or is subjected to the foldability test, but in cases where the electroconductive film 10 is large (for example, longitudinal as with the shape of a roll), the electroconductive film 10 is cut at any position into an A4 size (210 mm×297 mm) or an A5 size (148 mm×210 mm) followed by being cut into pieces having a size for each measurement item. In addition, in cases where the electroconductive film 10 is roll-shaped, the electroconductive film 10 in roll shape is unrolled by a predetermined length, and cut not at the non-effective region extending along the longitudinal direction of the roll and including both ends but at the effective regions being at and around the central portion and having stable quality. In cases where the electroconductive film 10 is used for measurement of the diffused light reflectance, the haze value, and the total light transmittance or is subjected to the foldability test, the above devices are used, but without limitation to the above devices, equivalent devices such as their successors may be used for measurement.

The thickness of the electroconductive film 10 is not limited, and may be 500 μm or less. The minimum thickness of the electroconductive film 10 is more preferably 5 μm or more, 10 μm or more, or 20 μm or more in terms of handling properties. The maximum thickness of the electroconductive film 10 is 250 μm or less, and 100 μm or less in terms of attempting to thin the film, and more preferably 78 μm or less, particularly 45 μm or less in cases where flexibility is considered to be important. Therefore, in cases where flexibility is considered to be important, the thickness of the electroconductive film 10 is suitably 5 μm or more and 78 μm or less, more preferably 28 μm or less, and 20 μm or less. The thickness is measured at randomly selected ten locations in cross-sectional images of the electroconductive film acquired using a transmission electron microscope (TEM), a scanning transmission electron microscope (STEM), or scanning electron microscope (SEM), and the thickness of the electroconductive film is determined as the average value of the thickness values at eight locations, excluding the maximum value and the minimum value from the thickness values measured at the ten locations. The electroconductive film generally has uneven thickness. In the present invention, since the electroconductive film is for optical use, the thickness unevenness is preferably a thickness average value ±2 μm or less, more preferably ±1 μm or less.

Measuring the thickness of the electroconductive film using a transmission electron microscope (TEM) or a scanning transmission electron microscope (STEM) can be carried out in the same manner as measuring the film thickness of the electroconductive part. However, a cross-sectional image of the electroconductive film is acquired at a magnification of 100 to 20,000 times. When the thickness of the electroconductive film is measured using a scanning electron microscope (SEM), the cross-section of the electroconductive film may be obtained using an ultramicrotome (product name "Ultramicrotome EM UC7"; manufactured by Leica Microsystems GmbH) or the like. As measurement samples for the measurement with TEM or STEM, ultra-thin sections are produced using the ultramicrotome, at a feeding rate of 100 nm. The produced ultra-thin sections are collected on collodion-coated meshes (150 meshes) to obtain the measurement samples. Upon cutting with the ultramicrotome, a measurement sample may be subjected to a pretreatment that facilitates cutting, such as embedding the measurement sample in a resin.

The application of the electroconductive film 10 is not limited to a particular one, and may be used in various applications (for example, sensor applications), for example, in which a transparent electroconductive film is used. Additionally, the electroconductive film according to the present invention is suitable for use in vehicles (including all types of vehicles such as railroad cars and carriage building machines) as well as for use in image display devices (including smartphones, tablet terminals, wearable terminals, personal computers, televisions, digital signages, public information displays (PID), vehicle displays, and the like). Examples of sensors for which the electroconductive film is used in vehicle applications include a sensor arranged at a portion, such as a steering wheel or a seat, which is touched by a person. Additionally, the electroconductive film is also favorable for applications which require flexible forms, such as foldable or rollable forms. The electroconductive film may be used for electrical appliances and windows used for houses and cars (including all types of vehicles such as railroad cars and carriage building machines). In particular, the electroconductive film of the present invention can suitably be used for products in which transparency is critical. Additionally, the electroconductive film of the present invention can suitably be used for electrical appliances in which not only technical features, such as transparency, but also designs are essential. Specific examples of the application of the electroconductive film other than an image display device include carrier films and the like used in defrosters, antennas, solar cells, audio systems, loudspeakers, electric fans, interactive whiteboards, and semiconductors. The shape of the electroconductive film as used is suitably designed in accordance with the application, without particular limitation, and, for example, may be a curved surface.

The electroconductive film 10 may be cut into a piece having a desired size or be rolled. The electroconductive film that is rolled may be cut into a piece having a desired size in the stage, and alternatively, may be cut into a piece having a desired size after being treated, for example, by etching. In cases where the electroconductive film 10 has been cut into a piece having a desired size, the size of the electroconductive film piece is not limited to a particular size, and the size is appropriately determined depending on the display size of an image display device. Specifically, the electroconductive film piece may be, for example, 5 inches or more and 500 inches or less in size. The term "inch" as used herein shall mean the length of a diagonal when the electroconductive film is rectangular, and the length of a diameter when the electroconductive film is circular, and the average of major and minor axes when the electroconductive film is elliptical. In this respect, when the electroconductive film is rectangular, the aspect ratio of the electroconductive film which is measured to have the above-described inches is not limited to a particular aspect ratio as long as no problem is found with the electroconductive film to be used for the display screen of an image display device. Examples of the aspect ratio include height-to-width ratios of 1:1, 4:3, 16:10, 16:9, and 2:1. However, particularly in electroconductive films used for vehicle display and digital signage which are rich in designs, the aspect ratio is not limited to the above-described aspect ratios. Additionally, in cases where the electroconductive film 10 is large in size, the electroconductive film is appropriately cut at an arbitrary position into an easy-handling size such as A4 size (210 mm×297 mm) or A5 size (148 mm×210 mm) and then cut into pieces having a size for each measurement item. For example, in cases where the electroconductive film 10 is roll-shaped, the electroconductive film 10 in roll shape is unrolled by a predetermined length, and cut into a piece having a desired size not at the non-effective region extending along the longitudinal direction of the roll and including both ends but at the effective region being at and around the central portion and having stable quality.

<<Light-Transmitting Base Material>>

The light-transmitting base material 11 is not limited to a particular light-transmitting base material as long as it is light-transmitting. Examples of constituent materials of the light-transmitting base material 11 include base materials containing a light-transmitting resin. Such a resin is not limited to any particular one as long as it is light-transmitting, and examples of such resins include polyolefin resins, polycarbonate resins, polyacrylate resins, polyester resins, aromatic polyetherketone resins, polyethersulfone resins, polyimide resins, polyamide resins, polyamide-imide resins, and mixtures obtained by mixing two or more of these resins. Among these light-transmitting resins, polyester resins are preferred because a light-transmitting base material composed of a polyester resin is hardly damaged even upon contacting to a coating machine and is thus capable of inhibiting increase of the haze value even if the light-transmitting base material is contacted to a coating machine for coating of a light-transmitting functional layer or the like and thus likely to be damaged, as well as a light-transmitting base material composed of a polyester resin has superior heat resistance, barrier property, and water resistance to those of light-transmitting base materials composed of any light-transmitting resin other than polyester resins.

When a foldable electroconductive film is obtained as an electroconductive film, preferred examples of the resin constituting the light-transmitting base material include polyimide resins, polyamide-imide resins, polyamide resins, polyester resins and a mixture thereof from the viewpoint of their good flexibility. Among these, polyimide resins, polyamide resins, or a mixture thereof are preferred because they show excellent hardness and transparency as well as excellent flexibility, and also have excellent heat resistance, thereby imparting further excellent hardness and transparency by firing.

Examples of polyolefin resins include resins composed of at least one of, for example, polyethylene, polypropylene, and cycloolefin polymer resins. Examples of the cycloolefin polymer resin include resins having the norbornene backbone.

Examples of the polycarbonate resin include aromatic polycarbonate resins containing a bisphenol (such as bisphenol A) as a base material, and aliphatic polycarbonate resins such as diethylene glycol bis(allyl carbonate).

Examples of the polyacrylate resin include methyl poly(meth)acrylate base materials, ethyl poly(meth)acrylate base materials, and methyl (meth)acrylate-butyl (meth)acrylate copolymers.

Examples of the polyester resin include resins composed of at least one of polyethylene terephthalate (PET), polypropylene terephthalate (PBT), polybutylene terephthalate, and polyethylene naphthalate (PEN). Among these, PET is preferred from the viewpoint as follows.

Among polyester resins, PET is considered to be able to achieve a film solid structure having good mechanical strength while having flexibility due to its resin molecular structure. This is because the molecular structure of the ethylene chain and the benzene ring of PET is a structure which is stiff and supple, and the solid structure changes depending on the stretching method and the application method of heat, which can change the optical characteristics and mechanical characteristics in various ways when the film is formed. On the other hand, PEN, which is one of the polyester resins other than PET, has a naphthalene ring which occupies a larger space in the PEN molecule than the benzene ring does in PET, and the ring structures in the solidified film are easily stacked. Therefore, although PEN is superior to PET in hardness, but is inferior in flexibility, and thus, PEN is brittle as the crystals stacked inside the film are easily separated from each other. Further, PBT, which is one of the polyester resins, is a resin having one benzene ring in the molecule like PET, and butylene has a longer carbon chain portion than ethylene. For this reason, it is believed that PBT is more flexible than PET. However, in PBT, stable biaxial stretching may be difficult due to the influence of its high crystallization rate which is a property of PBT.

Usually, the stretching ratio in the longitudinal direction and the stretching ratio in the horizontal direction of a biaxially stretched polyethylene terephthalate film are very different. However, in cases where the light-transmitting base material 11 contains a polyester resin, it is preferable that the stretching ratio in an arbitrary first direction of the light-transmitting base material 11 (for example, the longitudinal direction) and the stretching ratio in the second direction orthogonal to the first direction (for example, the horizontal direction) have the same ratio as much as possible. If the stretching ratio in the first direction of the light-transmitting base material 11 is the same as the stretching ratio in the second direction, the property of the solid structure in either the first direction or the second direction does not become dominant. Since it is assumed that the solid structure is almost the same between the first direction and the second direction, the balance is good and the endurance against the foldability test is increased.

It is believed that, as the stretching ratio increases, the molecules are oriented in that direction and crystallization progresses, and the amorphous portion in the structure when the resin material is solidified decreases. In the present invention, the appropriate presence of the amorphous portions in the solid is also considered to be important for obtaining suppleness and flexibility. In cases where the stretching ratio of one of the first direction and the second direction is large, the property of the solid structure in the direction having the large stretching ratio becomes dominant, and as a result, the balance of the solid structure within the plane and in the film is disturbed. Thus, microcracks are likely to occur during the foldability test, which also affects milkiness. It is also important that the stretching ratio is neither too small nor too large. It is presumed that the preferable solid structure, crystalline state and crystal size, and the amount of the amorphous portions are optimized with appropriate stretching ratios, resulting in good flexibility and good mechanical strength.

Specifically, in cases where the light-transmitting base material 11 contains a polyester resin, the stretching ratio in the first direction and the stretching ratio in the second direction of the light-transmitting base material 11 is preferably 1.5 times to 3.9 times, more preferably 2.0 times to 3.5 times. In addition, the ratio of the stretching ratio in the first direction to the stretching ratio in the second direction in the light-transmitting base material 11 (stretching ratio in the first direction/stretching ratio in the second direction) is preferably 0.8 or more and 1.2 or less. The ratio closer to 1 is more preferable. Therefore, the minimum ratio is more preferably 0.85 or more, 0.90 or more or 0.95 or more, and the maximum ratio is more preferably 1.15 or less, 1.10 or less or 1.07 or less. The light-transmitting base material 11 may be stretched in the first direction and the second direction at a stretching rate of 6.5 m/min to 8.5 m/min. The stretching method is not particularly limited as long as the stretching ratio in the first direction and the stretching ratio in the second direction are the above-mentioned ratios, and may be simultaneous biaxial stretching or sequential biaxial stretching.

It is believed that the biaxially-stretched PET with approximately the same ratio, more precisely, the central part thereof which is weakly affected by the bowing phenomenon known in stretched base materials, not the both ends strongly affected by the phenomenon, has the most preferable PET structure in the present invention. That is, since the portion is carefully biaxially stretched, the crystalline and amorphous states and the molecular orientation in the first direction and the second direction are in the best balance, which can provide the best flexibility and mechanical strength.

The light-transmitting base material 11 may be preheated to a certain temperature before being stretched in the first direction and the second direction. In this case, the preheating temperature is preferably in the range of glass transition temperature (Tg)+5° C. to Tg+50° C., and a lower Tg results in better stretchability but also can result in break. Therefore, it is preferable that the light-transmitting base material is preheated to about 78° C. before being stretched. The light-transmitting base material 11 may be completely stretched, and then heat-treated and fixed. In this case, the heat treatment temperature may be 160° C. to 230° C.

Regarding the flexibility, it is presumed that a more preferable structure of PET is the one that has an amorphous portion appropriately in the solid structure and that has an average structure of those of the first direction and the second direction. For this reason, the present inventors considered using the degree of crystallization determined by the following method, which was thought to be able to convert such solid structure and molecular crystallinity into data. However, after vigorous studies, it has been found that the degree of crystallization is within the same range of 34 to 54% as long as it is a PET resin film even when the optical characteristics and the like are clearly different, and thus the judgment is impossible. This is probably because the degree of crystallization is, in the measurement principle, the average of all the crystal states in the film. For example, when the degrees of crystallization of PETs having an in-plane phase difference value Re of 50 nm and of 5000 nm at a wavelength of 589 nm, both having the same thickness of 30 μm, were compared, the degree of crystallization was the same, about 44%. That is, it is considered to be difficult to understand the relationship between optical characteristics, mechanical strength, and the degree of crystallization. Therefore, the present inventors tried evaluating the optical characteristics of the film (Re, Nz coefficient, an), which are affected by the solid structure of the film (crystalline state, amorphous state) and the like, and this way, a preferable range for the flexibility could be targeted.

The degree of crystallization can be obtained as follows. First, based on the assumption that the density of a PET film is a value obtained by dividing the total mass of the components constituting the PET film by the total volume of the components, the density of a PET film is obtained. The density of the PET is determined by the method according to JIS K7112:1980 (Density Gradient Tube Method). The resin component of the PET film is a mixture of a crystalline portion and an amorphous portion. The density of the crystalline portion of PET is 1.46 (g/cm$^3$), and the density of the amorphous portion is 1.34 (g/cm$^3$). The degree of crystallization is calculated based on the following equation (1), wherein Xc (%) is the degree of crystallization, dc is the density of the crystalline portion (g/cm$^3$), da is the density of the amorphous portion (g/cm$^3$), and d is the density of the measurement point (g/cm$^3$). The density of the PET film is measured at three points and the arithmetic mean is used as the degree of crystallization.

$$Xc=\{dc(d-da)/d(dc-da)\}\times 100 \quad (1)$$

In the case of a conventional biaxially-stretched polyethylene terephthalate base material, when the thickness of the polyethylene terephthalate base material is 45 μm or more and 125 μm or less, the in-plane phase difference Re is about 1400 nm or more and 5000 nm. The present inventors have vigorously studied, and have discovered that when the light-transmitting base material contains a polyester resin, the light-transmitting base material having a lower in-plane phase difference Re results in better flexibility of the electroconductive film. However, in cases where the in-plane phase difference Re of the light-transmitting base material is too low, that is, in cases where the polyethylene terephthalate is unstretched, the mechanical strength is reduced. Therefore, the light-transmitting base material preferably has the in-plane phase difference of 980 nm or less. Specifically, in cases where the light-transmitting base material 11 contains a polyester resin and has a thickness of 45 μm or more and 125 μm or less, the in-plane phase difference Re of the light-transmitting base material 11 at the wavelength of 589 nm is preferably 110 nm or more and 980 nm or less because white turbidity and microcracks during the foldability test are inhibited. In this case, the minimum in-plane phase difference Re of the light-transmitting base material 11 is more preferably 130 nm or more or 200 nm or more, and the maximum in-plane phase difference Re is more preferably 680 nm or less or 480 nm or less. Since the preferable Re varies depending on the thickness of the light-transmitting base material, another case with another thickness range will be further described below.

In cases where the light-transmitting base material 11 contains a polyester resin and has a thickness of 29 μm or more and less than 45 μm, the in-plane phase difference Re is preferably 40 nm or more and 680 nm or less because microcracks during the foldability test are inhibited. In this case, the minimum in-plane phase difference Re of the light-transmitting base material 11 is more preferably 60 nm or more or 110 nm or more, and the maximum in-plane phase difference Re is more preferably 480 nm or less or 350 nm or less.

In cases where the light-transmitting base material 11 contains a polyester resin and has a thickness of 5 μm or more and less than 29 μm, the in-plane phase difference Re at the wavelength of 589 nm is preferably 10 nm or more and 450 nm or less because microcracks during the foldability test are inhibited. In this case, the minimum in-plane phase difference Re of the light-transmitting base material 11 is more preferably 30 nm or more, 55 nm or more, or 90 nm or more, and the maximum in-plane phase difference Re is more preferably 400 nm or less or 270 nm or less.

The light-transmitting base material 11 preferably has an Nz coefficient exceeding 2.0 in cases where the light-transmitting base material 11 contains a polyester resin (Nz>2.0). In cases where the Nz coefficient of the light-transmitting base material 11 exceeds 2.0, for example, even when the thickness of the light-transmitting base material 11 is 29 μm or less, coating and other manufacturing can be carried out by a roll-to-roll method without reinforcement by a protective film. Since the mechanical strength of the light-transmitting base material 11 is improved when Rth is large to some extent, the Nz coefficient is more preferably 4.5 or more, and further preferably 8.0 or more.

The above Nz coefficient is expressed by the following equation (2), wherein nx is the refractive index in the slow axis direction, which is the direction in which the refractive index is the largest in the plane of the light-transmitting base material; ny is the refractive index in the fast axis direction, which is orthogonal to the slow axis direction in the plane; and nz is the refractive index in the thickness direction of the light-transmitting base material.

$$Nz\text{ coefficient}=(nx-nz)/(nx-ny) \qquad (2)$$

In order to improve flexibility, the solid structure is preferably almost the same between the first direction and the second direction, that is, a smaller difference in refractive index between the slow axis direction and the fast axis direction of the light-transmitting base material results in a smaller difference in crystalline state, amorphous state, and molecular orientation in the solid between the first direction and the second direction. Therefore, the above Δn is preferably 0.0009 or more and 0.02 or less. The minimum Δn is more preferably 0.0010 or more and a maximum Δn is preferably 0.0099 or less. Δn is expressed by the following equation (3).

$$\Delta n=nx-ny \qquad (3)$$

The above-described Re, Rth, nx, ny, nz, Δn, and Nz coefficient are measured using an inspection device for retardation films/optical materials (for example, product name "RETS-100", manufactured by Otsuka Electronics Co., Ltd.). The above Re is based on "The Optical Properties of Supertwisted Liquid Crystal Layers", Molecular Crystals and Liquid Crystals Letters, E. P. Raynes, vol. 4, Issue 3-4, pp 69-75 (1987)" and the like. The above Rth is expressed by the following equation (4).

$$Rth=\{(nx+ny)/2-nz\}\times d \qquad (4)$$

In the equation (4), nx, ny, and nz are the same as those in the above equation (2), and d is the thickness (μm) of the light-transmitting base material.

When the Re and the like are measured using RETS-100, the measurement can be performed according to the following procedure. In order to stabilize the light source of RETS-100, the light source is turned on and left to stand for 60 minutes or more. Then, the rotation analyzer method is selected, and the ω mode (mode of angle direction phase difference measurement and Rth calculation) is selected. By selecting this ω mode, the stage becomes a tilt rotation stage.

The following measurement conditions are input to RETS-100.

(Measurement Conditions)

Retardation measurement range: Rotation analyzer method

Spot diameter: φ 5 mm

Tilt angle range: −40° to 40°

Measurement wavelength range: 400 nm to 800 nm

Average refractive index of a polyester resin (for example, N=1.617 in the case of PET)

Thickness: Thickness measured separately by SEM or optical microscope

The background data is then obtained when a sample is not placed in the device. The device is a closed system and this is performed every time the light source is turned on.

After that, the sample is placed on the stage in the device. The sample may have any shape, for example, a rectangular shape. The size of the sample may be 50 mm×50 mm. If there are multiple samples, all the samples must all be placed in the same orientation. For example, all the samples are preferably marked in advance so that they are placed in the same orientation. When the light-transmitting base material is present in the electroconductive film, the side of the electroconductive part of the electroconductive film is the interface with air, and the side of the light-transmitting base material is the stage side. When electroconductive parts are present on both sides of the electroconductive film, five points on each side may be measured and an arithmetic mean of eight points excluding the maximum value and the minimum value from the measured values of ten points may be calculated.

After the sample is set, the stage is rotated 360° on the XY plane in an environment at a temperature of 23° C. and a relative humidity of 50% to measure the fast axis and the slow axis. After the measurement, the slow axis is selected. The measurement is then performed while the stage tilts in the set angle range around the slow axis, and the data in the set tilt angle range and the set wavelength range (Re, Rth, slow axis angle, nx, ny, nz, Δn, Nz) are obtained every 10°. The in-plane phase difference Re is a value measured with light having an incident angle of 0° and a wavelength of 589 nm. The in-plane phase difference value Re is measured at different five points. Specifically, first, as shown in FIG. 6, two orthogonal virtual lines IL1 and IL2 passing the center B1 of the sample S2 are drawn. These virtual lines IL1 and IL2 divide the sample into four sections. Then, in each section, one point equidistant from the center B1, i.e., four points in total B2 to B4 are set, and the measurement is performed at five points in total of the center B1 and the points B2 to B4. The in-plane phase difference value Re is the arithmetic mean of the three points excluding the maximum value and the minimum value from the measured values at the five points. Even when an electroconductive part 12 or a coating layer such as a light-transmitting functional layer 13 is formed on the light-transmitting base material 11, the electroconductive part have the electroconductive fibers randomly arranged, and the coating layer is approximately optically isotropic. Therefore, the in-plane phase difference value of the electroconductive film can be regarded as the in-plane phase difference value Re of the light-transmitting base material 11.

When the light-transmitting base material 11 contains a polyester resin, the orientation angle of the light-transmitting base material 11 by stretching (in the present invention, the direction having the highest refractive index in the plane, that is, the slow axis direction is the orientation angle) is, by an absolute value, preferably 71° or more and 90° or less, or 0° or more and 19° or less. Within this range, there are certain parts which are less affected by the bowing phenomenon upon stretching. Thus, this range is optimal for improving flexibility. The light-transmitting base material 11 is a stretched film which causes easily a bowing phenomenon and is not uniform on the entire surface, resulting in some deviation. Therefore, the above range is an average value and the difference of ±5° is within an acceptable range. When the orientation angle of the light-transmitting base material 11 is measured by using the above-described RETS-100, the values are measured using + and −, depending on the clockwise or counterclockwise rotation of the sample in the in-plane (xy plane) from the initial state of the sample (0°). Therefore, an absolute value is used for the orientation angle. In addition, two types of the above-mentioned angle ranges are present because the light-transmitting base material 11 is manufactured in the form of a long roll having a width of 1000 to 3000 mm and a length of 1000 to 5000 m, for example, and is cut in any step. The cutting direction and cutting shape are various. Therefore, when a sample cut from the light-transmitting base material 11 is measured, the slow axis direction may deviate by 90° depending on the installation direction of the sample in the measuring device.

Examples of the aromatic polyetherketone resin include polyether ether ketone (PEEK).

The polyimide resin may partially contain a polyamide structure. Examples of the polyamide structure that may be contained include a polyamide-imide structure containing a tricarboxylic acid residue such as trimellitic anhydride, and a polyamide structure containing a dicarboxylic acid residue such as terephthalic acid. The concept of polyamide resin includes aromatic polyamides (aramids) as well as aliphatic polyamides. Specific examples of the polyimide resin include compounds having a structure represented by the below-mentioned chemical formula (1) or (2). In the below-mentioned chemical formulae, n represents the number of repeating units, which is an integer of 2 or more. In this regard, a compound represented by the chemical formula (1) is preferable among the compounds represented by the below-mentioned chemical formulae (1) and (2) because the former has a low phase difference and high transparency.

[Chem 1]

[Chem 2]

The thickness of the light-transmitting base material 11 can be, but is not particularly limited to, 500 μm or less, and the minimum thickness of the light-transmitting base material 11 is more preferably 3 μm or more, 5 μm or more, 10 μm or more, or 20 μm or more, in terms of handling properties and the like. The maximum thickness of the light-transmitting base material 11 is 250 μm or less, 100 μm or less, 80 μm or less, or 50 μm or less in terms of attempting to thin the film, and more preferably 35 μm or less, particularly 18 μm or less in cases where flexibility is considered to be important. The thickness is measured at randomly selected ten locations in cross-sectional images of the light-transmitting base material acquired using a transmission electron microscope (TEM), a scanning transmission electron microscope (STEM), or scanning electron microscope (SEM), and the thickness of the light-transmitting base material is determined as the average value of the thickness values at eight locations, excluding the maximum value and the minimum value from the thickness values measured at the ten locations. The light-transmitting base material generally has uneven thickness. In the present invention, since the light-transmitting base material is for optical use, the thickness unevenness preferably has a thickness average value ±2 μm or less, more preferably ±1 μm or less.

Measuring the thickness of the light-transmitting base material using a transmission electron microscope (TEM) and a scanning transmission electron microscope (STEM) can be carried out in the same manner as measuring the film thickness of the electroconductive part. However, a cross-sectional image of the light-transmitting base material is acquired at a magnification of 100 to 20,000 times. When the thickness of the light-transmitting base material is measured using a scanning electron microscope (SEM), the cross-section of the light-transmitting base material may be obtained using an ultramicrotome (product name "Ultramicrotome EM UC7"; manufactured by Leica Microsystems GmbH) or the like. As measurement samples for TEM or STEM, ultra-thin sections are produced using the ultramicrotome, at a feeding rate of 100 nm. The produced ultra-thin sections are collected on collodion-coated meshes (150 meshes) to obtain measurement samples for TEM or STEM. Upon cutting with the ultramicrotome, a sample may be subjected to a pretreatment that facilitates cutting, such as embedding the sample in a resin.

Electroconductive fibers such as silver nanowires are themselves suitable in terms of, for example, flexibility, but if a light-transmitting base material on which an electroconductive part containing electroconductive fibers is to be laminated has a large thickness or if a functional layer (except an electroconductive part) has a large thickness, the light-transmitting base material and the functional layer at the bent part generate breaks when folded, the breaks will undesirably cause the electroconductive fibers to be broken, and the light-transmitting base material and the functional layer at the bent part generate creases and microcracks in some cases. The above-mentioned breakage makes it impossible to obtain an intended resistance value and, in addition, will undesirably cause poor appearance, specifically white turbidity and poor adhesion due to cracks. Accordingly, in using the electroconductive film for flexibility applications, control of the thicknesses of the light-transmitting base material and the functional layer and adhesion between layers (adhesion by chemical binding depending on the material, or physical adhesion that does not generate cracks) are important. In particular, in cases where the light-transmitting base material 11 contains a polyester resin or polyimide resin, the likelihood of breakage depends on the thickness, and thus, it is important to control the thickness of the light-transmitting base material.

For example, the light-transmitting base material 11 preferably has a thickness of 45 μm or less in cases where the light-transmitting base material 11 contains a polyester resin. In cases where the light-transmitting base material 11 has a thickness of 45 μm or less, the light-transmitting base material 11 can be inhibited from being broken at the bent part when folded and makes it possible to inhibit white turbidity at the bent part. In this case, the maximum thickness of the light-transmitting base material 11 is preferably 35 μm or less, 29 μm or less, and particularly 18 μm or less.

In this case, the minimum thickness of the light-transmitting base material 11 is preferably 5 μm or more in terms of handling properties.

For example, in cases where the light-transmitting base material 11 contains a polyimide resin, polyamide resin, polyamide-imide resin, or a mixture thereof, the thickness of the light-transmitting base material 11 is preferably smaller in terms of inhibiting the light-transmitting base material 11 from being broken when folded, and in terms of optical characteristics and mechanical characteristics, and specifically, the thickness is preferably 75 μm or less. In this case, the maximum thickness of the light-transmitting base material 11 is preferably 70 μm or less, 50 μm or less, 35 μm or less, 29 μm or less, and particularly 20 μm or less, 18 μm or less. In this case, the minimum thickness of the light-transmitting base material 11 is preferably 5 μm or more in terms of handling properties.

The above-mentioned light-transmitting base material having a thickness of 35 μm or less, especially 5 μm or more and 20 μm or less or 18 μm or less, have better processing suitability when they have a protective film attached thereto during production, and thus, are preferable.

The light-transmitting base material 11 may have a surface treated by a physical treatment such as corona discharge treatment or oxidation treatment to improve the adhesiveness. Additionally, the light-transmitting base material 11 may have an underlayer on at least one face thereof for the purpose of improving adhesion to other layers, preventing the electroconductive film from sticking to itself when the electroconductive film is rolled, and/or inhibiting crater formation on the surface of a coating liquid applied for forming another layer. However, in cases where an electroconductive part is formed using an electroconductive fiber-containing composition containing electroconductive fibers and a dispersion medium on the surface of an underlayer, permeation of the dispersion medium into the underlayer, the extent of which varies depending on the type of the dispersion system, may involve transfer of the electroconductive fibers into the underlayer and will consequently increase the electrical resistance value undesirably, and thus, it is preferable that the electroconductive part side of the light-transmitting base material is not provided with an underlayer and that the electroconductive part is directly provided on the light-transmitting base material. In this specification, the underlayer provided on at least one face of the light-transmitting base material and attached to the light-transmitting base material will be an integral part of the light-transmitting base material and will never be a part of the light-transmitting functional layer.

The underlayer is a layer having a function that enhances adhesion to other layers, a function that prevents the electroconductive film from sticking to itself when the electroconductive film is rolled, and/or a function that inhibits crater formation on the surface of a coating liquid applied for forming another layer. Whether or not the light-transmitting base material has an underlayer is can be determined by observing a cross-section at and near the interface between the light-transmitting base material and the electroconductive part and at and near the interface between the light-transmitting base material and the light-transmitting functional layer using a scanning electron microscope (SEM), a scanning transmission electron microscope (STEM), or a transmission electron microscope (TEM) at a magnification of 1,000 to 500,000 times (preferably 25,000 to 50,000 times). The underlayer may contain particles as, for example, lubricant additives for the purpose of preventing an electroconductive film from sticking to itself when the electroconductive film is rolled; accordingly, the interface between the light-transmitting base material and the light-transmitting functional layer can be identified as an underlayer by the presence of the particles in the layer.

The underlayer preferably has a film thickness of 10 nm or more and 1 μm or less. The underlayer having a film thickness of 10 nm or more allows the underlayer to achieve its functions sufficiently, and the underlayer having a film thickness of 1 μm or less will not undesirably have any optical impact. The film thickness of the underlayer is determined as the arithmetic mean of the thickness values measured at randomly selected ten locations, wherein the thickness values are determined at the ten locations in cross-sectional images of the underlayer acquired using a scanning electron microscope (SEM), a scanning transmission electron microscope (STEM), or a transmission electron microscope (TEM) at a magnification of 1,000 to 500,000 times (preferably a magnification of 25,000 to 50,000 times). The underlayer more preferably has a minimum film thickness of 30 nm or more and a maximum film thickness of 150 nm or less. The film thickness of the underlayer can also be measured in the same manner as the film thickness of the electroconductive part 12. When a cross-sectional image is obtained by SEM, TEM, or STEM, a measurement sample is preferably created using an ultramicrotome as described above.

The underlayer contains, for example, an anchoring agent and/or a priming agent. As the anchoring agent and the priming agent, at least any of, for example, polyurethane resins, polyester resins, polyvinyl chloride resins, polyvinyl acetate resins, vinyl chloride-vinyl acetate copolymers, acrylic resins, polyvinyl alcohol resins, polyvinyl acetal resins, copolymers of ethylene and vinyl acetate or acrylic acid, copolymers of ethylene and styrene and/or butadiene, thermoplastic resins such as olefin resins and/or modified resins thereof, polymers of radiation-polymerizable compounds, polymers of thermopolymerizable compounds, and the like can be used.

The underlayer may contain particles of a lubricant or the like for the purpose of preventing the electroconductive film from sticking to itself when the electroconductive film is rolled, as described above. Examples of the particles include silica particles.

<<Light-Transmitting Functional Layer>>

The light-transmitting functional layer 13 is placed on the second side 11B of the light-transmitting base material 11. The term "light-transmitting functional layer" as used herein refers to a layer transmitting light and intended to achieve some functions in the electroconductive film. Specific examples of the light-transmitting functional layer include layers which exert functions, such as hard coat properties, refractive index modulation, and/or color modulation. The light-transmitting functional layer may have a monolayer structure or a multilayer structure composed of two or more laminated layers. In cases where the light-transmitting functional layer is a laminate composed of two or more layers, each layer may have the same or a different function. In this embodiment, the light-transmitting functional layer 13 is described as a layer having hard coat properties, namely a hard coat layer. In order to obtain flexibility, the light-transmitting functional layer may be a layer other than the hard coat layer. In that case, the pencil hardness or the cross-sectional hardness of the light-transmitting functional layer may be lower than the values described below. Even in such a case, the mechanical strength is higher than that of the light-transmitting base material alone, so the light-transmitting functional layer functions as a hard coat layer.

The light-transmitting functional layer 13 exhibits a hardness of “H” or harder in the pencil hardness test (at a load of 4.9 N) specified by JIS K5600-5-4: 1999. By having a pencil hardness of “H” or harder, the resulting electroconductive film 10 can have sufficient hardness and increase durability. The maximum pencil hardness of the surface 10A of the electroconductive film 10 is preferably around 2H to 4H in terms of the toughness of the light-transmitting functional layer and from the viewpoint of inhibiting curling.

Specifically, the light-transmitting functional layer 13 preferably has an indentation hardness ($H_{IT}$) of 100 MPa or more. When flexibility is the most important, the indentation hardness is preferably 20 MPa or more and less than 100 MPa. The minimum indentation hardness of the light-transmitting functional layer 13 may be 200 MPa or more or 300 MPa or more, and the maximum may be 800 MPa or less in terms of preventing generation of microcracks and maintaining adhesion at each interface between the light-transmitting functional layer, the light-transmitting base material, and the electroconductive part. Having the minimum and maximum such as these makes it possible to maintain the flexibility that the electroconductive part itself has by virtue of the electroconductive fibers. Additionally, the structure having the electroconductive part needs to have almost the same resistance value, physical characteristics, and optical characteristics between before and after a foldability test in order to be practically used. Additionally, the light-transmitting functional layer is effective as a layer that plays a role against scratches during processing. For these reasons, the above-mentioned value range is preferable in order to make use of the flexibility of the electroconductive fibers such as silver nanowires and at the same time, obtain such practical properties as above-mentioned. In this regard, although depending on the application, a structure in which light-transmitting functional layers are provided on both faces of the light-transmitting base material is more preferable than a structure in which a light-transmitting functional layer is provided only on one face of the light-transmitting base material.

As used herein, the “indentation hardness” refers to a value determined from a load-displacement curve drawn from the loading to unloading of an indenter. Measurement of the indentation hardness ($H_{IT}$) is carried out on a measurement sample using a “TI950 TriboIndenter” manufactured by Hysitron, Inc. in an environment at a temperature of 23±5° C. and a relative humidity of 30% or more and 70% or less. The measurement sample may be produced in the same manner as the sample produced for the cross-sectional image by the SEM, as described above. When the film thickness of the light-transmitting functional layer 13 is small, the measurement area is preferably enlarged sufficiently by a device for oblique cutting such as a Surface And Interfacial Cutting Analysis System (SAICAS). Usually, in the cross-section analysis, the face obtained when the sample is cut perpendicular to the surface (vertical cross-section) is analyzed, but when the layer thickness of each layer is small in the case of a sample of a multilayer structure and a wide analysis area is required, it is difficult to analyze selectively a specific layer. However, when the cross-section is produced by oblique cutting, a wider sample face can be exposed than the vertical cross-section. For example, if a slope of 10° is produced with respect to the horizontal plane, the sample face becomes almost 6 times wider than the vertical section. Therefore, by producing a cross-section by oblique cutting with SAICAS, even the analysis of a sample that is difficult to analyze in a vertical cross-section is possible. Then, a flat position is found in the cross-section of the obtained measurement sample, and in measurement of a displacement criterion, a Berkovich indenter (triangular pyramid, TI-0039 manufactured by Bruker Corporation) is pressed vertically on the light-transmitting functional layer 13 at this flat position with a load applied to the indenter at a speed of 10 nm/second from a displacement of 0 nm to a displacement of 100 nm in 10 seconds in such a manner that the maximum indentation displacement is 100 nm. In order to avoid the influence of the light-transmitting base material and the influence of the side edges of the light-transmitting functional layer, the Berkovich indenter is pressed inside a portion of the light-transmitting functional layer, which is 500 nm away from the interface between the light-transmitting base material and the light-transmitting functional layer toward the center of the light-transmitting functional layer, and is 500 nm or more away from the both ends of the light-transmitting functional layer toward the center of the light-transmitting functional layer. The indenter is then retained at a displacement of 100 nm for 5 seconds followed by unloading from a displacement of 100 nm to a displacement of 0 nm in 10 seconds. Then, an indentation depth h (nm) corresponding to an indentation load F(N) thus obtained is continuously measured to prepare a load-displacement curve. From the prepared load-displacement curve, an indentation hardness is determined in accordance with the below equation (5) using a value obtained by dividing the maximum indentation load $F_{max}$(N) by a contact projection area $A_p$ ($mm^2$) over which the indenter is in contact with the light-transmitting functional layer 13. The indentation hardness is the arithmetic mean of the measurement values at eight locations, excluding the maximum value and the minimum value from values obtained by measurement at ten different locations. $A_p$ is a contact projection area, for which the tip curvature of the indenter is corrected using fused quartz as a standard sample in accordance with the Oliver-Pharr method.

$$H_{IT}=F_{max}/A_p \quad (5)$$

Measurement of the elastic modulus and the like of the light-transmitting functional layer itself is conceivable to control the physical characteristics of an electroconductive film having a light-transmitting functional layer, but the light-transmitting functional layer having a three-dimensional cross-linked structure is a thin film and brittle, and thus is difficult to form into a monolayer film, making it difficult to measure the elastic modulus and the like of the light-transmitting functional layer in monolayer form. Because of this, the above-mentioned evaluation is carried out by hardness measurement in accordance with a nanoindentation method. This method makes it possible to measure the properties of a film itself without being affected by the light-transmitting base material even if the film is composed of a thin film polymer material, and additionally, the hardness of an elastic/plastic deformed substance can be analyzed from a load-displacement curve in accordance with the equation (5) as above-mentioned.

The light-transmitting functional layer 13 preferably has a film thickness of 0.2 μm or more and 15 μm or less. The light-transmitting functional layer 13 having a film thickness of 0.2 μm or more makes it possible to obtain a desired hardness, and the light-transmitting functional layer 13 having a film thickness of 15 μm or less makes it possible to attempt to make the electroconductive film 10 thinner. Additionally, the minimum film thickness of the light-transmitting functional layer 13 is more preferably 0.3 μm or more, 0.5 μm or more, or 0.7 μm or more, in terms of having the properties of a hard coat. Additionally, the maximum film thickness of the light-transmitting functional layer 13 is more preferably 12 μm or less, 10 μm or less, 7 μm or less, 5 μm or less, or 2 μm or less, in terms of attempting to make the light-transmitting functional layer 13 thinner. However, the film thickness of the light-transmitting functional layer 13 is preferably smaller than above-mentioned in cases where the light-transmitting functional layers are laminated on both faces of the light-transmitting base material. In this case, the film thickness of each light-transmitting functional layer may be 3 μm or less, 1.5 μm or less, 1 μm or less, in attempting to form a thin film and obtain favorable flexibility. In particular, when φ at a bent part is less than 2 mm, for example, when φ is 0.1 or more and less than 1 mm, the film thickness of each light-transmitting functional layer is preferably 0.8 μm or less, 0.7 μm or less, and further 0.5 μm or less. As described later, the electroconductive layer 12 preferably has a film thickness of less than 300 nm. When the electroconductive layer is laminated on the light-transmitting functional layer, the electroconductive layer may be mixed in the light-transmitting functional layer. In such a case, the interface between the functional layer and the electroconductive layer may not be discriminated. In this case, the above-mentioned preferable film thickness of the light-transmitting functional layer may be the total film thickness of the light-transmitting functional layer and the electroconductive layer.

The thickness is measured at randomly selected ten locations in cross-sectional images of the light-transmitting functional layer acquired using a transmission electron microscope (TEM), a scanning transmission electron microscope (STEM), or scanning electron microscope (SEM), and the thickness of the light-transmitting functional layer is determined as the average value of the thickness values at eight locations, excluding the maximum value and the minimum value from the thickness values measured at the ten locations. The light-transmitting functional layer generally has uneven thickness. In the present invention, since the light-transmitting functional layer is for optical use, the thickness unevenness preferably has a thickness average value ±10% or less, more preferably a thickness average value ±5% or less.

Measuring the thickness of the light-transmitting base material using a transmission electron microscope (TEM) and a scanning transmission electron microscope (STEM) can be carried out in the same manner as measuring the film thickness of the electroconductive part. However, a cross-sectional image of the light-transmitting base material is acquired at a magnification of 100 to 20,000 times. When the thickness of the light-transmitting base material is measured using a scanning electron microscope (SEM), the cross-section of the light-transmitting base material may be obtained using an ultramicrotome (product name "Ultramicrotome EM UC7"; manufactured by Leica Microsystems GmbH) or the like. As measurement samples for TEM or STEM, ultra-thin sections are produced using the ultramicrotome, at a feeding rate of 100 nm. The produced ultra-thin sections are collected on collodion-coated meshes (150 meshes) to obtain measurement samples for TEM or STEM. Upon cutting with the ultramicrotome, a measurement sample may be subjected to a pretreatment that facilitates cutting, such as embedding the measurement sample in a resin.

The light-transmitting base material 11 having a small thickness is difficult to handle in processes, for example, difficult to put through a line, apt to elude the line, and susceptible to scratches, and thus, the electroconductive film 10 preferably has the light-transmitting functional layer 13 provided on at least one face of the light-transmitting base material 11. In cases where the electroconductive film 10 is used in flexibility applications, it is important that the light-transmitting functional layer 13 is adhered to the light-transmitting base material 11 and caused to conform to the light-transmitting base material 11 when folded. To form such a light-transmitting functional layer 13 that is adhered to the light-transmitting base material 11 and can conform to the light-transmitting base material 11 when folded, it is important to balance the film thickness of the light-transmitting functional layer 13 with the thickness of the light-transmitting base material 11.

The light-transmitting functional layer 13 can be composed of at least a light-transmitting resin. The light-transmitting functional layer 13 may additionally contain inorganic particles, organic particles, and a leveling agent, in addition to a light-transmitting resin.

<Light-Transmitting Resin>

The light-transmitting resin in the light-transmitting functional layer 13 includes resins containing a polymer (a cured or cross-linked product) of a polymerizable compound. The light-transmitting resin may contain a resin which cures by solvent evaporation, in addition to a polymer of a polymerizable compound. Examples of the polymerizable compound include radiation-polymerizable compounds and/or thermopolymerizable compounds. Among these, radiation-polymerizable compounds are preferable as such polymerizable compounds in terms of a higher speed of curing and easiness of designing.

The radiation-polymerizable compound refers to a compound having at least one radiation-polymerizable functional group in one molecule. The term "radiation-polymerizable functional group" as used herein refers to a functional group which can undergo radiation-induced polymerization. Examples of the radiation-polymerizable functional groups include ethylenic unsaturated groups such as (meth)acryloyl group, vinyl group, and allyl group. Both "acryloyl group" and "methacryloyl group" are meant by the word "(meth)acryloyl group." In addition, the types of ionizing radiation applied to induce polymerization of a radiation-polymerizable compound include visible light, ultraviolet light, X ray, electron beam, α ray, β ray, and γ ray.

Examples of the radiation-polymerizable compound include radiation-polymerizable monomers, radiation-polymerizable oligomers, and radiation-polymerizable prepolymers, and these compounds can be used as appropriate. A combination of a radiation-polymerizable monomer and a radiation-polymerizable oligomer or prepolymer is preferred as the radiation-polymerizable compound.

Examples of the radiation-polymerizable monomer include monomers containing a hydroxyl group(s), such as 2-hydroxyethyl (meth)acrylate, 2-hydroxypropyl (meth)acrylate, and 2-ethylhexyl (meth)acrylate; and (meth)acrylate esters, such as ethylene glycol di(meth)acrylate, diethylene glycol di(meth)acrylate, triethylene glycol di(meth)acrylate, tetraethylene glycol di(meth)acrylate, tetramethylene glycol di(meth)acrylate, trimethylolpropane tri(meth)acrylate, trimethylolethane tri(meth)acrylate, pentaerythritol di(meth)acrylate, pentaerythritol tri(meth)acrylate, pentaerythritol tetra(meth)acrylate, dipentaerythritol tetra(meth)acrylate, dipentaerythritol hexa(meth)acrylate, and glycerol (meth)acrylate.

A polyfunctional oligomer having two or more functional groups, for example a polyfunctional oligomer having three or more radiation-polymerizable functional group (i.e., tri-functional or higher), is preferred as the radiation-polymerizable oligomer. Examples of the above-described polyfunctional oligomer include polyester (meth)acrylate, urethane (meth)acrylate, polyester-urethane (meth)acrylate, polyether (meth)acrylate, polyol (meth)acrylate, melamine (meth) acrylate, isocyanurate (meth)acrylate, and epoxy (meth) acrylate.

The radiation-polymerizable prepolymer has a weight average molecular weight of more than 10,000, preferably a weight average molecular weight of 10,000 or more and 80,000 or less, and more preferably a weight average molecular weight of 10,000 or more and 40,000 or less. In cases where the weight average molecular weight is more than 80,000, the radiation-polymerizable prepolymer has a high viscosity and thus reduces the suitability as a coating material, which may deteriorate the appearance of the resulting light-transmitting resin. Examples of the polyfunctional prepolymer include urethane (meth)acrylate, isocyanurate (meth)acrylate, polyester-urethane (meth)acrylate, and epoxy (meth)acrylate.

The thermopolymerizable compound refers to a compound having at least one thermopolymerizable functional group in one molecule. The term "thermopolymerizable functional group" as used herein refers to a functional group which can undergo heat-induced polymerization with the same type of functional group or with other types of functional groups. Examples of the thermopolymerizable functional group include hydroxyl group, carboxyl group, isocyanate group, amino group, cyclic ether group, and mercapto group.

The thermopolymerizable compound is not limited to a particular thermopolymerizable compound, and examples of the thermopolymerizable compound include epoxy compounds, polyol compounds, isocyanate compounds, melamine compounds, urea compounds, and phenol compounds.

The resin which cures by solvent evaporation refers to a resin, such as a thermoplastic resin, which forms a coat film when a solvent added to the resin for adjusting the content of solids for coating process is evaporated. In the formation of the light-transmitting functional layer 13, addition of a resin which cures by solvent evaporation can effectively prevent failure in coating on a surface where a coating liquid is applied. The resin which cures by solvent evaporation is not limited to a particular resin, and a thermoplastic resin can generally be used as the resin which cures by solvent evaporation.

Examples of the thermoplastic resin can include styrene resins, (meth)acrylic resins, vinyl acetate resins, vinyl ether resins, halogen-containing resins, alicyclic olefin resins, polycarbonate resins, polyester resins, polyamide resins, cellulose derivatives, silicone resins, and rubber or elastomer materials.

The thermoplastic resin is preferably amorphous and soluble in an organic solvent (particularly, a solvent which can generally dissolve a plurality of polymers or curable compounds). In particular, for example, styrene resins, (meth)acrylic resins, alicyclic olefin resins, polyester resins, and cellulose derivatives (such as cellulose esters) are preferred in terms of transparency and/or weather resistance.

<Inorganic Particles>

The inorganic particles are a component intended to increase the mechanical strength and pencil strength of the light-transmitting functional layer 13, and examples of the inorganic particles include inorganic oxide particles, such as silica ($SiO_2$) particles, alumina particles, titania particles, tin oxide particles, antimony-doped tin oxide (abbreviation: ATO) particles, and zinc oxide particles. Among those particles, silica particles are preferred from the viewpoint of further increasing the hardness. Examples of the silica particles include spherical silica particles and deformed silica particles; among those silica particles, deformed silica particles are preferred. In this specification, the "spherical particle" refers to, for example, a spherical or ellipsoidal particle, while "deformed particle" refers to a particle with a randomly rough surface as observed on the surface of potato tubers. The surface area of the above-described deformed particle is larger than that of a spherical particle, and the presence of such deformed particles thus increases the contact area with, for example, the above-described polymerizable compound and successfully improves the pencil hardness of the light-transmitting functional layer 13 to a higher level. Observation of a cross-section of the light-transmitting functional layer 13 with a transmission electron microscope (TEM) or a scanning transmission electron microscope (STEM) can confirm whether the silica particles contained in the light-transmitting functional layer 13 are deformed silica particles or not. In cases where spherical silica particles are used, spherical silica particles with smaller particle diameters lead to higher hardness in the light-transmitting functional layer. On the other hand, deformed silica particles can achieve a hardness equivalent to that of commercially available spherical silica particles with the smallest particle diameter even if those deformed silica particles are not as small as those spherical silica particles.

The average particle diameter of the deformed silica particles is preferably 1 nm or more and 100 nm or less. Even if deformed silica particles have an average particle diameter within the above-described range, the deformed silica particles can achieve a hardness equivalent to that of spherical silica particles with an average particle diameter of 1 nm or more and 45 nm or less. The average particle size of deformed silica particles is determined as the arithmetic mean of the particle diameters of 18 particles, excluding the maximum value and the minimum value from the particle diameters of 20 particles, wherein the maximum (major axis) and the minimum (minor axis) values of the distance between two points on the circumference of each particle is measured on a cross-sectional image of a light-transmitting functional layer acquired using a transmission electron microscope (TEM) or a scanning transmission electron microscope (STEM) to obtain each particle diameter. Additionally, the average particle diameter of spherical silica particles is determined as the arithmetic mean of the particle diameters of 20 particles, wherein the particle diameters of 20 particles are measured on cross-sectional images of particles acquired using a transmission electron microscope (TEM) or a scanning transmission electron microscope (STEM) at a magnification of 10,000 to 100,000 times. When cross-sections are imaged using a scanning transmission electron microscope (STEM) (for example, product name "S-4800 (Type 2)"; manufactured by Hitachi High-Technologies Corporation), the cross-sections are observed by setting the detector switch (signal selection) to "TE," the accelerating voltage to "30 kV," and the emission current to "10 μA." As other imaging conditions for acquiring images of cross-sections by STEM, the below-described conditions can be referenced. Additionally, the average particle diameter can be determined by binarizing and calculating the image data as described below.

The content of inorganic particles in the light-transmitting functional layer 13 is preferably 20% by mass or more and 70% by mass or less. In cases where the content of inorganic particles is less than 20% by mass, a sufficient hardness can be obtained; additionally, in cases where the content of inorganic particles is 70% by mass or less, the filling ratio is not increased excessively, affording favorable adhesion between the inorganic particles and the resin component, and thus, the hardness of the light-transmitting functional layer is not decreased.

As the inorganic particles, inorganic particles having photopolymerizable functional groups on the surface (reactive inorganic particles) are preferably used. Such inorganic particles having photopolymerizable functional groups on the surface can be produced by surface treatment of inorganic particles with, for example, a silane coupling agent. Examples of the method of treating the surface of inorganic particles with a silane coupling agent include a dry method in which the silane coupling agent is sprayed over the inorganic particles, and a wet method in which the inorganic particles are dispersed in a solvent and the silane coupling agent is then added to the solvent and allowed to react with the inorganic particles.

<Organic Particles>

The organic particles are also a component intended to increase the mechanical strength and pencil strength of the light-transmitting functional layer 13, and examples of the organic particles include plastic beads. Specific examples of the plastic beads include polystyrene beads, melamine resin beads, acrylic beads, acrylic-styrene beads, silicone beads, benzoguanamine beads, benzoguanamine-formaldehyde condensation beads, polycarbonate beads, and polyethylene beads.

The light-transmitting functional layer 13 can be formed using a light-transmitting functional layer composition containing a polymerizable compound or the like. Such a light-transmitting functional layer composition contains the above-mentioned polymerizable compound and the like, and may additionally contain a solvent and a polymerization initiator, if necessary. Furthermore, the light-transmitting functional layer composition may be supplemented with, for example, a conventionally known dispersing agent, surfactant, silane coupling agent, thickener, coloring inhibitor, coloring agent (pigment and dye), antifoam agent, flame retardant, ultraviolet absorber, adhesion promoter, polymerization inhibitor, antioxidant, surface modifier, and/or lubricant in accordance with various purposes of, for example, increasing hardness, reducing cure shrinkage, and/or controlling refractive index in the resin layer.

<Solvent>

Examples of the solvent include alcohols (such as methanol, ethanol, propanol, isopropanol, n-butanol, s-butanol, t-butanol, benzyl alcohol, PGME, and ethylene glycol), ketones (such as acetone, methyl ethyl ketone (MEK), cyclohexanone, methyl isobutyl ketone, diacetone alcohol, cycloheptanone, and diethyl ketone), ethers (such as 1,4-dioxane, dioxolane, diisopropyl ether dioxane, and tetrahydrofuran), aliphatic hydrocarbons (such as hexane), alicyclic hydrocarbons (such as cyclohexane), aromatic hydrocarbons (such as toluene and xylene), halocarbons (such as dichloromethane and dichloroethane), esters (such as methyl formate, methyl acetate, ethyl acetate, propyl acetate, butyl acetate, and ethyl lactate), cellosolves (such as methyl cellosolve, ethyl cellosolve, and butyl cellosolve), cellosolve acetates, sulfoxides (such as dimethyl sulfoxide), amides (such as dimethylformamide and dimethylacetamide), and combinations thereof.

<Polymerization Initiator>

The polymerization initiator is a component that generates radicals or ionic species upon degradation induced by exposure to light or heat and initiates or promotes the polymerization (cross-linking) of a polymerizable compound. Examples of a polymerization initiator used in the resin layer composition include photopolymerization initiators (for example, photo-radical polymerization initiators, photo-cationic polymerization initiators, photo-anionic polymerization initiators), thermal polymerization initiators (for example, thermal radical polymerization initiators, thermal cationic polymerization initiators, thermal anionic polymerization initiators), and combinations thereof.

As described above, in cases where the electroconductive film 10 is used in flexibility applications, it is important that the light-transmitting functional layer 13 is adhered to the light-transmitting base material 11 and caused to conform to the light-transmitting base material 11 when folded. To form such a light-transmitting functional layer 13 that is adhered to the light-transmitting base material 11 and can conform to the light-transmitting base material 11 when folded, it is preferable to use an oxime ester compound as a polymerization initiator. Examples of commercially available products of oxime ester compounds include IRGACURE (registered trademark) OXE01, IRGACURE (registered trademark) OXE02, and IRGACURE (registered trademark) OXE03 (which are all manufactured by BASF Japan Ltd.).

The content of a polymerization initiator in the light-transmitting functional layer composition is preferably 0.5 parts by mass or more and 10.0 parts by mass or less with respect to 100 parts by mass of the polymerizable compound. By limiting the content of the polymerization initiator to a value within the above range, hard coat properties can be well maintained and cure inhibition can be inhibited.

<<Electroconductive Part>>

The electroconductive part 12 includes at least a light-transmitting resin 14 and a plurality of electroconductive fibers 15 incorporated in the light-transmitting resin 14, as shown in FIG. 2. In addition, the electroconductive part 12 further includes one or more different fibers which are placed in the light-transmitting resin 14 and which are distinct from the electroconductive fibers 15. However, the electroconductive part may not contain any different fiber. In FIG. 2, the different fibers are the fibers with a dark-colored surface 16, which exhibit a darker color than the electroconductive fibers 15 at at least a part of the surface. The electroconductive part 12 preferably further includes a reaction inhibitor which is contained in the light-transmitting resin 14. The term "electroconductive part" as used herein refers to a layer containing electroconductive fibers, which are found by observing a cross-section of the electroconductive film with a scanning transmission electron microscope (STEM) or a transmission electron microscope (TEM). If the boundary of the electroconductive part is hard to be observed, the surface of the electroconductive part should undergo any pretreatment process commonly used for electron microscopy, such as formation of a metal layer of Pt—Pd, Au, or the like by sputtering. Additionally, the whole electroconductive film may be embedded in a resin and then stained with osmium tetraoxide, ruthenium tetraoxide, phosphotungstic acid, or the like because such staining enables easier observation of the interface between organic layers. The term "electroconductive fiber" as used herein refers to a fiber having electrical conductivity and a length much longer than the thickness (for example, the diameter); for example, the electroconductive fiber will include a fiber having electrical conductivity and a length that is approximately equal to or more than 5 times as long as the thickness. Additionally, the term "electroconductive part" refers to a part including a light-transmitting resin and a plurality of electroconductive fibers incorporated in the light-transmitting resin and being capable of conducting electricity from the surface, and the concept includes both layered and non-layered structures.

The electroconductive part 12 can conduct electricity from the surface 12A of the electroconductive part 12. Measurement of the surface resistance value of an electroconductive part can determine whether or not the electroconductive part can conduct electricity from the surface of the electroconductive part. In cases where the arithmetic mean of the surface resistance values of an electroconductive part is less than $1\times10^{6}\Omega/\square$, the electroconductive part can be determined to conduct electricity from the surface. The method of measuring the surface resistance value of an electroconductive part will be described hereinafter and the description of the method is omitted here.

The electroconductive part 12 preferably has a surface resistance value of 200Ω/□ or less. In cases where the electroconductive part 12 has a surface resistance value of 200Ω/□ or less, particularly problems such as slow response speed can be inhibited especially in touch panel applications. The surface resistance value of the electroconductive part 12 is a surface resistance value measured on the surface 12A of the electroconductive part 12. The surface resistance value can be measured in an environment at a temperature of 23±5° C. and a relative humidity of 30% or more and 70% or less using either a contact-type resistivity meter (product name "Loresta-AX MCP-T370"; manufactured by Mitsubishi Chemical Analytech Co., Ltd., Type of sensor: ASP-probe) according to JIS K7194: 1994 (Testing method for resistivity of conductive plastics with a four-point probe array) or a non-destructive (based on the eddy current method) resistivity meter (product name "EC-80P"; manufactured by Napson Corporation; URL: https://www.napson.co.jp/wp/wp-content/uploads/2016/08/Napson_EC80P_Jeaflet_160614.pdf), and preferably measured using a non-destructive resistivity meter, which can accurately measure the surface resistance value independently of the film thickness of an electroconductive part. The non-destructive resistivity meter can start measurement at an arbitrary position on a sample by simple contact of a probe with the sample and without damaging the sample. From this point, it may be referred to as non-contact-type resistivity meter. The surface resistance value of an electroconductive part is measured with a non-destructive resistivity meter by placing a cut piece of the electroconductive film having a size of 80 mm×50 mm on a flat glass plate and bringing a probe into contact with the electroconductive part facing upward. For the measurement of surface resistance value with the EC-80P, the type SW2 is selected for the measurement in the mode M-H sheet resistance (Ω/□) measurement. Additionally, a probe can be easily switched with another type of probe depending on the range of measurement, and probes for the measurement ranges from 10 to 1000Ω/□ and from 0.5 to 10Ω/□ are used in the present embodiment. A resistivity meter EC-80P-PN (manufactured by Napson Corporation) can be used instead of a resistivity meter EC-80P to perform the measurement in the same manner, and P-type conduction may be selected from P-type and N-type conductions for the measurement using this instrument. Additionally, the surface resistance value of an electroconductive part is measured with a contact-type resistivity meter by placing a cut piece of the electroconductive film having a size of 80 mm×50 mm on a flat glass plate and then placing an ASP-probe on the center of the electroconductive part facing upward and evenly pressing all the electrode pins on the electroconductive part. For the measurement of surface resistance value with the contact-type resistivity meter, the mode "Ω/□" as a sheet resistance measurement mode is selected. Once the start button is pushed and the instrument is held, the result of the measurement will be displayed. The measurement of surface resistance value is carried out in an environment at a temperature of 23° C. and a relative humidity of 55% independently of the type of a resistivity meter. Additionally, although an electroconductive film to be measured for surface resistance value is placed on a horizontal benchtop, independently of the type of a resistivity meter, to perform the measurement on a flat and even surface, a curled electroconductive film that is unable to keep the surface evenly flat is fixed with tape or the like on a glass plate to perform the measurement. Three measurement locations are in the central part of the electroconductive film and the arithmetic mean of the surface resistance values at the three locations is determined as the surface resistance value. In this respect, the number of measurement location is 1, 5, or 9 totally according to JIS K7194: 1994. However, once the electroconductive film is actually cut into a size of 80 mm×50 mm and measured as shown in FIG. 5 in JIS K7194: 1994, the electroconductive film may give variable measurement values. Thus, the measurement should be performed on three to five locations in the central part of the electroconductive part, differing from JIS K7194: 1994. For example, the surface resistance value is measured at the position 1, at a position located between the positions 1 and 7 (preferably, a position close to the position 1), and at a position located between the positions 1 and 9 (preferably, a position close to the position 1) shown in FIG. 5 in JIS K7194: 1994. The preference of a position near the center of a sample for the measurement of surface resistance value is also reported in Daichi Isaka and a coworker, "Resistivity measurements for conducting thin films by four-point probe method electroconductive," The Tokyo branch Students' Conference, the Institute of Electronics, Information, and Communication Engineers, 2009 (URL: https://www.ieice.org/tokyo/gakusei/kenkyuu/14/pdf/120.pdf). Measurement is preferably carried out at five locations, and the surface resistance value is the arithmetic mean of the measurement values at three locations, excluding the maximum value and the minimum value from the five locations. The minimum surface resistance value of the electroconductive film 10 is more preferably 1Ω/□ or more, 5Ω/□ or more, or 10Ω/□ or more, and the maximum surface resistance value of the electroconductive film 10 is more preferably 100Ω/□ or less, 90Ω/□ or less, 70Ω/□ or less, 60Ω/□ or less, or 50Ω/□ or less. Particularly, in the applications as a transparent electroconductive film or as a small sensor of 10 inches or less, the surface resistance value is preferably 90Ω/□ or less. The surface resistance value is preferably 40Ω/□ or less in the case of a large panel of 20 inches or more, particularly in the case of a touch panel sensor, and more preferably 60Ω/□ or less in the case of a medium or small panel of 1 inch or more and less than 20 inches, particularly in the case of a touch panel sensor.

When the surface resistance value of an electroconductive part of a manufactured product is measured, it can be considered that the electroconductive performance is uniform in any part, and that the surface resistance value is the same at the central part and the terminal part of the product. Therefore, the measurement location of the surface resistance value is not limited to the central part of the manufactured product, but may be a terminal part. In cases where the surface resistance value of the electroconductive part 12 of a manufactured product is measured, the following pretreatment may be appropriately performed. The pretreatment method is not limited to the following method as long as the pretreated product becomes available for the measurement, and it is critical to avoid any influence on electroconductive fibers. That is, in cases where an electroconductive part is already clearly visible and the thickness of an adhesive layer can be presumed to be very thin, measurement can be performed without any further treatment and there is no need to peel off the electroconductive part entirely by force. However, the manufactured product is preferably pretreated to reduce the thickness as thin as possible. For example, in cases where an electroconductive film is used as a touch panel sensor, a cover film or glass is layered on the electroconductive film through an adhesive layer. Thus, a cutter blade is first inserted into the adhesive layer from the edge to rift the cover film or glass. When the cover film or glass is not easily removed, the electroconductive film proceeds to the next step without removing the cover film or glass by force. Next, the electroconductive film is immersed in and withdrawn from warm water at 40° C. for 10 seconds three times. Then, detachment of the adhesive layer is checked with a cutter or the like, and in some cases the electroconductive film is immersed in and withdrawn from warm water at 40° C. for 10 seconds further three times. Subsequently, the adhesive layer is slowly peeled off with a tool which will never damage the electroconductive part (a thin and flat tool without a blade). The adhesive layer need not be removed entirely as long as the adhesive layer at measurement locations is removed. The present pretreatment can also be used for measuring anything other than the surface resistance value.

The surface resistance value can also be converted from the below-mentioned line resistance value in accordance with the below-mentioned equation (6). In the below-mentioned equation (6), $R_S$ is a surface resistance value (Ω/□), $R_L$ is a line resistance value (Ω), $W_L$ is a line width in measurement of a line resistance value, and $L_L$ is a length in measurement of a line resistance value. A surface resistance value obtained by actual measurement and a surface resistance value converted from a line resistance value in accordance with the following equation are substantially the same.

$$R_S=R_L\times W_L/L_L \quad (6)$$

The electroconductive part 12 preferably has a line resistance value of 2000Ω or less. In cases where the electroconductive part 12 has a line resistance value of 2000Ω or less, problems such as slow response speed can be inhibited especially in touch panel applications. The line resistance value of the electroconductive part 12 can be measured in an environment at a temperature of 23±5° C. and a relative humidity of 30% or more and 70% or less, by bringing the probe terminals of a tester (product name "Digital MO Hitester 3454-11" manufactured by Hioki E.E. Corporation) into contact with both ends of a sample in the longitudinal direction, wherein the sample is cut from the electroconductive film to have a rectangular shape 5 mm×100 mm. Specifically, the Digital MO Hitester 3454-11 includes two probe terminals (a red probe terminal and a black probe terminal, which are both pin-type terminals); the red probe terminal is brought into contact with one end of the electroconductive part; the black probe terminal is brought into contact with the other end of the electroconductive part; and thus, the line resistance value of the electroconductive part is measured. The minimum line resistance value of the electroconductive part 12 is more preferably 20Ω or more, 100Ω or more, or 200Ω or more, and the maximum line resistance value of the electroconductive part 12 is more preferably 2000Ω or less, 1400Ω or less, or 1000Ω or less.

The electroconductive part 12 preferably has a film thickness of less than 300 nm. In cases where the electroconductive part 12 has a film thickness of less than 300 nm, the film thickness of the light-transmitting resin 14 is accordingly thin and the covering of all the electroconductive fibers with the light-transmitting resin can be inhibited, so that electricity is surely conducted from the surface of the electroconductive part. The thicker the film thickness of the electroconductive part is, the more frequently the electroconductive fibers overlap with each other and a low surface resistance value of 1Ω/□ or more and 10Ω/□ or less can be achieved. However, excessive overlap of the electroconductive fibers may result in difficulty in maintenance of a low haze value. Thus, the film thickness is preferably 300 nm or less. The electroconductive part is preferably a thin film in terms of optical characteristics and from the viewpoint of thinning the electroconductive film, as long as it can maintain a low surface resistance value. The maximum film thickness of the electroconductive part 12 is more preferably 200 nm or less, 145 nm, 140 nm or less, 120 nm or less, 110 nm or less, 80 nm or less, or 50 nm or less, in terms of attempting to thin the film and obtaining favorable optical characteristics such as a low haze value. Additionally, the minimum film thickness of the electroconductive part 12 is preferably 10 nm or more. In cases where the electroconductive part has a film thickness of less than 10 nm, the film thickness of the light-transmitting resin 14 is accordingly too thin, so that it is likely that some electroconductive fibers are removed from the electroconductive part, or the durability of the electroconductive part is reduced, or the abrasion resistance is reduced. Additionally, each electroconductive fiber preferably has a relatively large average fiber diameter to control the instabilities, such as higher tendency for breakage. The average fiber diameter that allows each electroconductive fiber to keep stably its form is considered to be 7 nm or more, 10 nm or more, or 15 nm or more. On the other hand, the minimum film thickness of the electroconductive part 12 is more preferably 20 nm or more or 30 nm or more because two or more electroconductive fibers are desired to overlap with and contact with each other to obtain stable electrical conductivity. In this regard, the electroconductive part 12 having a film thickness of less than 300 nm affords a stable resistance value in terms of obtaining flexibility in cases where the above-mentioned gap φ is rather large and where the number of times of repeating the folding and unfolding process is about one hundred thousand. In cases where the above-mentioned gap φ is small and where the number of times of repeating the folding and unfolding process is larger than one hundred thousand, the electroconductive part 12 preferably has a smaller film thickness, for example, preferably 200 nm or less, 145 nm or less, or even 120 nm or less.

The film thickness of the electroconductive part 12 is determined as the arithmetic mean of the thickness values measured at eight locations, excluding the maximum value and the minimum value from the thickness values measured at randomly selected ten locations, wherein the thickness values are determined at the ten locations in cross-sectional images of the electroconductive parts acquired using a scanning transmission electron microscope (STEM) or a transmission electron microscope (TEM). A specific method of acquiring cross-sectional images will be described below. First, samples for observing a cross-section are produced from an electroconductive film by the same method as described above. If these samples conduct no electricity, images observed by STEM will appear blurry. Thus, the samples are preferably sputtered with Pt—Pd for about 20 seconds. The sputtering time can be appropriately adjusted but needs careful attention; a period of 10 seconds is too short, and a period of 100 seconds is so long that the metal used for sputtering is observed as particulate foreign bodies. Then, a cross-sectional image of a STEM sample is acquired using a scanning transmission electron microscope (STEM) (for example, product name "S-4800 (Type 2)"; manufactured by Hitachi High-Technologies Corporation). The cross-section is observed and imaged under STEM by setting the detector switch (signal selection) to "TE," the accelerating voltage to "30 kV," and the emission current to "10 μA." The focus, contrast, and brightness are appropriately adjusted at a magnification of 5,000 to 200,000 times so that each layer can be identified. The magnification is preferably in the range from 10,000 to 100,000 times, more preferably in the range from 10,000 to 50,000 times, and most preferably in the range from 25,000 to 50,000 times. The cross-section may be imaged by additionally setting the beam monitor to 3 and the objective lens aperture to 3, and also setting the WD to 8 mm. For the measurement of the film thickness of the electroconductive part, it is important that the contrast at the interface between the electroconductive part and another layer (such as the light-transmitting base material or the embedding resin) can be observed as clearly as possible upon observation of a cross-section. If the interface is hard to be observed due to a lack of contrast, the surface of the electroconductive part may undergo any pretreatment process commonly used for electron microscopy, such as formation of a metal layer of Pt—Pd, Pt, Au, or the like by sputtering. Additionally, the sample may be stained with osmium tetraoxide, ruthenium tetraoxide, phosphotungstic acid, or the like because such staining enables easier observation of the interface between organic layers. Furthermore, the contrast of the interface may be hard to be observed at a higher magnification. In that case, the sample is also observed at a lower magnification at the same time. For example, a pair of magnifications consisting of a higher magnification and a lower magnification, such as 25,000 and 50,000 times or 50,000 and 100,000 times, is used for observation to obtain the above-mentioned arithmetic means at both the magnifications, and the further averaged value is determined as the film thickness of the electroconductive part.

<Light-Transmitting Resin>

The light-transmitting resin 14 covers electroconductive fibers 15 to prevent removal of the electroconductive fibers 15 from the electroconductive part 12 and to improve the durability or abrasion resistance of the electroconductive part 12, and covers electroconductive fibers 15 to such an extent that the electroconductive part 12 can conduct electricity from the surface 12A. Specifically, the light-transmitting resin 14 preferably covers electroconductive fibers 15 in a manner that will leave some of the electroconductive fibers 15 exposed on the surface 12A of the electroconductive part 12, because it is likely that the electroconductive part can conduct no electricity from the surface, as described above, when some electroconductive fibers are not exposed on the surface of the electroconductive part. For example, the film thickness of the light-transmitting resin 14 may be adjusted to cover electroconductive fibers 15 with the light-transmitting resin 14 in a manner that will leave some of the electroconductive fibers 15 exposed on the surface 12A of the electroconductive part 12. That is, in cases where the film thickness of the light-transmitting resin is too thick, all the electroconductive fibers are covered with the light-transmitting resin, so that it is likely that none of the electroconductive fibers are exposed on the surface of the electroconductive part and no electricity is conducted from the surface of the electroconductive part. In cases where the thickness of the light-transmitting resin is too thin, it is likely that some electroconductive fibers are removed from the electroconductive part, or the durability of the electroconductive part is reduced, or the abrasion resistance is reduced. Because of this, the thickness of the light-transmitting resin needs to be adjusted to a suitable one.

Considering the above, the light-transmitting resin 14 preferably has a film thickness of less than 300 nm. The film thickness of the light-transmitting resin 14 can be measured by the same measurement method as for the film thickness of the electroconductive part 12. The maximum film thickness of the light-transmitting resin 14 is more preferably 200 nm or less, 145 nm or less, 140 nm or less, 120 nmnm, 110 nm or less, 80 nm or less, or 50 nm or less. Additionally, the minimum film thickness of the light-transmitting resin 14 is preferably 10 nm or more.

The light-transmitting resin 14 is not limited to a particular light-transmitting resin as long as it is a light-transmitting resin, and examples of the light-transmitting resin include polymers of polymerizable compounds and thermoplastic resins. Polymerizable compounds similar to those described for the light-transmitting functional layer 13 are included as examples of the polymerizable compound, and further description is thus omitted here.

<Electroconductive Fibers>

The electroconductive fibers 15 are preferably present in plural numbers in the electroconductive part 12. The electroconductive fibers 15 contact with each other in the thickness direction of the electroconductive part 12, as indicated by the ability of the electroconductive part 12 to conduct electricity from the surface 12A.

In the electroconductive part 12, the electroconductive fibers 15 preferably contact with each other to form a network structure (meshwork) in the surface direction (two-dimensional direction) of the electroconductive part 12. Formation of the electroconductive fibers 15 into a network structure enables a conductive path to be formed.

Some of the electroconductive fibers 15 are preferably exposed on the surface 12A of the electroconductive part 12. The phrase "some of the electroconductive fibers are exposed on the surface of the electroconductive part" as used herein should refer to exposure of some electroconductive fibers on the surface of the electroconductive part in such an extent that the electroconductive fibers are fixed to the electroconductive part, including electroconductive fibers protruded from the surface of the electroconductive part. In cases where some electroconductive fibers are not exposed on the surface of the electroconductive part, the electroconductive part may conduct no electricity from the surface. Once electrical conduction from the surface 12A of the electroconductive part 12 is identified by the above-described measurement method, some of the electroconductive fibers 15 can thus be determined to be exposed on the surface 12A of the electroconductive part 12.

The electroconductive fibers 15 preferably have an average fiber diameter of 30 nm or less. The electroconductive fibers having an average fiber diameter of 30 nm or less makes it possible to inhibit the electroconductive film from having a higher haze value and to have a sufficient light transmittance. The minimum average fiber diameter of the electroconductive fibers 15 is more preferably 5 nm or more, 7 nm or more, or 10 nm or more in terms of the electrical conductivity of the electroconductive part 12. The maximum average fiber diameter of the electroconductive fibers 15 is more preferably 28 nm or less, 25 nm or less or 20 nm or less. In order to achieve the milkiness within the preferable range, the electroconductive fibers 15 more preferably have a fiber diameter in the range of 7 nm or more and 25 nm or less.

The average fiber diameter of the electroconductive fibers 15 will be obtained as the arithmetic mean of the fiber diameters of 100 electroconductive fibers in 50 images acquired at a magnification of 100,000 to 200,000 times, for example, using a transmission electron microscope (TEM) (for example, product name "H-7650"; manufactured by Hitachi High-Technologies Corporation), which are measured on the acquired images by a software program accessory to the TEM. The fiber diameters are measured using the above-mentioned H-7650 by setting the accelerating voltage to "100 kV," the emission current to "10 μA," the condenser lens aperture to "1," the objective lens aperture to "0," the observation mode to "HC," and the Spot to "2." Additionally, the fiber diameters of the electroconductive fibers can also be measured by a scanning transmission electron microscope (STEM) (for example, product name "S-4800 (Type 2)"; manufactured by Hitachi High-Technologies Corporation). In that case, the average fiber diameter of the electroconductive fibers will be obtained as the arithmetic mean of the fiber diameters of 100 electroconductive fibers in 50 images acquired at a magnification of 100,000 to 200,000 times using the STEM, which are measured on the acquired images by a software program accessory to the STEM. The fiber diameters are measured using the above-mentioned S-4800 (Type 2) by setting the signal selection to "TE," the accelerating voltage to "30 kV," the emission current to "10 μA," the probe current to "Norm," the focus mode to "UHR," the condenser lens 1 to "5.0," the WD to "8 mm," and the Tilt to "0°."

When the fiber diameter of the electroconductive fibers 15 is determined, a measurement sample produced by the following method is used. In this respect, TEM measurement is carried out at high magnifications and it is consequently critical to reduce the concentration of the dispersion of electroconductive fibers as much as possible for the purpose of preventing overlap of the electroconductive fibers as much as possible. Specifically, the dispersion of electroconductive fibers is preferably diluted with water or alcohol depending on the dispersion medium to reduce the concentration of electroconductive fibers to 0.05% by mass or less or to reduce the content of solids to 0.2% by mass or less. Furthermore, a drop of the diluted dispersion of electroconductive fibers is applied on a carbon-coated grid mesh for TEM or STEM observation, dried at room temperature, and then observed under the above-mentioned conditions, and the resulting observation image data is used to calculate the arithmetic mean. As the carbon-coated grid mesh, a Cu grid with the model "#10-1012, Elastic Carbon Film ELS-C10 in the STEM Cu100P grid specification" is preferred, and any grid having better resistance against electron beam exposure and a higher electron beam transmittance than a plastic substrate, and thus being suitable for observation at a high magnification, and having better resistance against organic solvents is also preferred. Additionally, a drop of the diluted dispersion of electroconductive fibers could be applied on a grid mesh placed on a slide glass because the grid mesh is so small that it is difficult to apply the drop of the diluted dispersion of electroconductive fibers on a plain grid mesh.

The above-described fiber diameter can be obtained by image-based measurement or may be calculated from the binarized image data. In the case of actual measurement, images may be printed or enlarged as appropriate. In that case, each electroconductive fiber is visualized in darker black than other components. A starting point and an end point are selected on the outer counter of each fiber and the distance between the starting point and the ending point is measured. The concentration of electroconductive fibers will be obtained based on the ratio of the mass of the electroconductive fibers to the total mass of the dispersion of electroconductive fibers, while the content of solids will be obtained based on the ratio of the mass of all components except for the dispersion medium (including the electroconductive fibers, the resin component, and other additives) to the total mass of the dispersion of electroconductive fibers. The fiber diameter determined using an electroconductive fiber-containing composition and the fiber diameter determined by actual measurement using a photograph are substantially the same values.

The electroconductive fibers 15 preferably have an average fiber length of 15 μm or more and 20 μm or less in order to achieve the milkiness within the preferable range. In cases where the electroconductive fibers 15 have an average fiber length of 15 μm or more, an electroconductive layer having sufficient electroconductive performance can be formed, and the influence of the aggregation to the milkiness, a higher haze value and a lower light transmittance are avoided. In cases where the electroconductive fibers 15 have an average fiber length of 20 μm or less, the coating can be performed without clogging the filter. The minimum average fiber length of the electroconductive fibers 15 may be 5 μm or more, 7 μm or more, or 10 μm or more, while the maximum average fiber length electroconductive fibers 15 may be 40 μm or less, 35 μm or less, or 30 μm or less.

The average fiber length of the electroconductive fibers 15 will be obtained as the arithmetic mean of the fiber lengths of 98 electroconductive fibers, excluding the maximum value and the minimum value from the fiber lengths of 100 electroconductive fibers in 10 images acquired at a magnification of 500 to 20,000,000 times, for example, using a scanning electron microscope (SEM) (for example, product name "S-4800 (Type 2)"; manufactured by Hitachi High-Technologies Corporation) on the SEM mode, which are measured on the acquired images by an accessory software program. The fiber lengths are measured using the above-mentioned S-4800 (Type 2) together with a 45° pre-tilted sample stub by setting the signal selection to "SE," the accelerating voltage to "3 kV," the emission current to "10 μA to 20 μA," the SE detector to "Mixed," the probe current to "Norm," the focus mode to "UHR," the condenser lens 1 to "5.0," the WD to "8 mm," and the Tilt to "30°." Because no TE detector is used for SEM observation, it is essential to remove the TE detector before SEM observation. Although either the STEM mode or the SEM mode can be selected as an operation mode of the above-described S-4800, the SEM mode will be used for the measurement of the above-described fiber length.

When the fiber length of the electroconductive fibers 15 is determined, a measurement sample produced by the following method is used. First, a dispersion of electroconductive fibers is applied on an untreated surface of a polyethylene terephthalate (PET) film in B5 size having a thickness of 50 μm at an application dose of electroconductive fibers of 10 mg/m$^2$ and dried to evaporate the dispersion medium, to place electroconductive fibers on the surface of the PET film, and an electroconductive film is thereby produced. A piece having a size of 10 mm×10 mm is cut from the central part of the electroconductive film. Then, the cut electroconductive film is attached flat against the tilted surface of a 45° pre-tilted SEM sample stub (model number "728-45"; manufactured by Nissin EM Co., Ltd.; 45° pre-tilted sample stub; 15 mm diameter×10 mm height; made of M4 aluminum) using a silver paste. Furthermore, the cut electroconductive film is sputtered with Pt—Pd for 20 to 30 seconds to obtain electrical conductivity. Because an image of the sample without a suitable sputtered film may not be clearly visible, the sputtering process is appropriately modified in that case.

The above-described fiber length can be obtained by image-based measurement or may be calculated from the binarized image data. In the case of image-based measurement, the measurement will be performed by the same method as described above. The fiber length determined using an electroconductive fiber-containing composition and the fiber length determined by actual measurement using a photograph are substantially the same values.

The electroconductive fibers 15 are preferably at least one type of fibers selected from the group consisting of electroconductive carbon fibers, metallic fibers such as metallic nanowires, metal-coated organic fibers, metal-coated inorganic fibers, and carbon nanotubes.

Examples of the above-mentioned electroconductive carbon fiber include vapor grown carbon fiber (VGCF), carbon nanotube, wire cup, and wire wall. These electroconductive carbon fibers may be used individually or in combination of two or more.

Preferable examples of the above-mentioned metallic fibers include stainless steel, Ag, Cu, Au, Al, Rh, Ir, Co, Zn, Ni, In, Fe, Pd, Pt, Sn, Ti, and metallic nanowires composed of these alloys, and among the metallic nanowires, silver nanowires are preferable in terms of being capable to achieve a low resistance value, more unlikely to be oxidized, and suitable for wet type coating. As the above-mentioned metallic fibers, fibers produced by, for example, a wire drawing process or coil shaving process that forms a thin and long wire of the above-mentioned metal can be used. Such metallic fibers may be used individually or in combination of two or more.

In cases where silver nanowires are used as metallic fibers, such silver nanowires can be synthesized by liquid phase reduction of a silver salt (for example, silver nitrate) in the presence of a polyol (for example, ethylene glycol) and poly(vinylpyrrolidone). High-volume production of silver nanowires having a uniform size can be achieved, for example, by a method described in Xia, Y. et al., Chem. Mater. (2002), 14, 4736-4745 and Xia, Y. et al., Nanoletters (2003) 3(7), 955-960.

A means of producing metallic nanowires is not limited to any particular one, and a known means, for example, a liquid phase method or a gas phase method, can be used. Additionally, a specific production method is not limited to any particular one, and a known production method can be used. For example, for a method of producing silver nanowires, Adv. Mater., 2002, 14, 833 to 837; Chem. Mater., 2002, 14, 4736 to 4745 and the like can be consulted; for a method of producing gold nanowires, JP2006-233252A and the like can be consulted; for a method of producing Cu nanowires, JP2002-266007A and the like can be consulted; and for a method of producing cobalt nanowires, JP2004-149871A and the like can be consulted.

Examples of the above-described metal-coated synthetic fibers include acrylic fibers coated with a metal such as gold, silver, aluminum, nickel, or titanium. Such metal-coated synthetic fibers may be used individually or in combination of two or more.

<Different Fibers>

A different fiber is a fiber of a different type from the electroconductive fiber 15. The presence or absence of the different fibers in the electroconductive part 12 can be determined as follows: the different fibers are observed at a magnification of 50,000 times using a scanning electron microscope (SEM) (for example, product name "S-4800 (Type 2)"; manufactured by Hitachi High-Technologies Corporation) to confirm whether they are fibrous or not, and it is determined whether an element different from the elements constituting the electroconductive fiber is detected or not using an energy dispersive X-ray analyzer (EDX: Genesis 2000 manufactured by EDAX, attached to the above SEM). The measurement conditions by EDX are as follows: accelerating voltage is "15 kV", emission current is "20 μA", and WD is "15 mm". Since the fibers with a dark-colored surface 16 are a kind of different fibers, the fiber diameter and the fiber length of the fibers with a dark-colored surface 16 are also applied to the different fibers.

(Fibers with Dark-Colored Surface)

The fibers with a dark-colored surface 16 are fibers which exhibit a darker color than the electroconductive fibers 15 at at least a part of the surface. Whether or not at least a part of the surface of the dark-colored fibers 16 exhibits a darker color than the electroconductive fibers 15 is determined as follows, for example: the color of a dispersion which is for forming the electroconductive part and which contains the fibers with a dark-colored surface and the color of a dispersion containing the electroconductive fibers are compared; or the fibers with a dark-colored surface are taken out from a dispersion containing the fibers with a dark-colored surface, and the color of the fibers with a dark-colored surface and the color of the electroconductive fibers are compared. In addition, in cases where the fibers with a dark-colored surface are made of metal, whether or not at least a part of the surface of the dark-colored fibers 16 exhibits a darker color than the electroconductive fibers 15 may be determined according to the following method. The dark-colored fibers are observed a magnification of 50,000 times, using a scanning electron microscope (SEM) (for example, product name "S-4800 (Type 2)"; manufactured by Hitachi High-Technologies Corporation) to confirm that they are fibrous. Then, it is determined whether a metal different from the electroconductive fibers is detected or not in the electroconductive part, using an energy dispersive X-ray analyzer (EDX). When a metal different from the electroconductive fibers is detected, the color of the metal in the fiber state is obtained from known information. Then, the color obtained from the known information and the color of the electroconductive fibers are compared to determine whether or not the dark-colored fibers exhibits a darker color than the electroconductive fibers. As used herein, the "dark-colored" means a color having a low lightness such as black, gray, or brown, which is capable of reducing the diffused light reflectance of the electroconductive part.

It is preferable, but not necessary, that the entire surface of the fibers with a dark-colored surface 16 exhibits a dark color. That is, the fibers with a dark-colored surface 16 may have a portion that does not exhibit a dark color in some locations. However, in order to achieve the diffused light reflectance (SCE) of 0.5% or less, fibers with a dark-colored surface 16 preferably has a certain size or more of a portion that exhibits a dark color (hereinafter, this portion is referred to as a "dark-colored part"). For example, in cases where the dark-colored part of the fibers with a dark-colored surface is thicker than other portions of the fibers with a dark-colored surface, the diffused light reflectance of 0.5% or less can be achieved when the length of the thicker portion than other portions (the length of the dark-colored part) is 1.5 μm or more, upon the observation of fibers with a dark-colored surface at a magnification of 50,000 times with a scanning electron microscope (SEM) (for example, product name "S-4800 (TYPE2)", manufactured by Hitachi High-Technologies Corporation). Upon the observation of the fibers with a dark-colored surface with a scanning electron microscope (SEM) at a magnification of 50,000 times, even when the length of the dark-colored part is less than 1.5 μm, the diffused light reflectance of 0.5% or less can be achieved in some cases depending on the blending ratio of the electroconductive fibers 15 and fibers with a dark-colored surface 16. However, in cases where the dark-colored part is constituted by a coating film, the dark-colored part may fall off from the fibers during coating, easily resulting in a drawback.

The fibers with a dark-colored surface 16 preferably have an average fiber diameter of 30 nm or less. The fibers with a dark-colored surface 16 having an average fiber diameter of 30 nm or less makes it possible to inhibit the electroconductive film 10 from having a higher haze value and to have a sufficient light transmittance. The minimum average fiber diameter of the fibers with a dark-colored surface 16 is preferably 5 nm or more, 7 nm or more, or 10 nm or more in terms of the countermeasure against the static electricity. The maximum average fiber diameter of the fibers with a dark-colored surface 16 is preferably 28 nm or less, 25 nm or less or 20 nm or less. The average fiber diameter of the fibers with a dark-colored surface 16 can be measured by the same method as for the average fiber diameter of the electroconductive fibers 15.

The fibers with a dark-colored surface 16 preferably have an average fiber length of 15 μm or more and 20 μm or less. In cases where the fibers with a dark-colored surface 16 have an average fiber length of 15 μm or more, a higher haze value and a lower light transmittance due to the aggregation are avoided. In cases where the fibers with a dark-colored surface 16 have an average fiber length of 20 μm or less, the coating can be performed without clogging the filter. The minimum average fiber length of the fibers with a dark-colored surface 16 may be 5 μm or more, 7 μm or more, or 10 μm or more, while the maximum average fiber length of the fibers with a dark-colored surface 16 may be 40 μm or less, 35 μm or less, or 30 μm or less.

Since the electrical conductivity of the electroconductive part 12 is obtained through the electroconductive fibers 15, fibers with a dark-colored surface 16 themselves do not necessarily have to exhibit electrical conductivity, but in order to inhibit the decrease in the electrical conductivity of the electroconductive part 12, the fibers with a dark-colored surface 16 are preferably electroconductive fibers.

The content of the fibers with a dark-colored surface 16 in the electroconductive part 12 is not particularly limited as long as the diffused light reflectance (SCE) of 0.5% or less is achieved, but the weight ratio of the electroconductive fibers 15 and the fibers with a dark-colored surface 16 is preferably 97:3 to 30:70. When the ratio is within this range, it is possible to obtain electrical conductivity in the electroconductive part and the milkiness can be further inhibited.

Figure 7A:
FIG. 7(A) and FIG. 7(B) depict schematic views of a fiber with a dark-colored surface.
Figure 7B:

Examples of the fibers with a dark-colored surface 16 include a dark-colored part-forming fiber 17 having a dark-colored film 17B formed on the surface of a fiber material 17A by a darkening treatment such as a blackening treatment, as shown in FIG. 7(A). Examples of the darkening treatment include coating, plating, surface treatment and the like. Examples of the surface treatment include chemical conversion treatment and anodic oxidation. Further, the fiber with a dark-colored surface 16 may be a dark-colored fiber 18, which is a fiber material that by itself exhibits a dark color, as shown in FIG. 7(B).

In cases where the surface of the fiber material 17A is darkened by plating, the dark-colored film 17B may be formed by either electrolytic plating or electroless plating.

The chemical conversion treatment is a treatment that changes the composition of the metal surface by a chemical or its solution, and examples thereof includes an oxidation treatment, a phosphatization treatment, and a sulfurization treatment. In cases where the fiber material is made of metal, depending on the material of the fiber material, a chemical conversion treatment that allows the metallic object to exhibit a black color is selected and used. For example, in cases where the material of the fiber material is copper, the fiber material may be immersed in an aqueous solution containing sodium chlorite and potassium hydroxide, an aqueous solution containing antimony polysulfide, an aqueous solution containing sodium chlorite and sodium phosphate, sodium hydroxide, an aqueous solution containing potassium persulfate and sodium hydroxide or the like. The depth of the formed dark-colored part exhibiting a black color can be adjusted by controlling the conditions such as the composition of the chemical conversion treatment solution, the temperature, and the immersion time.

(Dark-Colored Part-Forming Fibers)

The dark-colored part-forming fiber 17 is a fiber having a dark-colored film 17B formed on the surface of a fiber material 17A by a darkening treatment such as a blackening treatment. For the reason described above, the fiber material 17A may not be an electroconductive fiber, but is preferably an electroconductive fiber. In cases where the fiber material 17A is an electroconductive fiber, the fiber material 17A may not be constituted by the same electroconductive material as the electroconductive fiber 15, but may be constituted by the same material as the electroconductive fiber 15.

The dark-colored film 17B is preferably an inorganic film. In cases where the dark-colored film is an inorganic film, examples of the inorganic materials constituting the dark-colored film include metals, metal compounds such as metal oxides and metal sulfides, and the like. Examples of the metal include copper, cobalt, nickel, zinc, molybdenum, tin, chromium, alloys thereof, and the like, and among these, copper, cobalt, nickel, alloys thereof, and the like are preferable. Examples of the metal compounds include compounds of these metals and tellurium chloride. Cobalt, nickel, and tellurium chloride exhibit a black color by a film.

The dark-colored film 17B preferably has a film thickness of 1.0 nm or more and 14 nm or less. The dark-colored film 17B having a film thickness of 1.0 nm or more can assure the dark color of the fiber, while the dark-colored film 17B having a film thickness of 14 nm or less can assure excellent optical characteristics as well. The dark-colored film 17B preferably has a minimum film thickness of 2 nm or more and a maximum film thickness of 10 nm or less, 7 nm or less, or 5 nm or less.

(Dark-Colored Fibers)

The dark-colored fiber 18 is made of a fiber material. The dark-colored fiber 18 is not particularly limited as long as the fiber material itself has a dark color, and examples thereof include an electroconductive fiber. Examples of the electroconductive fibers include metallic fibers, metal oxide fibers, carbon nanotube fibers and the like. Examples of the metal constituting the metallic fibers include copper, cobalt, nickel, and alloys thereof (for example, copper nickel). Although cobalt itself has a silver color, the cobalt fiber exhibits a black color. A nickel fiber exhibits a black color. Examples of carbon nanotube fibers include multi-walled, single-walled, or herringbone type carbon nanotubes.

<Reaction Inhibitor>

A reaction inhibitor is a substance that inhibits reduction in electrical conductivity after application of the light-transmitting resin composition due to the reaction of the electroconductive fibers 15 with substances in the atmosphere (for example, sulfur, oxygen, and/or halogen). Examples of the reaction inhibitor include nitrogen-containing compounds, such as benzoazole compounds, triazole compounds, tetrazole compounds, isocyanurate compounds, and aniline compounds. Examples of the nitrogen-containing compounds used as a reaction inhibitor include 1-aminobenzoazole, 5-methylbenzotriazole, 1,2,3-benzotriazole, 1-methyl-1H-tetrazole-5-amine, DL-α-tocopherol, 1-octadecanethiol, 2-mercapto-5-(trifluoromethyl)pyridine, diallyl isocyanurate, diallyl propyl isocyanurate, 6-anilino-1,3,5-triazine-2,4-dithiol, thiocyanuric acid, 3,5-dimethyl-1H-1,2,4-triazole, 4-(1,2,4-triazol-1-ylmethyl)aniline, 6-(dibutylamino)-1,3,5-triazine-2,4-dithiol, 4-(1,2,4-triazol-1-yl) aniline, 2-methylthio-benzothiazole, 1-phenyl-5-mercapto-1H-tetrazole, 5-mercapto-1-methyltetrazole, 5-(methylthio)-1H-tetrazole, 5-amino-1H-tetrazole, 1-(2-dimethylaminoethyl)-5-mercaptotetrazole, 1-(2-dimethylaminoethyl)-5-mercaptotetrazole, 1-(4-hydroxyphenyl)-5-mercapto-1H-tetrazole, 3-amino-5-mercapto-1,2,4-triazole, and 3,5-diamino-1,2,4-triazole.

The content of a reaction inhibitor in the electroconductive part 12 is preferably 0.01% by mass or more and 10% by mass or less. In cases where the content of the reaction inhibitor is less than 0.01% by mass, the electroconductive fibers may react with substances in the atmosphere, which in turn results in reduced electrical conductivity. Additionally, although the reaction inhibitor reacts with the surface of electroconductive fibers and thus inactivates the surface of electroconductive fibers, and renders the resulting electroconductive fibers less prone to react with substances in the atmosphere, the reaction inhibitor may react not only with the surface of electroconductive fibers but also with the inside of the electroconductive fibers, which in turn results in reduced electrical conductivity in cases where the content of the reaction inhibitor is more than 10% by mass.

<<Other Electroconductive Films>>

In the electroconductive film 10 shown in FIG. 1, the fibers with a dark-colored surface 16 are contained in the electroconductive part 12. However, with the electroconductive part not containing any fiber with a dark-colored surface, a layer containing fibers with a dark-colored surface may be provided on the surface side of the electroconductive film, more outer than electroconductive part. Specifically, the electroconductive film 30 shown in FIGS. 8 and 9 includes a light-transmitting base material 11, an electroconductive part 31 provided on a first face 11A of the light-transmitting base material 11, a layer containing fibers with a dark-colored surface 32 provided on the surface of the electroconductive part 31, and a light-transmitting functional layer 13 provided on a second face 11B of the light-transmitting base material 11. The surface 30A of the electroconductive film 30 is the surface 32A of the layer containing fibers with a dark-colored surface 32, and the back surface 30B of the electroconductive film 30 is the surface 13A of the light-transmitting functional layer 13. The property values and the like of the electroconductive film 30 are similar to those of the electroconductive film 10. The electroconductive part 31 include a light-transmitting resin 14 and electroconductive fibers 15, and differs from the electroconductive part 12 only in that the electroconductive part 31 does not include any fiber with a dark-colored surface 16. In FIGS. 8 and 9, the elements indicated by the same reference numbers as in FIGS. 1 and 2 are the same as those indicated in FIGS. 1 and 2, and further description is thus omitted.

The layer containing fibers with a dark-colored surface 32 include a light-transmitting resin 33 and fibers with a dark-colored surface 16 incorporated in the light-transmitting resin 33. The light-transmitting resin 33 is similar to the light-transmitting resin 14, and the description is thus omitted here.

In cases where the electroconductive part contains fibers with a dark-colored surface, the fibers with a dark-colored surface interfere with the contact between the electroconductive fibers, and the resistance value may increase. However, in the electroconductive film 30 shown in FIGS. 8 and 9, since the electroconductive part 31 does not contain the fibers with a dark-colored surface 16 and the layer containing fibers with a dark-colored surface 32 is separately provided, it is possible to inhibit the interfered contact of the electroconductive fibers 15 with each other due to the fibers with a dark-colored surface 16. As a result, a low resistance value can be achieved while the milkiness is inhibited.

The electroconductive film 10 shown in FIG. 1 includes a light-transmitting functional layer 13, but may not include a light-transmitting functional layer as in the electroconductive film 40 shown in FIG. 10. The absence of the light-transmitting functional layer can improve the flexibility. The surface 40A of the electroconductive film 40 is the surface 12A of the electroconductive part 12, and the back surface 40B of the electroconductive film 40 is the second face 11B of the light-transmitting base material 11. The property values and the like of the electroconductive film 40 are similar to those of the electroconductive film 10, except for the following.

For the electroconductive film 10 shown in FIG. 1, the electroconductive part 12 is a layered film with no pattern, but the electroconductive part may be patterned depending on the applications. Specifically, the electroconductive film may be an electroconductive film 50, as shown in FIG. 11, including an electroconductive layer 51 which is composed of a plurality of electroconductive parts 52 and nonconductive parts 53 located between the electroconductive parts 52. The nonconductive parts may be voids. The surface 50A of the electroconductive film 50 is the surface 51A of the electroconductive layer 51, and the back surface 50B of the electroconductive film 50 is the surface 13A of the light-transmitting functional layer 13. The property values and the like of the electroconductive film 50 are similar to those of the electroconductive film 10. In FIG. 11, the elements indicated by the same reference numbers as in FIG. 1 are the same as those indicated in FIG. 1, and further description is thus omitted.

<Electroconductive Parts>

The electroconductive parts 52 are the same as the electroconductive part 12, except that the former electroconductive parts is patterned. The electroconductive parts 52 function, for example, as electrode lines in the X direction in a projected capacitive touch panel and include a plurality of sensing electrodes 52B aligned in the X direction and a plurality of connectors (not shown) that are connected to the sensing electrodes 52B, as shown in FIG. 12. Each sensing electrode 52B is located at a rectangular active area for sensing a touch position, while each connector is located at a non-active area adjacent to and surrounding the active area.

Each sensing electrode 52B includes a straight extending linear portion 52C and an expanded portion 52D extending from the linear portion 52C. In FIG. 12, linear portions 52C extend straight along a direction intersecting with the arrangement direction of sensing electrodes 52B. The expanded portion 52D is an outwardly expanded portion extending from a linear portion 52C on the surface of the light-transmitting functional layer 13. Thus, the width of each sensing electrode 52B is broadened at an area where an expanded portion 52D is provided. In the present embodiment, each expanded portion 52D has an outer contour in a substantially square shape. The shape of each expanded portion 52D is not limited to a substantially square shape and it may take a diamond shape or a stripe shape.

The surface resistance values (Ω/□) of the electroconductive parts 52 can be measured in pieces of the electroconductive parts 52 having a large area (for example, a bezel in a manufactured product). The surface resistance values of the electroconductive parts 52 are preferably measured using a contact-type resistivity meter (product name "Loresta-AX MCP-T370"; Mitsubishi Chemical Analytech Co., Ltd.) in accordance with JIS K7194: 1994 (Testing method for resistivity of conductive plastics with a four-point probe array), though it depends on the shape and/or size of the patterned electroconductive parts 42. However, a non-destructive type (eddy current) resistivity meter (product name "EC-80P"; manufactured by Napson Corporation) may be used to measure the surface resistance values in cases where the electroconductive parts 52 have a shape and/or a size that allows the measurement of surface resistance value using the non-destructive resistivity meter. The methods of measuring the surface resistance values of the electroconductive parts 52 with a contact-type resistivity meter and a non-destructive resistivity meter are the same as those of measuring the surface resistance value of the electroconductive part 12 with a contact-type resistivity meter and a non-destructive resistivity meter, and the description of the methods is omitted here. Although the type of a probe terminal for a Loresta-AX MCP-T370 resistivity meter is typically the ASP-probe type (4-pin probe, inter-pin distance=5 mm, pin-head radius=0.37 mm), a probe terminal of the PSP probe type (4-pin probe, inter-pin distance=1.5 mm, pin-head radius=0.26 mm) or the TFP probe type (4-pin probe, inter-pin distance=1 mm, pin-head radius=0.04 mm) is preferably used in cases where samples obtained from the electroconductive parts 52 are small in size.

<Nonconductive Parts>

The nonconductive parts 53 are a part sandwiched between electroconductive parts 52 and having no electrical conductivity. Herein, the nonconductive part is regarded as having no electrical conductivity in cases where the resistance on the surface of the nonconductive part (surface resistance value) is 1500Ω/□ or more. The nonconductive parts 53 contain substantially no electroconductive fiber 15 or fiber with a dark-colored surface 16. The phrase "nonconductive parts contain substantially no electroconductive fiber or fiber with a dark-colored surface" as used herein means that the nonconductive parts may contain a small amount of electroconductive fibers under a condition where an electrical short circuit between electroconductive parts is not formed across the nonconductive parts even if metal ions from the electroconductive parts migrate to and permeated into the nonconductive parts. The nonconductive parts 53 preferably contain none of the electroconductive fibers 15 and fibers with a dark-colored surface 16. When electroconductive fibers 15 and fibers with a dark-colored surface 16 are removed from the nonconductive parts 53 by sublimating the electroconductive fibers 15 and fibers with a dark-colored surface 16 through exposure to laser light or by wet etching based on photolithography, as described below, a certain amount of materials as a component of the electroconductive fibers 15 and of the fibers with a dark-colored surface 16 may be left as a residue. However, these materials are not considered as electroconductive fibers or fibers with a dark-colored surface because these residual materials are not in fiber form.

Because the nonconductive parts 53 are formed together with the electroconductive parts 52 as an integrated body, the film thickness of the nonconductive parts 53 is preferably less than 300 nm, regardless of whether or not an underlayer or a light-transmitting functional layer is provided on the light-transmitting base material. The phrase "the film thickness of nonconductive parts" as used herein means the film thickness of a part laminated directly to a basement (such as a light-transmitting base material, underlayer, or light-transmitting functional layer) to which an electroconductive part containing electroconductive fibers identified by observation of a cross-section is also laminated. The maximum film thickness of the nonconductive parts 53 is more preferably 200 nm or less, 145 nm or less, 140 nm or less, 120 nm or less, 110 nm or less, 80 nm or less, 50 nm or less, 30 nm or less, or 10 nm or less, in terms of attempting to thin the film and obtaining favorable optical characteristics such as a low haze value. Additionally, the minimum film thickness of the nonconductive parts 53 is preferably 10 nm or more. The film thickness of the nonconductive parts 53 will be measured by the same method as for the film thickness of the electroconductive parts 52.

The nonconductive parts 53 are constituted by the light-transmitting resin 14. The nonconductive parts 53 may be formed by removing electroconductive fibers 15 and fibers with a dark-colored surface 16 through sublimation and may have the resulting voids which are not filled with electroconductive fibers and fibers with a dark-colored surface. In that case, the sublimated electroconductive fibers 15 and fibers with a dark-colored surface 16 burst out through areas to be the nonconductive parts 53 during the formation of the nonconductive parts 53 and the resulting nonconductive parts 53 have rough surfaces. The light-transmitting resin 14 in the nonconductive parts 53 is the same as the light-transmitting resin 14 in the electroconductive part 12, and the description of the light-transmitting resin is omitted here.

<<Production Methods of Electroconductive Films>>

Figure 13A:
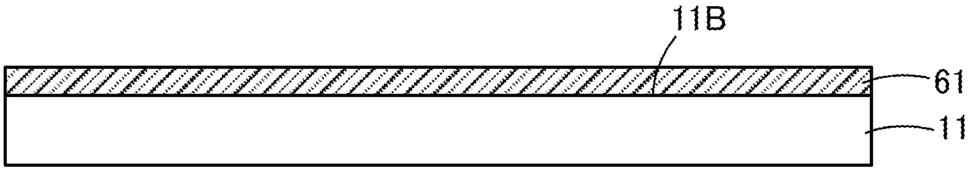
FIGS. 13(A) and 13(B) schematically illustrate the process for producing an electroconductive film according to one embodiment.

The electroconductive film 10 can be produced, for example, as follows. First, a light-transmitting functional layer composition is applied on the second face 11B of the light-transmitting base material 11 and dried to form a coating film 61 of the light-transmitting functional layer composition, as shown in FIG. 13(A).

The method of applying the light-transmitting functional layer composition include known coating methods, such as spin coating, dipping, spraying, slide coating, bar coating, roll coating, gravure coating, and die coating methods.

Figure 13B:
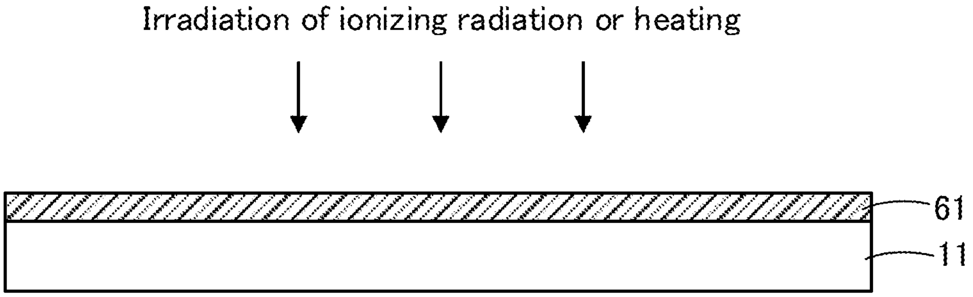

Next, the coating film 61 is exposed to ionizing radiation such as ultraviolet light or heated, as shown in FIG. 13(B), to polymerize (cross-link) the polymerizable compound and to cure the coating film 61, whereby the light-transmitting functional layer 13 is formed.

In cases where ultraviolet light is used as the light to cure the light-transmitting functional layer composition, the ultraviolet light or the like emitted from, for example, a super high pressure mercury lamp, high pressure mercury lamp, low pressure mercury lamp, carbon arc lamp, xenon arc lamp, or metal halide lamp can be used. Additionally, the wavelength range from 190 to 380 nm can be used as the wavelength of ultraviolet light. Specific examples of the source of electron beam include various types of electron beam accelerators, such as Cockcroft-Walton type, Van de Graft type, resonant transformer type, insulating core transformer type, linear type, Dynamitron type, and high frequency type accelerators.

Figure 14A:
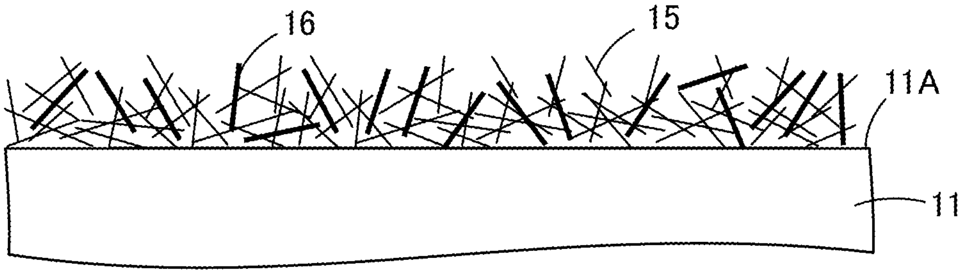
FIGS. 14(A) and 14(B) schematically illustrate the process for producing an electroconductive film according to one embodiment.

After the light-transmitting functional layer 13 is formed on the light-transmitting base material 11, an electroconductive fiber dispersion containing electroconductive fibers 15, fibers with a dark-colored surface 16 and a dispersion medium is applied on the first face 11A of the light-transmitting base material 11, and dried, followed by arranging a plurality of the electroconductive fibers 15 and fibers with a dark-colored surface 16 on the first face 11A of the light-transmitting base material 11, as shown in FIG. 14(A). The dispersion of electroconductive fibers may contain a resin material consisting of a thermoplastic resin or a polymerizable compound, in addition to the electroconductive fibers 15, the fibers with a dark-colored surface and the dispersion medium. The term "resin material" as used herein inclusively refers to a component such as a polymerizable compound that can be polymerized to a resin, in addition to a resin (however, excluding a resin (for example, polyvinylpyrrolidone) as a component of an organic protective layer that is formed surrounding electroconductive fibers in the synthesis of the electroconductive fibers, for the purpose of, for example, preventing the electroconductive fibers from weld anchoring to each other or from reacting with substances in the atmosphere). Additionally, the resin material in the dispersion of electroconductive fibers becomes an integral part of the light-transmitting resin 14 after the formation of the electroconductive part 12.

The dispersion medium may be either a water-based dispersion medium or an organic dispersion medium. However, in cases where the content of the resin material in the dispersion of electroconductive fibers is excessively high, the resin material permeates into the space between the electroconductive fibers, and the electrical conductivity of the electroconductive part may be consequently deteriorated. In particular, in cases where the electroconductive part has a small film thickness, the electrical conductivity of the electroconductive part is more likely to be deteriorated. Additionally, use of an organic dispersion medium allows the dispersion of electroconductive fibers to have a lower resin content than use of a water-based dispersion medium. Because of this, an organic dispersion medium is preferably used in forming the electroconductive part 12 having a small film thickness, for example, a film thickness of 300 nm. The organic dispersion medium may contain water in a content of less than 10% by mass.

The organic dispersion medium is not limited to a particular organic dispersion medium, and is preferably a hydrophilic organic dispersion medium. Examples of the organic dispersion medium include saturated hydrocarbons, such as hexane; aromatic hydrocarbons, such as toluene and xylene; alcohols, such as methanol, ethanol, propanol, and butanol; ketones, such as acetone, methyl ethyl ketone (MEK), methyl isobutyl ketone, and diisobutyl ketone; esters, such as ethyl acetate and butyl acetate; ethers such as tetrahydrofuran, dioxane, and diethyl ether; amides, such as N,N-dimethylformamide, N-methylpyrrolidone (NMP), and N,N-dimethylacetamide; and halogenated hydrocarbons, such as ethylene chloride and chlorobenzene. Among those organic dispersion media, alcohols are preferred in terms of the stability of the dispersion of electroconductive fibers.

Examples of a thermoplastic resin that may be contained in the dispersion of electroconductive fibers include acrylic resins; polyester resins, such as polyethylene terephthalate; aromatic resins, such as polystyrene, polyvinyl toluene, polyvinyl xylene, polyimide, polyamide, and polyamide-imide; polyurethane resins; epoxy resins; polyolefin resins; acrylonitrile-butadiene-styrene copolymer (ABS); cellulose-based resins; polyvinyl chloride resins; polyacetate resins; polynorbornene resins; synthetic rubber; and fluorine-based resins.

Examples of a polymerizable compound that may be contained in the dispersion of electroconductive fibers include polymerizable compounds similar to that described for the light-transmitting functional layer 13, and the description of the polymerizable compound is omitted here.

Figure 14B:
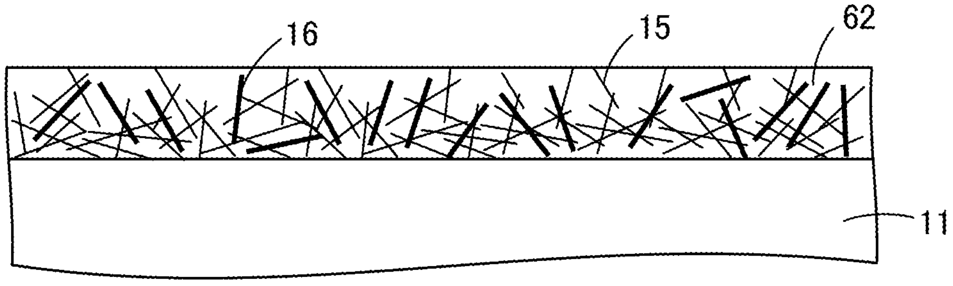

After a plurality of the electroconductive fibers 15 and fibers with a dark-colored surface 16 are placed on the first face 11A of the light-transmitting base material 11, a light-transmitting resin composition containing a polymerizable compound and a solvent is applied on it and dried to form a coating film 62 of the light-transmitting resin composition, as shown in FIG. 14(B). The light-transmitting resin composition containing the polymerizable compound and the solvent may additionally contain a polymerization initiator and the above-described reaction inhibitor as necessary. In this respect, although a reaction inhibitor can be added to an electroconductive fiber-containing composition, the addition of the reaction inhibitor to the dispersion of electroconductive fibers may cause coating of the surface of electroconductive fibers with the reaction inhibitor before the electroconductive fibers form a network structure, which in turn deteriorates the electrical conductivity. Thus, a reaction inhibitor is preferably added to the light-transmitting resin composition.

Figure 15A:
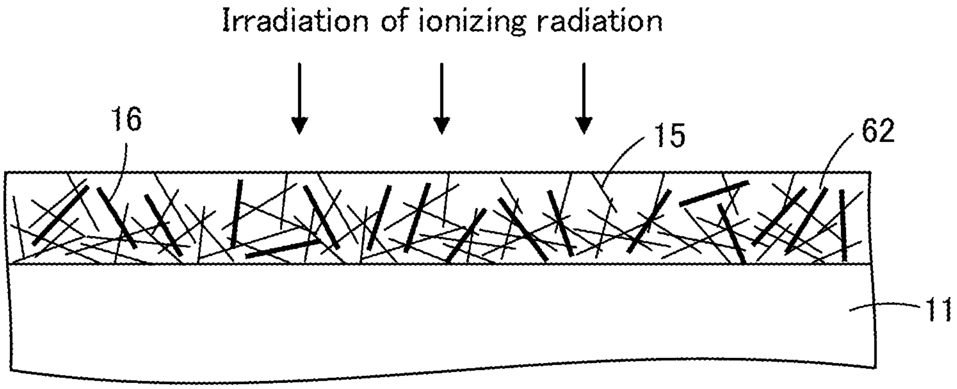
FIGS. 15(A) and 15(B) schematically illustrate the process for producing an electroconductive film according to one embodiment.

Next, the coating film 62 is exposed to ionizing radiation such as ultraviolet light, as shown in FIG. 15(A), to polymerize (cross-link) the polymerizable compound and to cure the coating film 62, whereby the light-transmitting resin 14 is formed.

Because the electroconductive part 12 of the electroconductive film 10 shown in FIG. 1 is a layered film, the electroconductive film 10 is obtained in the above-described process. On the other hand, because the electroconductive film 50 shown in FIG. 11 is patterned, the patterning step will be described below.

Figure 15B:
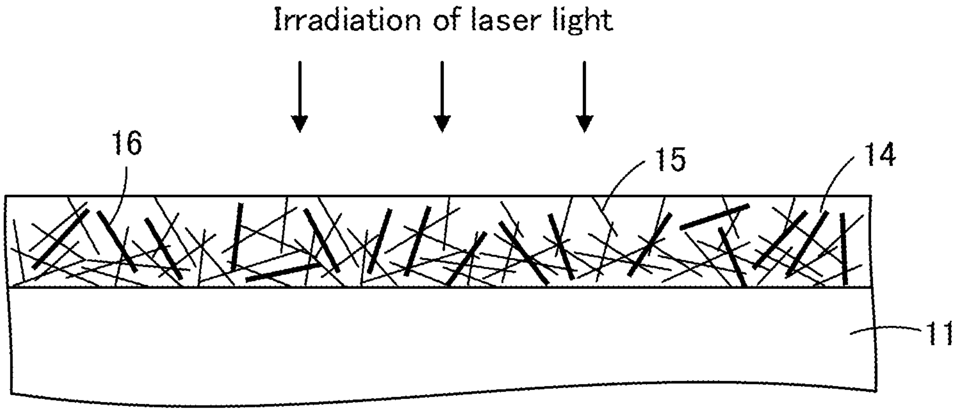

After the light-transmitting resin 14 is formed, areas to be the nonconductive parts 53 are exposed to laser light (for example, infrared laser) to generate a pattern on the electroconductive part 52 by dry-etching, as shown in FIG. 15(B). Upon irradiation of laser light to the areas to be the nonconductive parts 53, the electroconductive fibers 15 and the fibers with a dark-colored surface 16 included in the regions are sublimated by the heat of the laser light. The sublimated electroconductive fibers 15 and fibers with a dark-colored surface 16 burst out through the light-transmitting resin 14. Thus, an electroconductive film 50 including the electroconductive parts 52 and the nonconductive parts 53 shown in FIG. 11 can be obtained. The patterning of the electroconductive part 52 described above is performed by dry-etching, while the patterning of the electroconductive layer 51 may be performed by photolithography because electroconductive fibers 15 and fibers with a dark-colored surface 16 can also be removed by photolithography from areas to be the nonconductive parts 53.

<<Production Methods of Electroconductive Films by Transfer>>

The electroconductive film may be manufactured by a transfer method. The production method by transfer is one of the conventionally known methods, but since the release film is generally discarded, the cost may increase to some extent. In order to improve flexibility, a thin light-transmitting base material having a thickness of 75 μm or less is preferably used. However, in the case of an extremely thin light-transmitting base material having a thickness of 35 μm or less, particularly 5 μm or more and 18 μm or less, for example, the transfer method may be more stable than the direct coating on the base material, and thus, the transfer method is one of the effective production methods for products in which flexibility is considered to be important.

Figure 16A:
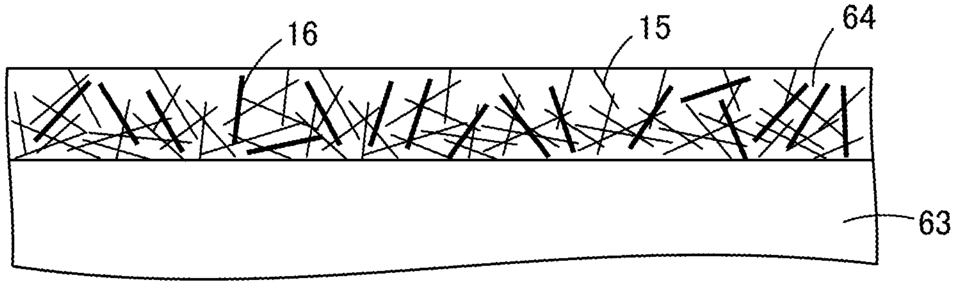
FIGS. 16(A) and 16(B) schematically illustrate another process for producing an electroconductive film according to one embodiment.

When an electroconductive film is produced by the transfer method, first, as shown in FIG. 16(A), the untreated surface of a release film 63 is coated with an electroconductive part composition to form a coating film 64. Since the release film 63 is peeled off from the electroconductive film in the end, it does not form a part of the electroconductive film.

<Release Film>

The release film 63 is for transferring the electroconductive part 12 to another member by being peeled off from the electroconductive part 12. The release film 63 may be light-transmitting, but the release film 63 is peeled off after the electroconductive part 12 is transferred to another member, and thus may not be light-transmitting.

The thickness of the release film 63 is not limited, and preferably 25 μm or more and 100 μm or less. The release film 63 having a thickness of 25 μm or more can inhibit the influence of curing shrinkage of the electroconductive part 12 when the electroconductive part is cured by the ionizing radiation, and thus, the occurrence of strong wrinkles on the release film 63 can be inhibited. The release film 63 having a thickness of 100 μm or less makes it possible to reduce the production cost.

The release film 63 is not particularly limited, but for example, a polyethylene terephthalate (PET) film having at least one face untreated is preferably used. In this case, the untreated surface of the polyethylene terephthalate film is used as the peeling surface. The polyethylene terephthalate film having at least one face untreated has excellent releasability from the electroconductive part and is inexpensive. Therefore, the production cost of a laminate of the present embodiment can be maintained low. For example, in cases where a release film coated with a Si release agent containing silicon atoms is used as the release film, the release film has good releasability, but the component of the release agent is transferred to the electroconductive part side upon the transfer of the electroconductive part, which may cause large unevenness of the surface of the electroconductive part and thus increased water contact angle on the surface of the electroconductive part. On the other hand, in cases where a polyethylene terephthalate film having at least one face untreated is used as the release film, there is no component to be transferred to the electroconductive part upon the transfer of the electroconductive part, and thus, the unevenness of the surface of the electroconductive part is small, and the water contact angle on the surface of the electroconductive part after the transfer is unlikely to change. The "polyethylene terephthalate film having at least one face untreated" as used herein means a polyethylene terephthalate film having a face that has not been surface-treated. Therefore, a release agent for enhancing the releasability is not present on the side of the untreated surface of the polyethylene terephthalate film having at least one face untreated.

<Electroconductive Part Composition>

The electroconductive part composition contains electroconductive fibers 15, different fibers 16, and a polymerizable compound. However, the electroconductive part composition may not contain any different fiber 16. Polymerizable compounds similar to those described for the light-transmitting functional layer 13 are included as examples of the polymerizable compound, and further description is thus omitted here. The electroconductive part composition may additionally contain a solvent and a polymerization initiator.

Figure 16B:
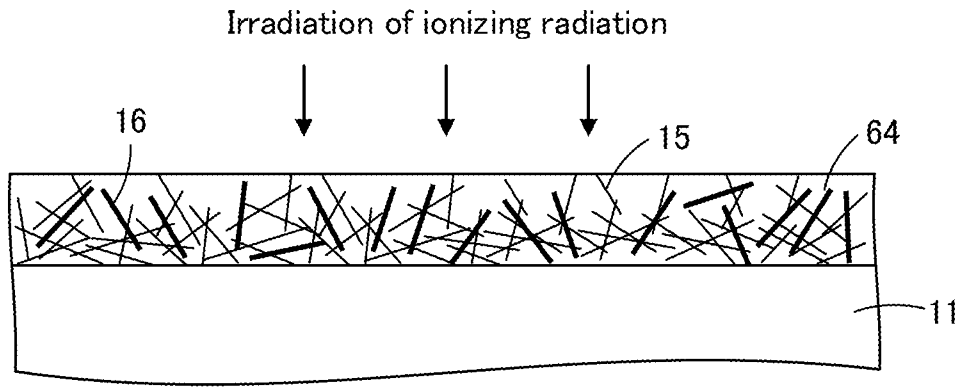

After the coating film 64 of the electroconductive part composition is formed, the coating film 64 is exposed to ionizing radiation such as ultraviolet light, as shown in FIG. 16(B), to polymerize (cross-link) the polymerizable compound and to cure the coating film 64, whereby the electroconductive part 12 is formed. Thus, a transfer film having the electroconductive part 12 on the release film 61 is obtained.

A light-transmitting functional layer composition is applied on the second face 11B of the light-transmitting base material 11 and dried to form a coating film 61 of the light-transmitting functional layer composition.

Next, the coating film 61 is exposed to ionizing radiation such as ultraviolet light or heated to polymerize (cross-link) a polymerizable compound and to cure the coating film 61, whereby the light-transmitting functional layer 13 is formed. Thus, a transfer target film having the light-transmitting functional layer 13 on the light-transmitting base material 11 is obtained.

Figure 17A:
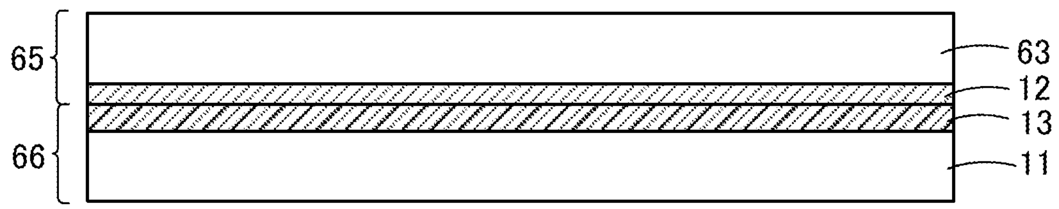
FIGS. 17(A) to 17(C) schematically illustrate another process for producing an electroconductive film according to one embodiment.
Figure 17B:
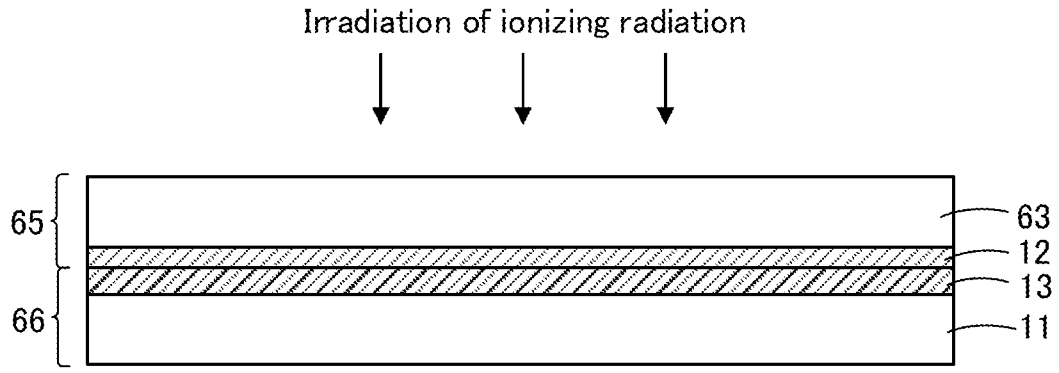
Figure 17C:
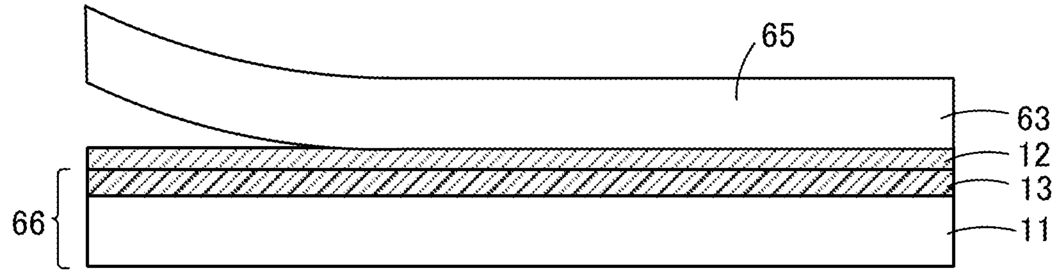

The obtained transfer film 65 and transfer target film 66 are laminated so that the surface 12A of the electroconductive part 12 of the transfer film 65 and the surface 13A of the light-transmitting functional layer 13 of the transfer target film 66 are in contact (see FIG. 17(A)), and in this state, ionizing radiation such as ultraviolet light is irradiated from the side of the transfer film 65 (see FIG. 17(B)) to bond the electroconductive part 12 and the light-transmitting functional layer 13. The ionizing radiation may be irradiated from the side of the transfer target film 66. Then, the release film 63 of the transfer film 65 is peeled off (see FIG. 17(C)) to obtain an electroconductive film in which the electroconductive part 12 is transferred to the transfer target film 66.

The present inventors have vigorously studied on the problem of milkiness, and have found that the milkiness can be inhibited in cases where the diffused light reflectance of the electroconductive part is reduced to 0.5%. According to the present embodiment, since the diffused light reflectance (SCE) in the region of the electroconductive film 10 where the electroconductive part 12 is present is 0.5% or less, the milkiness can be inhibited. In the electroconductive films 30, 40, 50 as well, the diffused light reflectance (SCE) in the region of the electroconductive films 30, 40, 50 where the electroconductive parts 12, 32, 52 are present is 0.5% or less. Therefore, the milkiness can be inhibited.

Since the electroconductive fibers easily reflect the light from the LED in particular, in cases where an electroconductive film containing electroconductive fibers is used in an LED image display device that uses an LED element as a light source, the milkiness tends to occur. However, the milkiness can be inhibited in the electroconductive films 10, 30, 40 and 50, and thus, the electroconductive film 10 can be suitably used for the LED image display device.

According to the present embodiment, the use of electroconductive fibers 15, differing from ITO, enables providing an electroconductive film 10 which is hardly cracked when folded. However, when the electroconductive fibers 15 were simply used, sometimes, not everything was good. As mentioned above, the control of the balance of various requirements such as the resin used for the light-transmitting base material, the thickness, the internal structure in the solid state (crystalline, amorphous, molecular orientation, and the like) and the thickness of the electroconductive film can improve the electrical resistance value ratio, milkiness, wrinkles, and flexibility even after the foldability test of one hundred thousand times or more, for example. Furthermore, even in the case of a transparent base material of a polyimide resin or an amide resin, which has been conventionally considered to be the most suitable for imparting a bending property, the electroconductive film 10 with improved flexibility can be provided by controlling the above-mentioned requirements. Thus, the electroconductive film 10 can be incorporated into a foldable image display device and then used.

Figure 18:
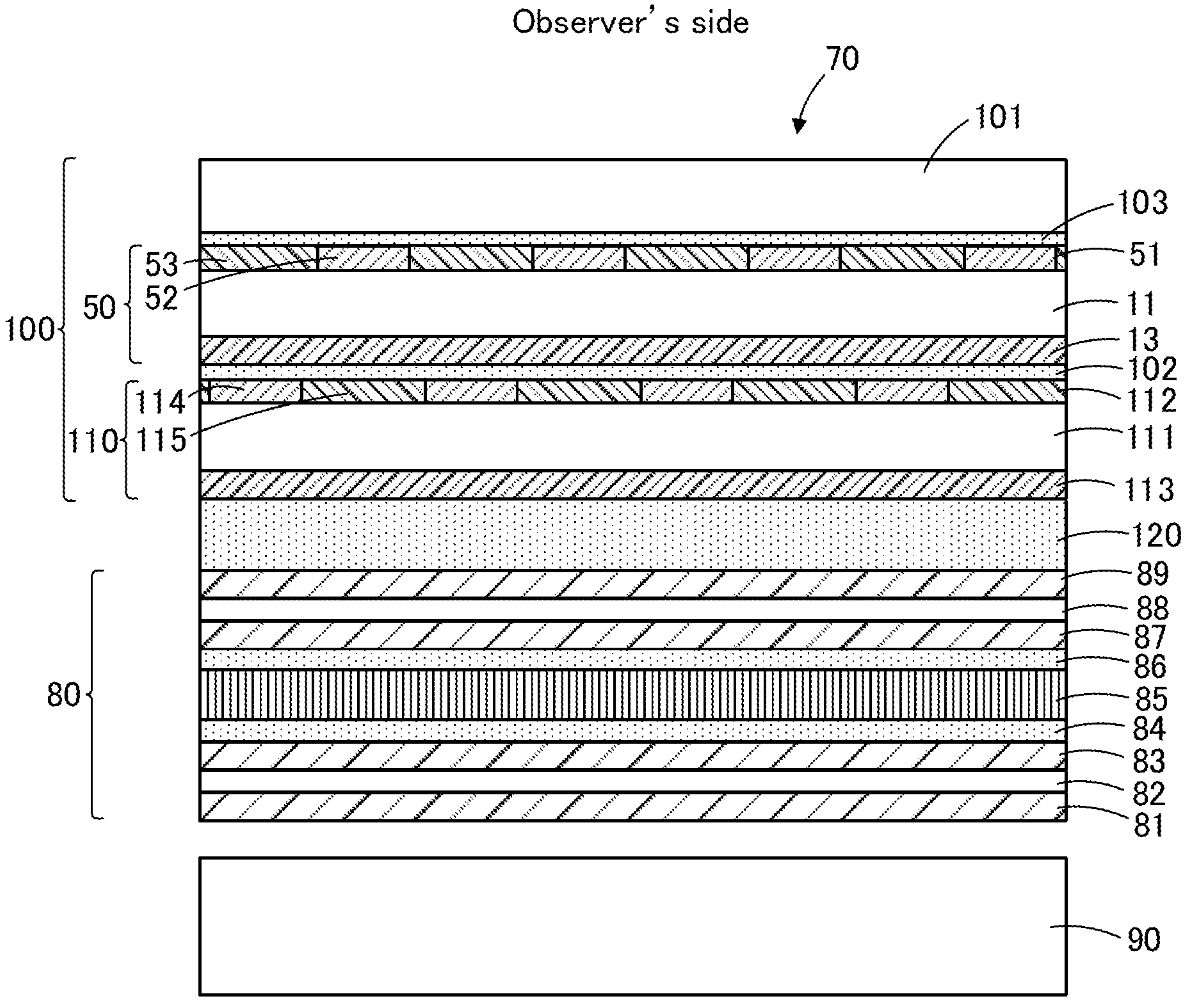
FIG. 18 depicts a schematic diagram of an image display device according to one embodiment.
Figure 19:
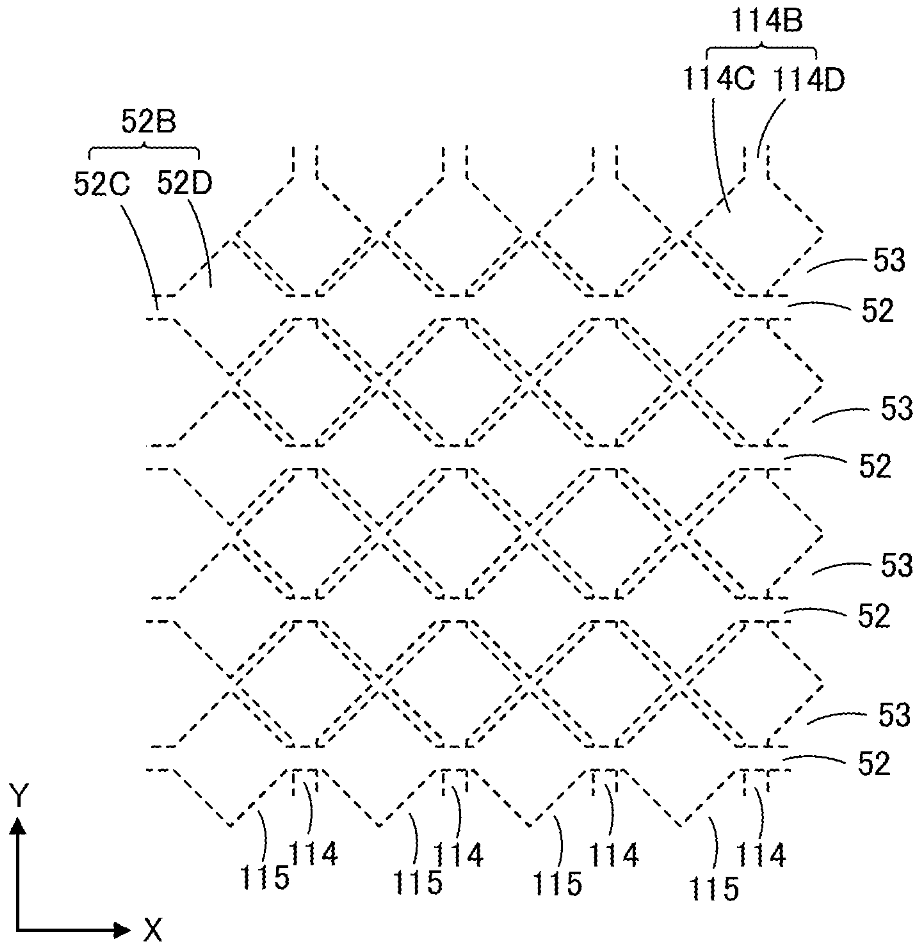
FIG. 19 depicts a schematic plane view of a touch panel according to one embodiment.

The application of an electroconductive film according to the present embodiment is not limited to a particular application and can be incorporated into an image display device including a touch panel and be used. FIG. 18 depicts a schematic diagram of an image display device according to the present embodiment, and FIG. 19 depicts a schematic plane view of a touch panel according to the present embodiment.

<<<Image Display Device>>>

As shown in FIG. 18, an image display device 70 mainly includes a display panel 80 for displaying images, a backlight unit 90 placed on the back surface of the display panel 80, a touch panel 100 placed on the observer's side of the display panel 80, and a light-transmitting adhesion layer 120 intervening between the display panel 80 and the touch panel 100. In the present embodiment, the display panel 80 is a liquid-crystal display panel and the image display device 70 thus includes the backlight unit 90 but may not include the backlight unit 90 depending on the type of the display panel (display element). Additionally, the image display device may further include a film, for example, for inhibition of a decrease caused by polarized sunglasses in visibility.

<<Display Panel>>

The display panel 80 has a laminate structure, as shown in FIG. 18, composed of a protective film 81 made of, for example, a triacetyl cellulose film (TAC film) or a cycloolefin polymer film, a polarizer 82, a protective film 83, a light-transmitting adhesive layer 84, a display element 85, a light-transmitting adhesive layer 86, a protective film 87, a polarizer 88, and a protective film 89 in this order from the backlight unit 90 to the observer's side. The display panel 80 only needs to include the display element 85 and may not include the protective film 81 or the like.

The display element 85 is a liquid-crystal display element. However, the display element 85 is not limited to a liquid-crystal display element, and may be a display element using, for example, an organic light-emitting diode (OLED), an inorganic light-emitting diode, and/or a quantum dot light-emitting diode (QLED). The liquid-crystal display element includes, for example, a liquid-crystal layer, an alignment film, an electrode layer, and a color filter sandwiched between two glass base materials.

<<Backlight Unit>>

The backlight unit 90 illuminates the display panel 80 from the back surface of the display panel 80. Any known backlight unit can be used as the backlight unit 90, and, moreover, the backlight unit 90 may be either an edge light-type or a direct light-type backlight unit.

<<Touch Panel>>

The touch panel 100 includes an electroconductive film 110, an electroconductive film 50 placed on the observer's side of the electroconductive film 110, a light-transmitting cover member 101, such as a cover glass, placed on the observer's side of the electroconductive film 50, a light-transmitting adhesive layer 102 intervening between the electroconductive film 10 and the electroconductive film 50, and a light-transmitting adhesive layer 103 intervening between the electroconductive film 50 and the light-transmitting cover member 101.

<Electroconductive Film>

The electroconductive film 110 has almost the same structure as that of the electroconductive film 50. That is, the electroconductive film 110 includes, as shown in FIG. 18, a light-transmitting base material 111, an electroconductive layer 112 provided on a first face of the light-transmitting base material 111, and a light-transmitting functional layer 113 provided on a second face of the light-transmitting base material. The electroconductive layer 112 is composed of a plurality of electroconductive parts 114 and nonconductive parts 115 sandwiched between the electroconductive parts 114. The light-transmitting base material 111 is similar to the light-transmitting base material 11 and the light-transmitting functional layer 113 is likewise similar to the light-transmitting functional layer 13, and further descriptions is thus omitted here.

(Electroconductive Parts and Nonconductive Parts)

The electroconductive parts 114 have the same structure as that of the electroconductive parts 52, and the nonconductive parts 115 have the same structure as that of the nonconductive parts 532. The electroconductive parts 114 function as electrode lines in the Y direction in a projected capacitive touch panel include a plurality of sensing electrodes 114B and a plurality of connectors (not shown) that are connected to the sensing electrodes 114B, as shown in FIG. 19. The sensing electrodes 114B have the same structure as that of the sensing electrodes 52B, and include a straight extending linear portion 114C and an expanded portion 114D extending from the linear portion 114C. The sensors 114B extend in the Y direction. The electroconductive parts 114 have the same structure as that of the electroconductive parts 52, but the electroconductive parts 114 may not need to have the same structure as that of the electroconductive parts 52.

EXAMPLES

Now, the present invention will be described in more detail by way of examples. However, the present invention is not limited to those examples.

<Preparation of Hard Coat Layer Compositions>

First, the following components were combined to meet the composition requirements indicated below and thereby obtain a hard coat layer composition 1.

(Hard Coat Layer Composition 1)

- A mixture of pentaerythritol triacrylate and pentaerythritol tetraacrylate (trade name "KAYARAD PET-30"; manufactured by Nippon Kayaku Co., Ltd.): 30 parts by mass;
- A polymerization initiator (trade name "Irgacure 184"; manufactured by BASF Japan Ltd.): 1.5 parts by mass;
- Methyl ethyl ketone (MEK): 50 parts by mass;
- Cyclohexanone: 18.5 parts by mass.

<Preparation of Dispersions of Silver Nanowires>

(Dispersion of Silver Nanowires 1)

Ethylene glycol as an alcohol solvent, silver nitrate as a silver compound, sodium chloride as a chloride, sodium bromide as a bromide, sodium hydroxide as an alkali metal hydroxide, aluminum nitrate nonahydrate as an aluminum salt, and a copolymer of vinylpyrrolidone and diallyldimethylammonium nitrate as an organic protecting agent (copolymer prepared with 99% by mass of vinylpyrrolidone and 1% by mass of diallyldimethylammonium nitrate, a weight average molecular weight of 130,000) were prepared.

At room temperature, into 540 g of ethylene glycol, 0.041 g of sodium chloride, 0.0072 g of sodium bromide, 0.0506 g of sodium hydroxide, 0.0416 g of aluminum nitrate nonahydrate, and 5.24 g of the copolymer of vinylpyrrolidone and diallyldimethylammonium nitrate were added and dissolved to obtain a solution A. In a different container, 4.25 g of silver nitrate was added and dissolved in 20 g of ethylene glycol to prepare a solution B. In this example, the Al/OH molar ratio was 0.0876 and the OH/Ag molar ratio was 0.0506.

The whole amount of the solution A was heated from room temperature to 115° C. with stirring, and the whole amount of the solution B was added into the solution A over one minute. After the addition of the solution B was completed, the stirring was further continued and maintained at 115° C. for 24 hours. Then, the reaction liquid was cooled to room temperature. After cooling, acetone was added to the reaction liquid in an amount 10 times that of the reaction liquid, and the resulting mixture was stirred for 10 minutes and left to stand for 24 hours. After the mixture was left to stand, a concentrate and a supernatant were observed, and the supernatant was carefully removed with a pipette to obtain the concentrate.

To the obtained concentrate, 500 g of pure water was added, and the resulting mixture was stirred for 10 minutes to disperse the concentrate. Then, acetone was further added in an amount 10 times that of the mixture, and the resulting mixture was stirred and then left to stand for 24 hours. After the mixture was left to stand, a concentrate and a supernatant were observed again, and the supernatant was carefully removed with a pipette. Since an excessive amount of the organic protecting agent is unnecessary for obtaining good electrical conductivity, this washing operation was performed about one to twenty times as necessary to sufficiently wash the solid content.

Pure water was added to the solid content after washing to obtain a dispersion of this solid content. The dispersion was fractionated, and pure water, which was a solvent, was volatilized on an observation table, followed by the observation with a high-resolution FE-SEM (high-resolution field emission scanning electron microscope). As a result, the solid content was confirmed to be silver nanowires.

Isopropyl alcohol was added to the washed silver nanowires to obtain a dispersion of silver nanowires 1. Measurement of the average fiber diameter and the average fiber length of the silver nanowires in the dispersion of silver nanowires 1 indicated that the silver nanowires had an average fiber diameter of 45 nm and an average fiber length of 15 μm. The concentration of silver nanowires in the dispersion of silver nanowires 1 was 1.5 mg/ml.

The average fiber diameter of the silver nanowires was obtained as the arithmetic mean of the fiber diameters of 100 electroconductive fibers in 50 images acquired at a magnification of 100,000 to 200,000 times using a transmission electron microscope (TEM) (product name "H-7650"; manufactured by Hitachi High-Technologies Corporation), which were measured on the acquired images by a software program accessory to the TEM. The above-mentioned fiber diameters were measured by setting the accelerating voltage to "100 kV," the emission current to "10 μA," the condenser lens aperture to "1," the objective lens aperture to "0," the observation mode to "HC," and the Spot to "2." Additionally, the average fiber length of the silver nanowires was obtained as the arithmetic mean of the fiber lengths of 98 silver nanowires, excluding the maximum value and the minimum value from the fiber lengths of 100 silver nanowires measured using a scanning electron microscope (SEM) (product name "S-4800 (Type 2)"; manufactured by Hitachi High-Technologies Corporation) at a magnification of 500 to 20,000,000 times. The above-mentioned fiber lengths were measured by setting the signal selection to "SE," the accelerating voltage to "3 kV," the emission current to "10 μA," and the SE detector to "Mixed." The fiber length of the silver nanowires was obtained as the arithmetic mean of the fiber lengths of 98 silver nanowires, excluding the maximum value and the minimum value from the fiber lengths of 100 silver nanowires in 10 images acquired at a magnification of 500 to 20,000,000 times using a scanning electron microscope (SEM) (product name "S-4800 (Type 2)"; manufactured by Hitachi High-Technologies Corporation) on the SEM mode, which were measured on the acquired images by an accessory software program. The above-mentioned fiber length were measured using a 45° pre-tilted sample stub by setting the signal selection to "SE," the accelerating voltage to "3 kV," the emission current to "10 μA to 20 μA," the SE detector to "Mixed," the probe current to "Norm," the focus mode to "UHR," the condenser lens 1 to "5.0," the WD to "8 mm," and the Tilt to "30°." The TE detector was removed from the microscope system prior to the observation. When the fiber diameter of the silver nanowires was determined, a measurement sample produced by the following method was used. First, the dispersion of silver nanowires 1 was diluted with ethanol depending on the type of the dispersion medium to reduce the concentration of silver nanowires to 0.05% by mass or less. Furthermore, a drop of the diluted dispersion of silver nanowires 1 was applied on a carbon-coated grid mesh for TEM or STEM observation (a Cu grid with the model "#10-1012, Elastic Carbon Film ELS-C10 in the STEM Cu100P grid specification"), dried at room temperature, and then observed under the above-mentioned conditions, and the resulting observation image data was used to calculate the arithmetic mean. When the fiber length of the silver nanowires was determined, a measurement sample produced by the following method was used. First, the dispersion of silver nanowires 1 was applied on an untreated surface of a polyethylene terephthalate (PET) film in B5 size having a thickness of 50 μm at an application dose of silver nanowires of 10 $mg/m^2$, and dried to evaporate the dispersion medium and to place electroconductive fibers on the surface of the PET film, and an electroconductive film was thereby produced. A piece having a size of 10 mm×10 mm was cut from the central part of the electroconductive film. Then, the cut electroconductive film was attached flat against the tilted surface of a 45° pre-tilted SEM sample stub (model number "728-45"; manufactured by Nissin EM Co., Ltd.; 45° pre-tilted sample stub; 15 mm diameter×10 mm height; made of M4 aluminum) using a silver paste. Furthermore, the cut electroconductive film was sputtered with Pt—Pd for 20 to 30 seconds to obtain electrical conductivity. The fiber diameters and fiber lengths of the below-described silver nanowires were determined in the same manner.

(Dispersion of Silver Nanowires 2)

The dispersion of silver nanowires 2 was obtained in the same manner as the dispersion of silver nanowires 1, except that the synthesis conditions and the additives were adjusted to obtain silver nanowires having an average fiber diameter of 35 nm and an average fiber length of 15 μm.

(Dispersion of Silver Nanowires 3)

The dispersion of silver nanowires 3 was obtained in the same manner as the dispersion of silver nanowires 1, except that the synthesis conditions and the additives were adjusted to obtain silver nanowires having an average fiber diameter of 30 nm and an average fiber length of 15 μm.

(Dispersion of Silver Nanowires 4)

The dispersion of silver nanowires 4 was obtained in the same manner as the dispersion of silver nanowires 1, except that the synthesis conditions and the additives were adjusted to obtain silver nanowires having an average fiber diameter of 28 nm and an average fiber length of 15 μm.

(Dispersion of Silver Nanowires 5)

The dispersion of silver nanowires 5 was obtained in the same manner as the dispersion of silver nanowires 1, except that the synthesis conditions and the additives were adjusted to obtain silver nanowires having an average fiber diameter of 25 nm and an average fiber length of 15 μm.

(Dispersion of Silver Nanowires 6)

The dispersion of silver nanowires 6 was obtained in the same manner as the dispersion of silver nanowires 1, except that the synthesis conditions and the additives were adjusted to obtain silver nanowires having an average fiber diameter of 23 nm and an average fiber length of 15 μm.

(Dispersion of Silver Nanowires 7)

The dispersion of silver nanowires 7 was obtained in the same manner as the dispersion of silver nanowires 1, except that the synthesis conditions and the additives were adjusted to obtain silver nanowires having an average fiber diameter of 19 nm and an average fiber length of 15 μm.

(Dispersion of Silver Nanowires 8)

The dispersion of silver nanowires 8 was obtained in the same manner as the dispersion of silver nanowires 5, except that the concentration of silver nanowires was changed to 1.125 mg/ml.

(Dispersion of Silver Nanowires 9)

The dispersion o silver nanowires 9 was obtained in the same manner as the dispersion of silver nanowires 5, except that the concentration of silver nanowires was changed to 0.75 mg/ml.

(Dispersion of Silver Nanowires 10)

The dispersion of silver nanowires 10 was obtained in the same manner as the dispersion of silver nanowires 5, except that the concentration of silver nanowires was changed to 0.3 mg/ml.

(Dispersion of Silver Nanowires 11)

First, 122 g of sodium formaldehyde sulfoxylate dihydrate (Rongalit) and 12.5 g of polyvinylpyrrolidinone having a number average molecular weight of 40,000 were dissolved in a small amount of pure water, and pure water was further added to this aqueous solution to reach a total volume of 500 mL. To this aqueous solution, 72 g of 2-diethylaminoethanol was added to prepare an aqueous solution A. Then, 95 g of nickel chloride ($NiCl_2.6H_2O$) was dissolved in a small amount of pure water, and pure water was further added to this aqueous solution to reach a total volume to 500 mL. Thus, an aqueous solution B was prepared.

Next, the aqueous solution A was heated to 60° C. with stirring, the aqueous solution B was slowly added to this aqueous solution A of 60° C., and the resulting mixture was held at 60° C. for 2 hours with stirring to obtain a black colloidal dispersion. This colloidal dispersion was washed with an ultrafiltration membrane until the electrical conductivity of the filtrate reached 133 μS/cm, and a dispersion of the solid content was obtained.

When the crystal structure of the obtained solid content was measured by X-ray diffraction (XRD), it was confirmed that the solid content was nickel nanowires having a crystal structure of a face-centered cubic structure.

Measurement of the average fiber diameter and the average fiber length of silver nanowires in the obtained dispersion of nickel nanowires indicated that the nickel nanowires had an average fiber diameter of 80 nm and an average fiber length of 2.4 μm. The dispersion of nickel nanowires was black, and when the nickel nanowires were taken out from the dispersion of nickel nanowires and observed, the nickel nanowires were black.

The obtained dispersion of nickel nanowires was added to the dispersion of silver nanowires 5 in such a manner that the weight ratio of the silver nanowires and the nickel nanowires was 90:10. Thus, a dispersion of silver nanowires 11 in which silver nanowires and nickel nanowires were dispersed was obtained.

(Dispersion of Silver Nanowires 12)

The dispersion of silver nanowires 12 was obtained in the same manner as the dispersion of silver nanowires 11, except that the dispersion of nickel nanowires was added to the dispersion of silver nanowires 5 in such a manner that the weight ratio of the silver nanowires and the nickel nanowires was 80:20.

(Dispersion of Silver Nanowires 13)

The dispersion of silver nanowires 13 was obtained in the same manner as the dispersion of silver nanowires 11, except that the dispersion of nickel nanowires was added to the dispersion of silver nanowires 5 in such a manner that the weight ratio of the silver nanowires and the nickel nanowires was 60:40.

(Dispersion of Silver Nanowires 14)

The dispersion of silver nanowires 14 was obtained in the same manner as the dispersion of silver nanowires 11, except that the dispersion of nickel nanowires was added to the dispersion of silver nanowires 7 in such a manner that the weight ratio of the silver nanowires and the nickel nanowires was 90:10.

(Dispersion of Silver Nanowires 15)

The dispersion of silver nanowires 15 was obtained in the same manner as the dispersion of silver nanowires 11, except that the dispersion of nickel nanowires was added to the dispersion of silver nanowires 7 in such a manner that the weight ratio of the silver nanowires and the nickel nanowires was 80:20.

(Dispersion of Silver Nanowires 16)

The dispersion of silver nanowires 16 was obtained in the same manner as the dispersion of silver nanowires 11, except that the dispersion of nickel nanowires was added to the dispersion of silver nanowires 7 in such a manner that the weight ratio of the silver nanowires and the nickel nanowires was 60:40.

(Dispersion of Silver Nanowires 17)

The dispersion of silver nanowires 5 was first obtained, and a concentrate formed in the process of producing the dispersion of silver nanowires 5 was separately obtained. Then, this concentrate was immersed in an aqueous solution of 0.25% by weight of tellurium dioxide (0.2% by weight of tellurium concentration), 0.45% by weight of hydrochloric acid, and 20% by weight of sulfuric acid, which was used as a metal blackening treatment liquid, for 30 seconds under the condition of a treatment temperature of 25° C. to form a film containing tellurium chloride ($TeCl_2$) on the surface of the concentrate.

After the obtained concentrate having a film was taken out, 500 g of pure water was added, and the resulting mixture was stirred for 10 minutes to disperse this concentrate. Then, acetone was further added in an amount 10 times that of the mixture, and the resulting mixture was stirred and then left to stand for 24 hours. After the mixture was left to stand, a concentrate and a supernatant were observed again, and the supernatant was carefully removed with a pipette. Since an excessive amount of the organic protecting agent is unnecessary for obtaining good electrical conductivity, this washing operation was performed about one to twenty times as necessary to sufficiently wash the silver nanowires having a film, which was the solid content.

Isopropyl alcohol was added to the washed silver nanowires having a film to obtain a dispersion of film-formed silver nanowires. Measurement of the average fiber diameter and the average fiber length of the film-formed silver nanowires in the dispersion of film-formed silver nanowires indicated that the silver nanowires had an average fiber diameter of 25 nm and an average fiber length of 15 μm. The dispersion of film-formed silver nanowires was black, and when the film-formed silver nanowires were taken out from the dispersion of film-formed silver nanowires and observed, the surface of the film-formed silver nanowires were black.

After the dispersion of film-formed silver nanowires was obtained, the dispersion of film-formed silver nanowires was added to the dispersion of silver nanowires 5 in such a manner that the weight ratio of the silver nanowires to the film-formed silver nanowires was 90:10, and thus, the dispersion of silver nanowires 17 was obtained.

(Dispersion of Silver Nanowires 18)

The dispersion of silver nanowires 18 was obtained in the same manner as the dispersion of silver nanowires 17, expect that the dispersion of film-formed silver nanowires was added to the dispersion of silver nanowires 5 in such a manner that the weight ratio of the silver nanowires and the film-formed silver nanowires was 80:20.

(Dispersion of Silver Nanowires 19)

The dispersion of silver nanowires 19 was obtained in the same manner as the dispersion of silver nanowires 17, expect that the dispersion of film-formed silver nanowires was added to the dispersion of silver nanowires 5 in such a manner that the weight ratio of the silver nanowires and the film-formed silver nanowires was 60:40.

(Dispersion of Silver Nanowires 20)

A dispersion of carbon nanotubes (trade name "REC-SM-29", manufactured by Resino Color Industry Co., Ltd., solid content of 6.0% by mass, carbon nanotube concentration of 2.0% by mass) was added to the dispersion of silver nanowires 5 in such a manner that the weight ratio of the silver nanowires to the carbon nanotubes was 99:1, and thus, the dispersion of silver nanowires 20 was obtained.

(Dispersion of Silver Nanowires 21)

The dispersion of silver nanowires 21 was obtained in the same manner as the dispersion of silver nanowires 20, expect that the dispersion of carbon nanotubes was added to the dispersion of silver nanowires 5 in such a manner that the weight ratio of the silver nanowires and the carbon nanotubes was 96:4.

(Dispersion of Silver Nanowires 22)

The dispersion of silver nanowires 22 was obtained in the same manner as the dispersion of silver nanowires 21, expect that the dispersion of carbon nanotubes was added to the dispersion of silver nanowires 5 in such a manner that the weight ratio of the silver nanowires and the carbon nanotubes was 90:10.

(Dispersion of Silver Nanowires 23)

Ethylene glycol (EG) as a reducing agent and polyvinylpyrrolidone (PVP; having an average molecular weight of 1,300,000; manufactured by Aldrich) as a shape controlling and protecting colloid agent were used to perform the following individual steps of core formation and particle growth to prepare a dispersion of silver nanowires.

(Core Formation Step)

To 100 mL of EG maintained at a temperature of 160° C. in a reaction vessel, 2.0 mL of a silver nitrate solution in EG (having a silver nitrate concentration of 1.0 mol/L) was added at a constant rate with stirring over one minute. Then, silver core particles were formed by reducing silver ions while the temperature was maintained at 160° C. for 10 minutes. The reaction liquid was yellow in color due to the surface plasmon absorption in nano-sized silver particles, confirming the reduction of silver ions and the subsequent formation of silver microparticles (core particles). Then, 10.0 mL of a PVP solution in EG (having a PVP concentration of $3.0\times10^{-1}$ mol/L) was added to the reaction liquid at a constant rate over 10 minutes.

(Particle Growth Step)

After the above-described core formation step was completed, the reaction liquid containing the core particles was maintained at a temperature of 160° C. with stirring, to which 100 mL of a silver nitrate solution in EG (having a silver nitrate concentration of $1.0\times10^{-1}$ mol/L) and 100 mL of a PVP solution in EG (having a PVP concentration of $3.0\times10^{-1}$ mol/L) were added at a constant rate over 120 minutes by using the double-jet technique. In the course of this particle growth step, an aliquot was withdrawn every 30 minutes from the reaction liquid for electron microscopic observation. The observation indicated that the core particles formed in the core formation step grew into the shape of wires with the passage of time but no microparticles were generated during the particle growth step. Electron micrographs of the silver nanowires eventually obtained were taken, and the particle size in the major axis direction and the minor axis direction in the images of 300 silver nanowire particles were measured, and then the arithmetic mean was obtained. The average particle size in the minor axis direction was 19 nm, and the average length in the major axis direction was 15 μm.

(Desalting/Washing Step)

After completion of the particle formation step, the reaction liquid was cooled down to room temperature and then applied to an ultrafiltration membrane with a molecular weight cut-off of 0.2 μm for desalting/washing and for solvent exchange to ethanol. Subsequently the reaction liquid was concentrated to a volume of 100 mL to prepare a dispersion of silver nanowires.

To the obtained dispersion of silver nanowires, KAYARAD PET-30 (manufactured by Nippon Kayaku Co., Ltd.), a polymerization initiator (trade name "Irgacure 184", manufactured by BASF Japan Ltd.) and a diluting solvent were added and blended in such a manner that the silver nanowire concentration was 0.1% by mass, PET-30 was 0.1% by mass, and Irgacure 184 was 5% of PET-30. Thus, a dispersion of silver nanowires 23 that could be used as an electroconductive part composition was prepared. For the diluting solvent, 30% by mass of the diluting solvent was cyclohexanone.

<Preparation of Light-Transmitting Resin Composition>

The following components were combined to meet the composition requirements indicated below and thereby obtain a light-transmitting resin layer composition 1.

(Light-Transmitting Resin Composition 1)

A mixture of pentaerythritol triacrylate and pentaerythritol tetraacrylate (trade name "KAYARAD PET-30"; manufactured by Nippon Kayaku Co., Ltd.): 5 parts by mass A polymerization initiator (trade name "Irgacure 184"; manufactured by BASF Japan Ltd.): 0.25 parts by mass;

Methyl ethyl ketone (MEK): 70 parts by mass;

Cyclohexanone: 24.75 parts by mass.

Example 1

First, a polyethylene terephthalate film (trade name "Cosmoshine (registered trademark) A4100"; manufactured by Toyobo Co., Ltd.) having a thickness of 48 μm and an in-plane phase difference of 2000 nm and carrying an underlayer on one face was set up as a light-transmitting base material, and the hard coat layer composition 1 was applied on the underlayer side of the polyethylene terephthalate film to form a coating film. Subsequently, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to cure the coating film, whereby a hard coat layer having a film thickness of 2 μm was formed as a light-transmitting functional layer.

After the hard coat layer was formed, the dispersion of silver nanowires 1 was applied at an application dose of 20 mg/m$^2$ on an untreated surface of the polyethylene terephthalate film opposite to the surface carrying the formed hard coat layer to form a coating film. Then, the formed coating film was dried by dry air blowing at 40° C. at a flow rate of 0.5 m/s for 15 seconds and subsequent dry air blowing at 70° C. at a flow rate of 15 m/s for 30 seconds to evaporate the solvent in the coating film, and the coating film was cured to place silver nanowires on the surface of the polyethylene terephthalate film.

Subsequently, the above-described light-transmitting resin composition 1 was applied to cover the silver nanowires and to form a coating film. Then, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to form a light-transmitting resin having a film thickness of 100 nm by curing the coating film, whereby an electroconductive film that included an electroconductive part having a film thickness of 100 nm and including the light-transmitting resin and the silver nanowires incorporated in the light-transmitting resin was obtained. The electroconductive part according to Example 1 was a layered film with no pattern.

The film thickness of the electroconductive part according to Example 1 was determined as the arithmetic mean of the thickness values measured at eight locations, excluding the maximum value and the minimum value from the thickness values measured at randomly selected ten locations, wherein the thickness values were determined at the ten locations in cross-sectional images of the electroconductive parts acquired using a scanning transmission electron microscope (STEM) or a transmission electron microscope (TEM). Specifically, the cross-sectional images were acquired by the following method. First, samples for observing a cross-section were produced from the electroconductive film. More specifically, a cut piece of the electroconductive film having a size of 2 mm×5 mm was placed in an embedding plate made of silicone, into which an epoxy resin was later poured to embed the whole electroconductive film in the resin. Then, the embedding resin was left to stand at 65° C. for 12 hours or longer and cured. Subsequently, ultra-thin sections were produced using an ultramicrotome (product name "Ultramicrotome EM UC7"; manufactured by Leica Microsystems GmbH) at a feeding rate of 100 nm. The produced ultra-thin sections were collected on collodion-coated meshes (150 meshes) to obtain STEM samples. Then, a cross-sectional image of an STEM sample was acquired using a scanning transmission electron microscope (STEM) (product name "S-4800 (Type 2)"; manufactured by Hitachi High-Technologies Corporation). The cross-sectional image was acquired by setting the detector switch (signal selection) to "TE," the accelerating voltage to 30 kV, and the emission current to "10 μA." The focus, contrast, and brightness were appropriately adjusted at a magnification of 5,000 to 200,000 times so that each layer could be identified. The magnification is preferably in the range from 10,000 to 50,000 times, more preferably in the range from 25,000 to 40,000 times. An interface between layers acquired at an extremely high magnification is represented by pixels in a coarse resolution image and appears obscure. Thus, the magnification should not be increased excessively during the measurement of film thickness. The cross-section was imaged by additionally setting the beam monitor to 3, the objective lens aperture to 3, and also the WD to 8 mm. The film thickness of an electroconductive part was measured by the above method not only Example 1 but also in the following Examples.

The in-plane phase difference of the polyethylene terephthalate base material used in Example 1 was measured using an inspection device for retardation films/optical materials (product name "RETS-100", manufactured by Otsuka Electronics Co., Ltd.). Specifically, a polyethylene terephthalate base material was cut into a size of 50 mm×50 mm and placed in the above device. In an environment at a temperature of 23° C. and a relative humidity of 50%, the phase difference value at an incident angle of 0° and at a wavelength of 589 nm was measured, and this was defined as an in-plane phase difference Re. The measurement position was shifted little by little to measure five locations in total, and the in-plane phase difference value Re was defined as the arithmetic mean of the phase difference values at three locations, excluding the maximum value and the minimum value from the five locations.

Examples 2 to 7

In Examples 2 to 7, electroconductive films were obtained in the same manner as in Example 1, except that the dispersions of silver nanowires shown in Table 1 were used instead of the dispersion of silver nanowires 1.

Example 8

In Example 8, an electroconductive film was obtained in the same manner as in Example 1, except that the dispersion of silver nanowires 8 was applied at an application dose of silver nanowires of 15 mg/$m^2$.

Example 9

In Example 9, an electroconductive film was obtained in the same manner as in Example 1, except that the dispersion of silver nanowires 9 was applied at an application dose of silver nanowires of 10 mg/$m^2$.

Example 10

In Example 10, an electroconductive film was obtained in the same manner as in Example 1, except that the dispersion of silver nanowires 10 was applied at an application dose of silver nanowires of 4 mg/$m^2$.

Examples 11 to 22

In Examples 11 to 22, electroconductive films were obtained in the same manner as in Example 1, except that the dispersions of silver nanowires shown in Table 1 were used instead of the dispersion of silver nanowires 1.

Example 23

In Example 23, an electroconductive film was obtained in the same manner as in Example 7, except that a polyethylene terephthalate film (trade name "Cosmoshine (registered trademark) A4100; manufactured by Toyobo Co., Ltd.) having a thickness of 38 μm and an in-plane phase difference of 1510 nm was used instead of the polyethylene terephthalate film (trade name "Cosmoshine (registered trademark) A4100"; manufactured by Toyobo Co., Ltd.) having a thickness of 48 μm.

Example 24

In Example 24, an electroconductive film was obtained in the same manner as in Example 7, except that a polyethylene terephthalate film having a thickness of 38 μm, which was produced by the following method, was used instead of the polyethylene terephthalate film (trade name "Cosmoshine (registered trademark) A4100"; manufactured by Toyobo Co., Ltd.).

A polyethylene terephthalate resin was extruded by an extruder at about 280° C., brought into contact with a casting roll having a surface temperature of 30° C., and cooled and solidified to form an unstretched sheet. Then, the unstretched sheet was stretched at 115° C. at the stretching ratio in the longitudinal direction of 2.9 times and at the stretching ratio in the width direction of 3.1 times. The stretched sheet was thermally fixed at 200° C. for 30 seconds to obtain a polyethylene terephthalate film.

Example 25

In Example 25, an electroconductive film was obtained in the same manner as in Example 7, except that a polyethylene terephthalate film having a thickness of 15 μm, which was produced by the following method, was used instead of the polyethylene terephthalate film (trade name "Cosmoshine (registered trademark) A4100"; manufactured by Toyobo Co., Ltd.).

A polyethylene terephthalate resin was extruded by an extruder at about 280° C., brought into contact with a casting roll having a surface temperature of 30° C., and cooled and solidified to form an unstretched sheet. Then, the unstretched sheet was stretched at 115° C. at the stretching ratio in the longitudinal direction of 3.0 times and at the stretching ratio in the width direction of 3.2 times. The stretched sheet was thermally fixed at 200° C. for 30 seconds to obtain a polyethylene terephthalate film.

Example 26

In Example 26, an electroconductive film was obtained in the same manner as in Example 7, except that a polyimide film (trade name "Neopulim (registered trademark)"; manufactured by Mitsubishi Gas Chemical Company) having a thickness of 60 μm was used instead of the polyethylene terephthalate film. The above Neopulim (registered trademark) was commercially available as a polyimide film.

Example 27

In Example 27, an electroconductive film was obtained in the same manner as in Example 7, except that a polyimide film (trade name "Neopulim (registered trademark)"; manufactured by Mitsubishi Gas Chemical Company) having a thickness of 20 μm was used instead of the polyethylene terephthalate film. The above Neopulim (registered trademark) was commercially available as a polyimide film.

Example 28

(Production of Transfer Film)

As a release film, a polyethylene terephthalate film (Cosmoshine (registered trademark) A4100", manufactured by Toyobo Co., Ltd.) having a thickness of 48 μm was used, and the dispersion of silver nanowires 23 was applied on the untreated surface of this polyester film at an application dose of 20 mg/$m^2$. Thus, a coating film was formed, and then dried at 70° C. for one minute, and exposed to ultraviolet light to a cumulative light dose of 50 mJ/$cm^2$ to form an electroconductive layer. Thus, a transfer film was produced.

(Production of Transfer Target Film)

As a light-transmitting base material, a polyethylene terephthalate film having a thickness of 15 μm and an in-plane phase difference of 630 nm was prepared. The polyethylene terephthalate film was produced by the following method. A polyethylene terephthalate resin was extruded by an extruder at about 280° C., brought into contact with a casting roll having a surface temperature of 30° C., and cooled and solidified to form an unstretched sheet. Then, the unstretched sheet was stretched at 125° C. at the stretching ratio in the longitudinal direction of 3.5 times and at the stretching ratio in the width direction of 4.0 times. The stretched sheet was thermally fixed at 200° C. for 30 seconds to obtain a polyethylene terephthalate film.

As the underlayer of this polyethylene terephthalate film, the hard coat layer composition 1 was applied so that the thickness after drying would be 0.7 μm. Thus, a coating film was formed, and then dried at 70° C. for one minute. A transfer target film having a hard coat layer formed on the base material film was produced.

The surface of the electroconductive part of the obtained transfer film and the surface of the hard coat layer of the transfer target film were laminated, and in this state, ultraviolet light was irradiated from the side of the transfer film to an accumulative light amount of 600 mJ/$cm^2$. Then, the release film of the transfer film was peeled off to obtain an electroconductive film in which the electroconductive part was transferred to the transfer target film.

Reference Example 1

As Reference Example 1, an electroconductive film having an electroconductive part formed from an ITO film was obtained. In Reference Example 1, an electroconductive film was obtained in the same manner as in Example 1, except that the electroconductive part was formed from an ITO film. The film thickness of the ITO film was 25 nm. The ITO layer was formed by a sputtering method using a target.

Reference Example 2

As Reference Example 2, an electroconductive film having an electroconductive part formed from an ITO film was obtained. In Reference Example 2, an electroconductive film was obtained in the same manner as in Reference Example 1, except that a target different from the target in Reference Example 1 was used.

<Diffused Light Reflectance (SCE) Measurement>

In the electroconductive films according to Examples 1 to 28 and Reference Examples 1 and 2, the diffused light reflectance in the region where the electroconductive part was present was measured. Specifically, first, the electroconductive films according to Examples 1 to 28 and Reference Examples 1 and 2 were cut into a size of 100 mm×100 mm, and adhesive films having a size of 100 mm×100 mm (trade name "PANACLEAN", manufactured by Panac Co., Ltd., refractive index of 1.49) and black acrylic plates having a size of 100 mm×100 mm (trade name "COMOGLAS", manufactured by Kuraray Co., Ltd., DFA2CG 502K (black) system, thickness of 2 mm, total light transmittance of 0%, refractive index of 1.49) were prepared. The black acrylic plate, the adhesive film, and the electroconductive film cut into the above size were laminated in this order to obtain a laminate. The electroconductive film was placed above the black acrylic plate, with the electroconductive part above the polyethylene terephthalate film. Then, using a spectrocolorimeter (product name "CM-600d", Konica Minolta, Inc., measurement port of φ 11 mm) from the side of the electroconductive part of the electroconductive film, the diffused light reflectance was measured under the following measurement conditions. The measurement was performed three times per laminate, and the diffused light reflectance was defined as the arithmetic mean of values obtained from the three measurements. When the diffused light reflectance was measured, the measurement button was pressed with the CM-600d placed on the central part of the electroconductive film. In the electroconductive films according to Examples 7 and 23 to 27, the diffused light reflectance was also measured in the electroconductive films after the foldability test (φ3 mm, one hundred thousand times) as described later, and the difference in the diffused light reflectance before and after the foldability test was measured (diffused light reflectance after foldability test−diffused light reflectance before foldability test).

(Measurement Conditions)

Main light source: D65

Light source 2: None

Field of view: 2 degrees

Color system: Yxy

Color difference formula: ΔE*ab

Temperature: 23° C.

Relative humidity: 50%.

<Measurement of Surface Resistance Value>

For the electroconductive films according to Examples 1 to 28 and Reference Examples 1 and 2, the surface resistance value of an electroconductive part was measured using a contact-type resistivity meter (product name "Loresta-AX MCP-T370"; Manufactured by Mitsubishi Chemical Analytech Co., Ltd., Type of sensor: ASP-probe) according to JIS K7194: 1994 (Testing method for resistivity of conductive plastics with a four-point probe array). The surface resistance value was measured with the contact-type resistivity meter by placing a cut piece of the electroconductive film having a size of 80 mm×50 mm on a flat glass plate to create a uniformly flat surface, and then placing an ASP-probe on the center of the electroconductive part facing upward and evenly pressing all the electrode pins on the electroconductive part. For the measurement with the contact-type resistivity meter, the mode "Ω/□" as a sheet resistance measurement mode was selected. Subsequently, the start button was pushed and the instrument was held to obtain the result of the measurement. Five locations for the measurement of surface resistance value were in the central part of the electroconductive film and the arithmetic mean of the surface resistance values at three locations, excluding the maximum value and the minimum value from the five locations, was determined as the surface resistance value. The measurement of surface resistance value was performed in an environment at a temperature of 23° C. and a relative humidity of 55%.

<Measurement of Haze Value>

For the electroconductive films according to Examples 1 to 28 and Reference Examples 1 and 2, the haze value (total haze value) of each electroconductive film was measured using a haze meter (product name "HM-150"; manufactured by Murakami Color Research Laboratory Co., Ltd.) according to JIS K7136: 2000 in an environment at a temperature of 23° C. and a relative humidity of 50%. The haze value is a value measured on the whole electroconductive film. For the electroconductive films of Examples 1 to 28 and Reference Examples 1 and 2, the haze value was measured with the side of the electroconductive part facing the direction opposite to the light source, wherein the electroconductive film was cut into a size 50 mm×100 mm without curl or wrinkle and without any dirt such as fingerprints or dust. The measurement was performed five times per electroconductive film, and the haze value was the arithmetic mean of three measurements excluding the maximum value and the minimum value from five measurements.

<Evaluation of Target Surface Resistance Value>

The electroconductive films according to Examples 1 to 28 and Reference Examples 1 and 2 were evaluated to determine whether the target surface resistance value was achieved or not. The evaluation criteria were as below-mentioned.

⊚: The surface resistance value was 60Ω/□ or less.

○: The surface resistance value was more than 60Ω/□ and was 80Ω/□ or less.

Δ: The surface resistance value was more than 80Ω/□ and 150Ω/□ or less.

x: The surface resistance value was more than 150 Ω/□.

<Evaluation of Milkiness>

The appearance of the electroconductive films according to Examples 1 to 28 and Reference Examples 1 and 2 was observed in an environment at a temperature of 23° C. and a relative humidity of 50% to determine whether the milkiness was present or not on the surface of the electroconductive part. Specifically, each electroconductive film was cut into a size of 100 mm×100 mm, and an adhesive film having a size of 100 mm×100 mm (trade name "PANACLEAN", manufactured by Panac Co., Ltd., refractive index of 1.49) and a black acrylic plate having a size of 100 mm×100 mm (trade name "COMOGLAS", manufactured by Kuraray Co., Ltd., DFA2CG 502K (black) system, thickness of 2 mm, total light transmittance of 0%, refractive index of 1.49) were prepared. The black acrylic plate, the adhesive film, and the electroconductive film cut into the above size were laminated in this order to obtain a laminate. The electroconductive film was placed above the black acrylic plate, with the electroconductive part above the polyethylene terephthalate film. A white lamp (2000 to 3000 lux) was used from side of the electroconductive part of the electroconductive film, and the surface of the electroconductive part was uniformly observed by reflected light to confirm whether the milkiness was present or not on the surface of the electroconductive part. For the electroconductive films of Examples 7 and 23 to 27, the presence or absence of the milkiness on the surface of the electroconductive part was also confirmed in the electroconductive films after the foldability test (φ3 mm, one hundred thousand times) as described later. The evaluation criteria were as below-mentioned.

◎: Milkiness was not confirmed.
○: Some milkiness was confirmed but at a level which was not problematic for practical usage.
Δ: Milkiness was confirmed to some extent.
x: Milkiness was clearly confirmed.

<Evaluation of Flexibility>

(1) Evaluation of Resistance Value Before and after Foldability Test (FD Test)

The electroconductive films according to Examples 7, 23 to 27 were subjected to a foldability test and evaluated for the flexibility. Specifically, first of all, a rectangular sample having a size of 125 mm long×50 mm wide was cut from the electroconductive film. After the sample was cut from the electroconductive film, a silver paste (trade name "DW-520H-14"; manufactured by Toyobo Co., Ltd.) was applied on the surfaces of both longitudinal ends of each sample, having a size of 10 mm long×50 mm wide, and heated at 130° C. for 30 minutes to obtain the sample retaining the cured silver pastes on both the terminal regions. In the sample retaining the cured silver pastes on both the terminal regions, the distance between points and the width for measuring the electrical resistance value was 105 mm and 50 mm, respectively. Then, the electrical resistance value of the sample retaining the cured silver pastes on both the terminal regions was measured using a tester (product name "Digital MO Hitester 3454-11"; manufactured by Hioki E.E. Corporation). Specifically, because the Digital MO Hitester 3454-11 included two probe terminals (a red probe terminal and a black probe terminal; both are pin-type terminals), the red probe terminal and the black probe terminal were respectively contacted with the cured silver paste provided on one terminal region and that provided on the other terminal region to measure the electrical resistance value.

Subsequently, the selected sample having the short edges (50 mm) fixed with fixing members was mounted to a U-shape Folding Test Machine (product name "DLDMLH-FS"; manufactured by Yuasa System Co., Ltd.) as an folding endurance testing machine in such a manner that the minimum distance between the two opposite edges was 3 mm (the outer width of the bent part: 3.0 mm), as shown in FIG. 4(C), and the sample with the electroconductive part facing inward was folded by 180 degrees and then unfolded (a foldability test performed on the sample with the electroconductive part facing inward and the base material facing outward), and the process was repeated one hundred thousand times under the following conditions.

(Folding Conditions)

Reciprocation rate: 80 rpm (every minute)
Test stroke: 60 mm
Bending angle: 180°

After the foldability test was performed, the sample after the foldability test was measured for the electrical resistance value on the surface of the electroconductive part, similarly to the sample before the foldability test. Then, the electrical resistance value ratio, namely the ratio of the electrical resistance value measured after the foldability test on the selected sample to that measured before the foldability test on the same sample (the electrical resistance value of the selected sample after the foldability test/the electrical resistance value of the same sample before the foldability test) was calculated. Additionally, a sample cut from each of the electroconductive films according to Examples and Comparative Examples and selected based on the measured electrical resistance value in the same manner as described above was mounted to the above-described endurance testing machine in the same manner as described above, and the sample with the base material facing inward was folded by 180 degrees and then unfolded (a foldability test performed on the sample with the electroconductive part facing outward and the base material facing inward), and the process was repeated one hundred thousand times, and the sample after the foldability test was similarly measured for the electrical resistance value on the surface of the electroconductive part to calculate the electrical resistance value ratio. Then, the results of the foldability tests were evaluated on the basis of the following evaluation criteria. The measurement was performed five times, and the arithmetic mean of three measurements excluding the maximum value and minimum value from the five measurements was determined as the electrical resistance value ratio.

◎: The electrical resistance value ratio was 1.5 or less in both of the foldability tests.
○: The electrical resistance value ratio was more than 1.5 and 3 or less in both of the foldability tests.
x: The electrical resistance value ratio was more than 3 in one of the foldability tests.

Similarly, a sample was produced from the electroconductive film according to each of Examples 7, 23 to 27 in the same manner as above-mentioned, the short edges of the sample were fixed with fixing members, and the sample was mounted in such a manner that the minimum gap φ between the two opposite edges was 3 mm (the outer width of the bent part: 3 mm), and the foldability test was carried out by repeating, two hundred thousand times, a process in which the sample was folded by 180 degrees and then unfolded with the electroconductive part facing inward. The sample after the foldability test was similarly measured for the electrical resistance value on the surface of the electroconductive part to calculate the electrical resistance value ratio. Furthermore, a sample was produced from the electroconductive film according to each of Examples 24, 25, and 27 in the same manner as above-mentioned, the short edges of the sample were fixed with fixing members, and the sample was mounted in such a manner that the minimum gap φ between the two opposite edges was 2 mm (the outer width of the bent part: 2 mm), and the foldability test was carried out by repeating, three hundred thousand times, a process in which the sample was folded by 180 degrees and then unfolded with the electroconductive part facing inward. The sample after the foldability test was similarly measured for the electrical resistance value on the surface of the electroconductive part to calculate the electrical resistance value ratio. Furthermore, for reference, a sample was produced from the electroconductive film according to each of Examples 7, 23 to 27 in the same manner as above-mentioned, the short edges of the sample were fixed with fixing members, and the sample was mounted in such a manner that the minimum gap φ between the two opposite edges was 3 mm (the outer width of the bent part: 3 mm), and the foldability test was carried out by repeating, fifty thousand times, a process in which the sample was folded by 180 degrees and then unfolded with the electroconductive part facing inward. The sample after the foldability test was similarly measured for the electrical resistance value on the surface of the electroconductive part to calculate the electrical resistance value ratio. Then, the results of the foldability tests were evaluated on the basis of the following evaluation criteria. The measurement was performed five times, and the arithmetic mean of three measurements excluding the maximum value and minimum value from the five measurements was determined as the electrical resistance value ratio.

⊚: The electrical resistance value ratio was 1.5 or less.

○: The electrical resistance value ratio was more than 1.5 and 3 or less.

x: The electrical resistance value ratio was more than 3.

(2) Evaluation of Crease after Foldability Test

The appearance of the electroconductive film according to each of Example 7, 23 to 27 after the foldability test was observed to evaluate the bent part of the electroconductive film for any crease generated. The foldability test was carried out by the method described in the section for the evaluation of the surface resistance value before and after the foldability test. A crease was visually observed in an environment at a temperature of 23° C. and a relative humidity of 50%. In observing such a crease, the bent part was uniformly observed with transmitted light and reflected light under white illumination (at 800 lux to 2000 lux) in a bright room, and both the portion corresponding to the internal side and the portion corresponding to the external side at the bent part after folding were observed. In order that the position to be observed could be easily known in observing the crease, a sample before the foldability test was placed between the fixing members of an endurance testing machine, and folded once, and a permanent marker or the like was used to put, on both ends, marks indicating the bent part, as shown in FIG. 5, wherein both the ends were positioned in the direction along the bent part and orthogonal to the folding direction. After the foldability test, a permanent marker was used to draw a line connecting the marks on both the ends of the bent part, with the sample removed from the endurance testing machine after the foldability test. Then, in observing the crease, the whole bent part, which was a region formed by the marks for both the ends of the bent part and the lines connecting the marks, was observed visually. Here, no crease was observed in observing the region corresponding to the bent part of each electroconductive film before the foldability test. The evaluation criteria were as below-mentioned.

○: No crease was observed on the electroconductive film after the foldability test.

Δ: A few creases were observed on the electroconductive film after the foldability test but at a level which was not problematic for practical usage.

x: Some creases were clearly observed on the electroconductive film after the foldability test.

(3) Evaluation of Microcrack after Foldability Test

The appearance of the electroconductive film according to each of Example 7, 23 to 27 after the foldability test was observed to evaluate the bent part of the electroconductive film for any microcrack generated. The foldability test was carried out by the method described in the section for the evaluation of the surface resistance value before and after the foldability test. The microcracks were observed using a digital microscope (product name "VHX-5000"; manufactured by Keyence Corporation) in an environment at a temperature of 23° C. and a relative humidity of 50%. Specifically, a sample after the foldability test was first spread slowly, and the sample was fixed with a tape to the stage of a microscope. In cases where the crease was persistent, the portion to be observed was made as flat as possible. However, the portion to be observed (the bent part) at and around the center of the sample was not touched with a hand and handled to a degree to which no force was applied. Then, both the portion corresponding to the internal side and the portion corresponding to the external side after folding were observed. Such microcracks were observed in a dark field, with reflected light, with ring illumination selected as the illumination of a digital microscope, and at a magnification of 200 times. In order that the position to be observed could be easily known in observing the microcracks, a sample before the foldability test was placed between the fixing members of an endurance testing machine, and folded once, and a permanent marker or the like was used to put, on both ends, marks indicating the bent part, as shown in FIG. 5, wherein both the ends were positioned in the direction along the bent part and orthogonal to the folding direction. After the foldability test, a permanent marker was used to draw a line connecting the marks on both the ends of the bent part, with the sample removed from the endurance testing machine after the foldability test. In observing the microcracks, the microscope was set in such a manner that the center of the field-of-view range of the microscope was aligned with the center of the bent part. Here, no microcrack was observed in observing the region corresponding to the bent part of each electroconductive film before the foldability test. The evaluation criteria were as below-mentioned.

(Microcracks)

○: No microcrack was observed on the electroconductive film after the foldability test.

Δ: A few microcracks were observed on the electroconductive film after the foldability test but at a level which was not problematic for practical usage.

x: Some microcracks were clearly observed on the electroconductive film after the foldability test.

<Measurement of in-Plane Phase Difference Re, Nz Coefficient, Δn>

The electroconductive films of Examples 7 and 23 to 25 before the foldability test were measured for the in-plane phase difference Re, Nz coefficient, and Δn, using an inspection device for retardation films/optical materials (product name "RETS-100", manufactured by Otsuka Electronics Co., Ltd.). Specifically, the measurement was performed according to the following procedure.

In order to stabilize the light source of RETS-100, the light source was first turned on and left to stand for 60 minutes or more. Then, the rotation analyzer method was selected, and the θ mode (mode of angle direction phase difference measurement and Rth calculation) was selected. By selecting this θ mode, the stage became a tilt rotation stage.

The following measurement conditions were input to RETS-100.

(Measurement Conditions)

Retardation measurement range: Rotation analyzer method

Spot diameter: φ 5 mm

Tilt angle range: −40° to 40°

Measurement wavelength range: 400 nm to 800 nm

Average refractive index (average refractive index N of PET was set to 1.617)

Thickness: Thickness separately measured by SEM

The background data was then obtained when a sample was not placed in the device. The device was a closed system and this was performed every time the light source was turned on.

After that, the sample was placed on the stage in the device. A sample cut from the electroconductive film into a rectangular shape of 50 mm×50 mm was used as a sample. The electroconductive film was placed in such a manner that the side of the electroconductive part of the electroconductive film was the interface with air, and the side of the light-transmitting base material was the stage side.

After the sample was set, the stage was rotated 360° on the XY plane in an environment at a temperature of 23° C. and a relative humidity of 50% to measure the fast axis and the slow axis. After the measurement ended, the slow axis was selected, and the measurement was performed while the stage was tilted in the set angle range around the slow axis, and the data in the set tilt angle range and the set wavelength range (Re, Nz, Δn) were obtained every 10°. The in-plane phase difference Re is a value measured with light having an incident angle of 0° and a wavelength of 589 nm. The in-plane phase difference value Re was measured at different five points. Specifically, first, as shown in FIG. 6, two orthogonal virtual lines passing the center of the sample were drawn. These virtual lines divided the sample into four sections. Then, in each section, one point equidistant from the center, i.e., four points in total were set, and measurement was performed at five points in total of the center and these points. The in-plane phase difference Re was the arithmetic mean of three points excluding the maximum value and the minimum value from the five points. The results are shown in Table 1 below.

TABLE 1

| | AgNW dispersion | AgNW fiber diameter | Presence or absence of fibers with darkened surface | Diffused light reflectance (%) | Surface resistance value (Ω/□) | Haze value (%) | Target surface resistance value | Milkiness |
|---|---|---|---|---|---|---|---|---|
| Example 1 | 1 | 45 | Absent | 0.91 | 50 | 2.00 | ⊙ | X |
| Example 2 | 2 | 35 | Absent | 0.73 | 50 | 1.50 | ⊙ | X |
| Example 3 | 3 | 30 | Absent | 0.6 | 50 | 1.00 | ⊙ | Δ |
| Example 4 | 4 | 28 | Absent | 0.53 | 50 | 0.80 | ⊙ | Δ |
| Example 5 | 5 | 25 | Absent | 0.5 | 50 | 0.65 | ⊙ | ○ |
| Example 6 | 6 | 23 | Absent | 0.41 | 50 | 0.6 | ⊙ | ○ |
| Example 7 | 7 | 19 | Absent | 0.32 | 50 | 0.55 | ⊙ | ⊙ |
| Example 8 | 8 | 25 | Absent | 0.41 | 70 | 0.57 | ○ | ○ |
| Example 9 | 9 | 25 | Absent | 0.32 | 125 | 0.37 | Δ | ⊙ |
| Example 10 | 10 | 25 | Absent | 0.2 | 1300 | 0.25 | X | ⊙ |
| Example 11 | 11 | 25 | Present | 0.45 | 55 | 0.6 | ⊙ | ○ |
| Example 12 | 12 | 25 | Present | 0.38 | 65 | 0.55 | ○ | ⊙ |
| Example 13 | 13 | 25 | Present | 0.28 | 150 | 0.49 | Δ | ⊙ |
| Example 14 | 14 | 19 | Present | 0.3 | 55 | 0.52 | ⊙ | ⊙ |
| Example 15 | 15 | 19 | Present | 0.27 | 65 | 0.47 | ○ | ⊙ |
| Example 16 | 16 | 19 | Present | 0.25 | 150 | 0.43 | Δ | ⊙ |
| Example 17 | 17 | 25 | Present | 0.46 | 55 | 0.61 | ⊙ | ○ |
| Example 18 | 18 | 25 | Present | 0.37 | 65 | 0.55 | ○ | ⊙ |
| Example 19 | 19 | 25 | Present | 0.28 | 150 | 0.50 | Δ | ⊙ |
| Example 20 | 20 | 25 | Present | 0.48 | 50 | 0.65 | ⊙ | ○ |
| Example 21 | 21 | 25 | Present | 0.45 | 60 | 0.64 | ⊙ | ○ |
| Example 22 | 22 | 25 | Present | 0.39 | 70 | 0.64 | ○ | ⊙ |
| Example 23 | 7 | 19 | Absent | 0.33 | 49 | 0.55 | ⊙ | ⊙ |
| Example 24 | 7 | 19 | Absent | 0.32 | 51 | 0.55 | ⊙ | ⊙ |
| Example 25 | 7 | 19 | Absent | 0.32 | 50 | 0.55 | ⊙ | ⊙ |
| Example 26 | 7 | 19 | Absent | 0.31 | 48 | 0.55 | ⊙ | ⊙ |
| Example 27 | 7 | 19 | Absent | 0.33 | 51 | 0.55 | ⊙ | ⊙ |
| Example 28 | 23 | 19 | Absent | 0.38 | 52 | 0.75 | ⊙ | ⊙ |
| Reference Example 1 | — | — | — | 0.20 | 150 | 0.55 | Δ | ⊙ |
| Reference Example 2 | — | — | — | 0.20 | 70 | 0.60 | ○ | ⊙ |

TABLE 2

| | Flexibility φ 3 mm, one hundred thousand times | | | | | | Difference in diffused light | |
|---|---|---|---|---|---|---|---|---|
| | Electrical resistance value ratio | Crease | Microcracks | Re(nm) | Nz coefficient | Δn | reflectance before and after FD test (%) | Milkiness after FD test |
| Example 7 | ⊙ | Δ | ○ | 2000 | 4 | 0.041 | 0.10 | ○ |
| Example 23 | ⊙ | ○ | ○ | 1500 | 4 | 0.041 | 0.00 | ⊙ |
| Example 24 | ⊙ | ○ | ○ | 200 | 10 | 0.005 | 0.05 | ⊙ |

TABLE 2-continued

| | Flexibility φ 3 mm, one hundred thousand times | | | | | | Difference in diffused light | |
|---|---|---|---|---|---|---|---|---|
| | Electrical resistance value ratio | Crease | Microcracks | Re(nm) | Nz coefficient | Δn | reflectance before and after FD test (%) | Milkiness after FD test |
| Example 25 | ⊙ | ○ | ○ | 135 | 11 | 0.009 | 0.00 | ⊙ |
| Example 26 | ⊙ | Δ | ○ | — | — | — | 0.12 | ○ |
| Example 27 | ⊙ | ○ | ○ | — | — | — | 0.00 | ⊙ |

TABLE 3

| | Flexibility | | | | | | | | |
|---|---|---|---|---|---|---|---|---|---|
| | φ 3 mm, two hundred thousand times | | | φ 2 mm, three hundred thousand times | | | φ 3 mm, fifty thousand time | | |
| | Electrical resistance value ratio | Crease | Microcracks | Electrical resistance value ratio | Crease | Microcracks | Electrical resistance value ratio | Crease | Microcracks |
| Example 7 | ⊙ | Δ | Δ | — | — | — | ⊙ | ○ | ○ |
| Example 23 | ⊙ | Δ | Δ | — | — | — | ⊙ | ○ | ○ |
| Example 24 | ⊙ | ○ | ○ | ⊙ | Δ | Δ | ⊙ | ○ | ○ |
| Example 25 | ⊙ | ○ | ○ | ⊙ | ○ | ○ | ⊙ | ○ | ○ |
| Example 26 | ⊙ | Δ | Δ | — | — | — | ⊙ | ○ | ○ |
| Example 27 | ⊙ | ○ | ○ | ⊙ | Δ | ○ | ⊙ | ○ | ○ |

As shown in Table 1, it was confirmed that there was a correlation between the diffused light reflectance and the milkiness, and specifically, in cases where the diffused light reflectance was 0.5% or less, the milkiness was inhibited.

In the above Examples, the electroconductive part was formed on one face of the polyethylene terephthalate base material or the polyimide film. In cases where the electroconductive parts were formed on both faces of the polyethylene terephthalate base material or the polyimide film, the same results as in the above Examples were obtained.

When the folding and unfolding process of the above foldability test is performed fifty thousand times, the difference in flexibility cannot be seen. Thus, in the foldability test, the folding and unfolding process needs to be repeated at least one hundred thousand times in order to evaluate the flexibility.

When the flexibility of the electroconductive film according to Example 28 was evaluated, the in-plane phase difference was reasonably low and the thickness of the entire electroconductive film was small. Thus, good results close to Example 24 were obtained.

Further, when the degree of crystallization of the polyethylene terephthalate film (PET film) of the electroconductive films according to Example 7 and Examples 23 to 25 was measured, the PET film used in Example 7 had a degree of crystallization of 51%; the PET film used in Example 23 had a degree of crystallization of 43%; the PET film used in Example 24 had a degree of crystallization of 45%; and the PET film used in Example 25 had a degree of crystallization of 52%. The degree of crystallization was determined based on the measurement method of the degree of crystallization described in the section of the light-transmitting base material.

Regarding the fiber diameters of the silver nanowires of the above Examples 1 to 28, each electroconductive film was observed by a scanning electron microscope (SEM) as follows to compare the results with the results obtained from the above-mentioned compositions. Although there was a deviation of about 1 to 2 nm, the results were almost the same.

Using a scanning electron microscope (SEM) (product name "S-4800 (Type 2)"; manufactured by Hitachi High-Technologies Corporation) on the SEM mode, 10 images of electroconductive fibers were acquired at a magnification of 10,000 to 20,000,000 times, and on the images acquired with an accessory software program, the fiber diameters of 100 electroconductive fibers were measured, and the arithmetic mean of the fiber diameters of 98 electroconductive fibers, excluding the maximum value and the minimum value from the 100 electroconductive fibers, was obtained. The fiber diameters were measured using a 45° pre-tilted sample stub by setting the signal selection to "SE," the accelerating voltage to "3 kV," the emission current to "10 μA to 20 μA," the SE detector to "Mixed," the probe current to "Norm," the focus mode to "UHR," the condenser lens 1 to "5.0," the WD to "8 mm," and the Tilt to "30°." Because no TE detector was used for SEM observation, it was essential to remove the TE detector before SEM observation. Although either the STEM mode or the SEM mode could be selected as an operation mode of the above-described S-4800, the SEM mode was used for the measurement of the above-described fiber diameters.

LIST OF REFERENCE NUMERALS

10, 30, 40, 50 . . . Electroconductive film
10A, 30A, 40A, 50A . . . Surface
10B, 30B, 40B, 50B . . . Back surface
11 . . . Light-transmitting base material
12, 52 . . . Electroconductive part
13 . . . Light-transmitting functional layer
14 . . . Light-transmitting resin
15 . . . Electroconductive fibers
16 . . . Fibers with a dark-colored surface
70 . . . Image display device

80 . . . Display panel
85 . . . Display element
100 . . . Touch panel

The invention claimed is:

1. An electroconductive film comprising at least an electroconductive part, wherein the electroconductive part comprises:

a light-transmitting resin;

a plurality of electroconductive fibers present in the light-transmitting resin; and a fiber with a dark-colored surface present in the light-transmitting resin, wherein the fiber with a dark-colored surface exhibits a darker color than the electroconductive fibers at at least a part of the surface, the electroconductive part has a thickness of 20 nm or more and 145 nm or less, diffused light reflectance in a region of the electroconductive film where the electroconductive part is present is 0.5% or less, the electroconductive film has a haze value of 0.65% or less, and the electroconductive part has a surface resistance value of 90Ω/□ or less, wherein the surface resistance value being measured in an environment at a temperature of 23±5° C. and a relative humidity of 30% or more and 70% or less.

2. The electroconductive film according to claim 1, wherein the fiber with a dark-colored surface is a fiber material which exhibits a darker color than the electroconductive fibers.

3. The electroconductive film according to claim 1, wherein the fiber with a dark-colored surface comprises a fiber material and a dark-colored film which is formed on the surface of the fiber material and exhibits a darker color than the electroconductive fibers.

4. The electroconductive film according to claim 1, further comprising a light-transmitting base material provided on one face of the electroconductive part.

5. The electroconductive film according to claim 4, wherein the light-transmitting base material comprises a polyester resin and has a thickness of 5 μm or more and 45 μm or less.

6. The electroconductive film according to claim 4, wherein the light-transmitting base material comprises at least one of a polyimide resin and a polyamide resin and has a thickness of 5 μm or more and 75 μm or less.

7. The electroconductive film according to claim 1, wherein the electroconductive film has a thickness of 5 μm or more and 78 μm or less.

8. The electroconductive film according to claim 1, wherein no crack or break occurs in cases where a test in which the electroconductive film is folded by 180 degrees so as to leave a gap of 3 mm between the opposite edges of the electroconductive film and then unfolded, is repeated one hundred thousand times.

9. An LED image display device comprising the electroconductive film according to claim 1.

10. A sensor comprising the electroconductive film according to claim 1.

11. A touch panel comprising the electroconductive film according to claim 1.

12. An image display device comprising a display panel and the touch panel according to claim 11, the touch panel being present on an observer's side of the display panel.

13. The image display device according to claim 12, wherein the display panel is an organic light emitting diode panel.

14. The image display device according to claim 13, further comprising an LED light source.

15. An image display device comprising a display panel and the electroconductive film according to claim 1, the electroconductive film being present on an observer's side of the display panel.

16. The image display device according to claim 15, wherein the display panel is an organic light emitting diode panel.

17. The image display device according to claim 15, further comprising an LED light source.

* * * * *